(12) United States Patent  (10) Patent No.: US 8,402,341 B2
Eroz et al.  (45) Date of Patent: Mar. 19, 2013

(54) METHOD AND SYSTEM FOR PROVIDING LOW DENSITY PARITY CHECK (LDPC) ENCODING AND DECODING

(76) Inventors: Mustafa Eroz, Germantown, MD (US); Lin-Nan Lee, Potomac, MD (US)

( * ) Notice: Subject to any disclaimer, the term of this patent is extended or adjusted under 35 U.S.C. 154(b) by 308 days.

(21) Appl. No.: 12/707,766

(22) Filed: Feb. 18, 2010

(65) Prior Publication Data

US 2011/0202820 A1 Aug. 18, 2011

(51) Int. Cl.
*H03M 13/00* (2006.01)
*H03M 13/03* (2006.01)
*H04L 1/18* (2006.01)
*G11C 29/00* (2006.01)
*G06F 11/00* (2006.01)

(52) U.S. Cl. ........ 714/758; 714/751; 714/763; 714/766; 714/767; 714/768; 714/786; 714/800; 714/801; 714/805

(58) Field of Classification Search .................. None
See application file for complete search history.

(56) References Cited

U.S. PATENT DOCUMENTS

| | | | |
|---|---|---|---|
| 6,829,308 B2 | 12/2004 | Eroz et al. | |
| 6,963,622 B2 | 11/2005 | Eroz et al. | |
| 7,020,829 B2 | 3/2006 | Eroz et al. | |
| 7,191,378 B2 * | 3/2007 | Eroz et al. | 714/758 |
| 7,203,887 B2 | 4/2007 | Eroz et al. | |
| 7,234,098 B2 | 6/2007 | Eroz et al. | |
| 7,237,174 B2 | 6/2007 | Eroz et al. | |
| 7,296,208 B2 | 11/2007 | Sun et al. | |
| 7,334,181 B2 | 2/2008 | Eroz et al. | |
| 7,376,883 B2 | 5/2008 | Eroz et al. | |
| 7,398,455 B2 | 7/2008 | Eroz et al. | |
| 7,424,662 B2 * | 9/2008 | Eroz et al. | 714/758 |
| 7,430,396 B2 | 9/2008 | Sun et al. | |
| 7,461,325 B2 | 12/2008 | Eroz et al. | |
| 7,483,496 B2 | 1/2009 | Eroz et al. | |
| 7,577,207 B2 | 8/2009 | Eroz et al. | |
| 7,673,226 B2 | 3/2010 | Eroz et al. | |
| 7,725,802 B2 | 5/2010 | Eroz et al. | |
| 7,770,089 B2 | 8/2010 | Eroz et al. | |
| 7,856,586 B2 | 12/2010 | Eroz et al. | |
| 7,864,869 B2 | 1/2011 | Eroz et al. | |
| 7,954,036 B2 | 5/2011 | Eroz et al. | |
| 7,962,830 B2 | 6/2011 | Eroz et al. | |
| 8,028,224 B2 | 9/2011 | Eroz et al. | |
| 8,069,393 B2 | 11/2011 | Eroz et al. | |
| 8,095,854 B2 | 1/2012 | Eroz et al. | |
| 8,102,947 B2 | 1/2012 | Eroz et al. | |
| 8,140,931 B2 | 3/2012 | Eroz et al. | |
| 8,144,801 B2 | 3/2012 | Eroz et al. | |
| 8,145,980 B2 | 3/2012 | Eroz et al. | |
| 8,181,085 B2 | 5/2012 | Eroz et al. | |
| 8,291,293 B2 | 10/2012 | Eroz et al. | |
| 2004/0019845 A1 | 1/2004 | Eroz et al. | |
| 2004/0054960 A1 * | 3/2004 | Eroz et al. | 714/800 |
| 2007/0113142 A1 * | 5/2007 | Eroz et al. | 714/752 |
| 2008/0313523 A1 | 12/2008 | Sun et al. | |

* cited by examiner

*Primary Examiner* — Guerrier Merant
(74) *Attorney, Agent, or Firm* — Potomac Technology Law, LLC

(57) ABSTRACT

An approach is provided for processing structure Low Density Parity Check (LDPC) codes. Memory storing edge information and a posteriori probability information associated with a structured parity check matrix used to generate Low Density Parity Check (LDPC) coded signal are accessed. The edge information represent relationship between bit nodes and check nodes, and are stored according to a predetermined scheme that permits concurrent retrieval of a set of the edge information.

21 Claims, 23 Drawing Sheets

100

$$1401 \rightarrow \begin{bmatrix} e_1 & & & & e_{(M-1)d+1} \\ e_2 & & & & e_{(M-1)d+2} \\ e_3 & & & & e_{(M-1)d+3} \\ \vdots & \vdots & \vdots & \vdots & \vdots \\ e_{d-1} & e_{d+1} & e_{2d+1} & \cdots & \vdots \\ x & e_{d+2} & e_{2d+2} & \cdots & e_{Md-1} \\ e_{Md+1} & e_{d+3} & e_{2d+3} & \cdots & e_{Md} \\ e_{Md+2} & \vdots & \vdots & \vdots & \vdots \\ e_{Md+3} & e_{2d-1} & e_{3d-1} & \cdots & e_{(2M-1)d+1} \\ \vdots & e_{2d} & e_{3d} & \cdots & e_{(2M-1)d+2} \\ e_{(M+1)d-1} & e_{(M+1)d+1} & e_{(M+2)d+1} & \cdots & e_{(2M-1)d+3} \\ e_{(M+1)d} & e_{(M+1)d+2} & e_{(M+2)d+2} & \cdots & \vdots \\ \vdots & e_{(M+1)d+3} & e_{(M+2)d+3} & \cdots & \vdots \\ \vdots & \vdots & \vdots & \vdots & e_{2Md-1} \\ \vdots & \vdots & \vdots & \vdots & e_{2Md} \\ e_{(M+2)d-1} & e_{(M+2)d+1} & e_{(M+3)d+1} & \cdots & \vdots \\ e_{(M+2)d} & e_{(M+2)d+2} & e_{(M+3)d+2} & \cdots & \vdots \\ \vdots & \vdots & \vdots & \vdots & \vdots \\ e_{(N-K-M)d+1} & e_{(N-K-M+1)d+1} & e_{(N-K-M+2)d+1} & \cdots & e_{(N-K-1)d+1} \\ e_{(N-K-M)d+2} & e_{(N-K-M+1)d+2} & e_{(N-K-M+2)d+2} & \cdots & e_{(N-K-1)d+2} \\ \vdots & \vdots & \vdots & \vdots & \vdots \\ e_{(N-K-M+1)d-1} & e_{(N-K-M+2)d-1} & e_{(N-K-M+3)d-1} & \cdots & e_{(N-K)d-1} \\ e_{(N-K-M+1)d} & e_{(N-K-M+2)d} & e_{(N-K-M+3)d} & \cdots & e_{(N-K)d} \end{bmatrix}$$

FIG. 14A $$1403: \begin{bmatrix} b_0 & b_1 & \cdots & b_{M-1} \\ b_M & b_{M+1} & \cdots & b_{2M-1} \\ \vdots & \vdots & \cdots & \vdots \\ \vdots & \vdots & \cdots & \vdots \\ b_{N-M} & b_{N-M+1} & \cdots & b_{N-1} \end{bmatrix}$$

FIG. 14B $$1405: \begin{bmatrix} b_{j1} & b_{jd+1} & \cdots & b_{j(M-1)d+1} \\ b_{j2} & b_{jd+2} & \cdots & b_{j(M-1)d+2} \\ \vdots & \vdots & \cdots & \vdots \\ \vdots & \vdots & \cdots & \vdots \\ b_{jd} & b_{j2d} & \cdots & b_{jMd} \end{bmatrix}$$

FIG. 14C

METHOD AND SYSTEM FOR PROVIDING LOW DENSITY PARITY CHECK (LDPC) ENCODING AND DECODING

BACKGROUND OF THE INVENTION

Communication systems employ coding to ensure reliable communication across noisy communication channels. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Also, a key challenge in LDPC code implementation has been how to achieve the connection network between several processing engines (nodes) in the decoder. Further, the computational load in the decoding process, specifically the check node operations, poses a problem.

Therefore, there is a need for an LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding. There is a further need for a scheme that simplifies the communication between processing nodes in the LDPC decoder.

SOME EXEMPLARY EMBODIMENTS

These and other needs are addressed by the present invention, wherein various approaches for encoding and decoding structured Low Density Parity Check (LDPC) codes is provided.

According to one aspect of an exemplary embodiment, a method comprises accessing memory storing information representing a structured parity check matrix of Low Density Parity Check (LDPC) codes. The information is organized in tabular form, such each row represents occurrences of one value within a first column of a group of columns of the parity check matrix, the rows correspond to groups of columns of the parity check matrix. Also, subsequent columns within each of the groups are derived according to a predetermined operation. Further, an LDPC coded signal is outputted based on the stored information representing the parity check matrix. Parity bit accumulators are to initialized to zero, and first information bit in the $j^{th}$ group of M information bits is accumulated in the $i^{th}$ parity bit accumulator if the $i^{th}$ entry in $(jM)^{th}$ column of the parity check matrix is 1, where $j=0, 1, 2, 3, \ldots k_{ldpc}/M-1$, the remaining (M-1) information bits $m=jM+1, jM+2, jM+3, \ldots, (j+1)M-1$ of the $j^{th}$ group being accumulated in the parity bit accumulators according to $\{x+m \mod M\times q\} \mod(n_{ldpc}-k_{ldpc})$, wherein x denotes the address of the parity bit accumulator corresponding to the first bit, jM, in the group, and $$q = \frac{n_{ldpc} - k_{ldpc}}{M}$$

is a code rate dependent constant, and after all of the information bits are exhausted, operations, starting with i=1 are performed according to $p_i = p_i \oplus p_i-1, 2, \ldots, n_{ldpc}-k_{ldpc}-1$, wherein final content of $p_i=0, 1, \ldots, n_{ldpc}-k_{ldpc}-1$ is equal to the parity bit $p_1$.

According to another aspect of an exemplary embodiment, an apparatus comprises a memory which is configured to store information representing a structured parity check matrix of Low Density Parity Check (LDPC) codes. The information is organized in tabular form, wherein each row represents occurrences of one values within a first column of a group of columns of the parity check matrix. Also, the rows correspond to groups of columns of the parity check matrix, where subsequent columns within each of the groups are derived according to a predetermined operation. The apparatus also comprises circuitry coupled to the memory and configured to output an LDPC coded signal using the stored information representing the parity check matrix. Parity bit accumulators are to initialized to zero, and first information bit in the $j^{th}$ group of M information bits is accumulated in the $i^{th}$ parity bit accumulator if the $i^{th}$ entry in $(jM)^{th}$ column of the parity check matrix is 1, where $j=0, 1, 2, 3, \ldots k_{ldpc}/M-1$, the remaining (M-1) information bits $m=jM+1, jM+2, jM+3, \ldots, (j+1)M-1$ of the $j^{th}$ group being accumulated in the parity bit accumulators according to $\{x+m \mod M\times q\} \mod(n_{ldpc}-k_{ldpc})$, wherein x denotes the address of the parity bit accumulator corresponding to the first bit, jM, in the group, and $$q = \frac{n_{ldpc} - k_{ldpc}}{M}$$

is a code rate dependent constant, and after all of the information bits are exhausted, operations, starting with i=1 are performed according to $p_i=p_i \oplus i=1, 2, \ldots, n_{ldpc}-k_{ldpc}-1$, wherein final content of $p_i, i=0, 1, \ldots, n_{ldpc}-k_{ldpc}-1$ is equal to the parity bit $p_i$.

According to another aspect of an exemplary embodiment, a method comprises accessing memory storing edge information associated with a structured parity check matrix used to generate Low Density Parity Check (LDPC) coded signal. The edge information represent relationship between bit nodes and check nodes, and are stored according to a predetermined scheme that permits concurrent retrieval of a set of the edge information. Further, a decoded signal is outputted corresponding to the LDPC coded signal based on the stored edge information.

According to another aspect of an exemplary embodiment, a method comprises accessing memory storing edge information and a posteriori probability information associated with a structured parity check matrix used to generate Low Density Parity Check (LDPC) coded signal. The edge information represents relationship between bit nodes and check nodes, and are stored according to a predetermined scheme that permits concurrent retrieval of a set of the edge information. Further, a decoded signal is outputted corresponding to the LDPC coded signal based on the stored edge and a posteriori probability information.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 14A-14C are diagrams of the edge, a posteriori, and shifted a posteriori, respectively, of memory organized to support LDPC decoding, according to an exemplary embodiment.

DESCRIPTION OF PREFERRED EMBODIMENTS

A system, method, and software for efficiently encoding and decoding structured Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
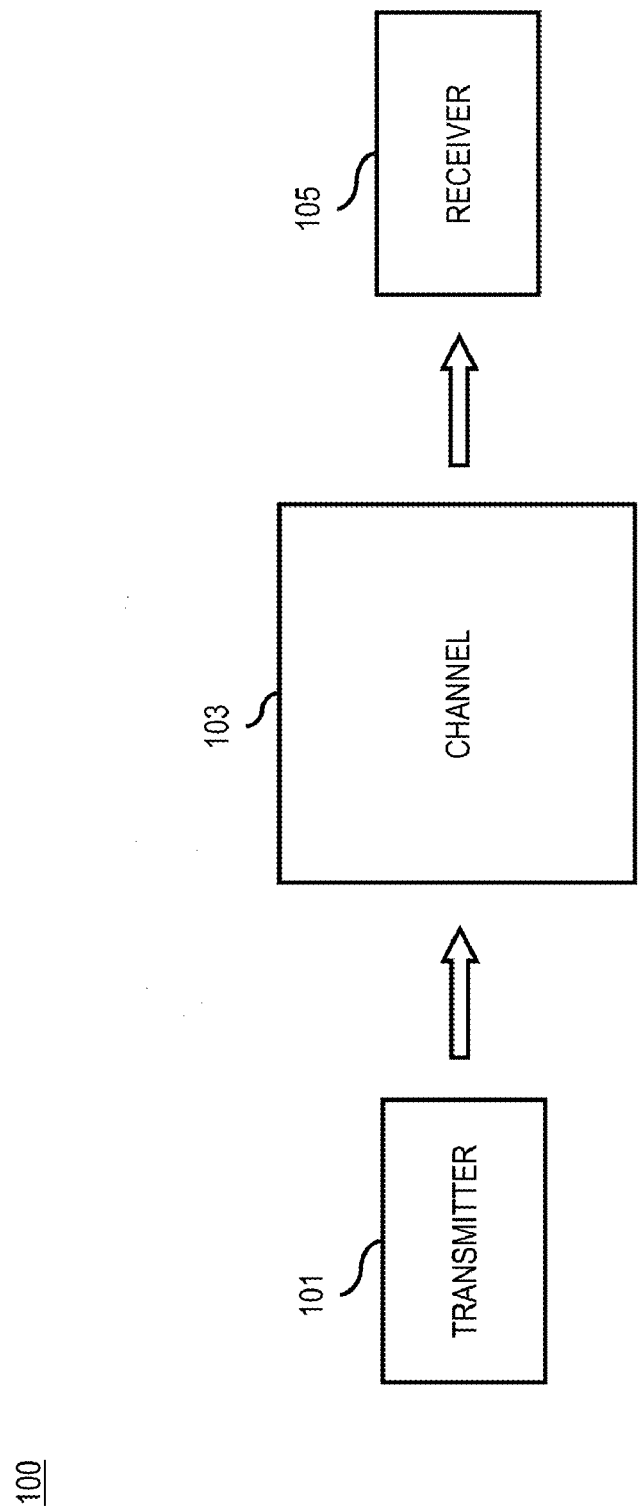
FIG. 1 is a diagram of a communications system configured to utilize Low Density Parity Check (LDPC) codes, according to an exemplary embodiment.

FIG. 1 is a diagram of a communications system configured to utilize Low Density Parity Check (LDPC) codes, according to one embodiment. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme (e.g., quadrature phase-shift keying (QPSK), offset quadrature phase-shift keying (OQPSK), 8-PSK, 16 amplitude and phase-shift keying (16-APSK), etc.).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 2A:
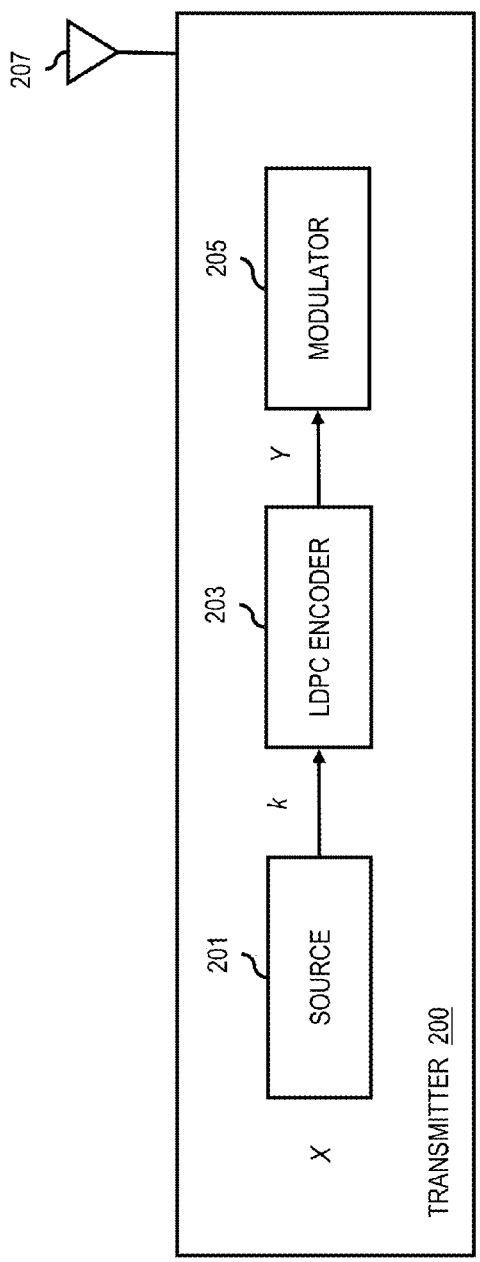
FIGS. 2A-2D are diagrams of exemplary LDPC encoders deployed in the transmitter of FIG. 1 and exemplary encoding processes, according to various exemplary embodiments.

FIG. 2A are diagrams of an exemplary LDPC encoders deployed in the transmitter of FIG. 1, according to various exemplary embodiments. As illustrated in FIG. 2A, a transmitter 200 can be equipped with an LDPC encoder 203 that accepts input from an information source 201 and outputs coded stream of higher redundancy suitable for error correction processing at the receiver 105. The information source 201 can generate k signals from a discrete alphabet, X. LDPC codes can be specified with parity check matrices. On the other hand, encoding LDPC codes may require, in general, specifying the generator matrices. Even though it is possible to obtain generator matrices from parity check matrices using Gaussian elimination, the resulting matrix is no longer sparse and storing a large generator matrix can be complex.

Encoder 203 generates signals from alphabet Y to a modulator 205 using a simple encoding technique that makes use of the parity check matrix by imposing structure onto the parity check matrix. According to certain embodiments, a restriction can be placed on the parity check matrix by constraining certain portion of the matrix to be triangular. The construction of such a parity check matrix is described more fully below in FIG. 6. Such a restriction can result in negligible performance loss, and therefore, constitutes an attractive trade-off.

Modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. In an exemplary embodiment, the modulation can include quadrature phase-shift keying (QPSK), offset quadrature phase-shift keying (OQPSK), 8-PSK, and/or 16 amplitude and phase-shift keying (16-APSK) modulation. The transmissions from the transmit antenna 207 propagate to a receiver, as discussed below.

The LDPC encoder 203 systematically encodes an information block of size $k_{ldpc}$, $i=(i_0, i_1, \ldots, i_{k_{ldpc}}-1)$ onto a codeword of size $n_{ldpc}$, $c=(i_0, i_1, \ldots, i_{k_{ldpc}}-1, p_0, p_1, \ldots p_{n_{ldpc}}-k_{ldpc}-1)$. The transmission of the codeword starts in the given order from $i_0$ and ends with $p_{n_{ldpc}}-k_{ldpc}-1$.

According to certain embodiments, for LDPC codes three different code rates can be defined: 1/2, 2/3, and 4/5. Also, for each code rate 1/2, 2/3, and 4/5, 22 different coded block sizes can be defined: 720, 960, 1200, 1440, 1680, 1920, 2160, 2400, 2640, 2880, 3120, 3360, 3600, 3840, 4080, 4320, 4560, 4800, 5040, 5280, 5520, and 5760 coded bits, corresponding to 3 up to 24 slots. Further, bursts longer than 24 slots can be obtained by coding multiple shorter LDPC codes of "almost equal" sizes. Among these 22 block sizes, eight of them correspond to mother LDPC codes, which include 720, 960, 1440, 2160, 2880, 3600, 4320, and 5760 bit blocks. The other 14 codes can be derived from the mother codes by shortening and puncturing, as discussed below.

Figure 2B:
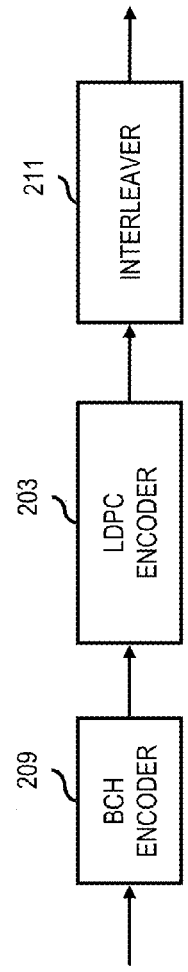
Figure 2D:
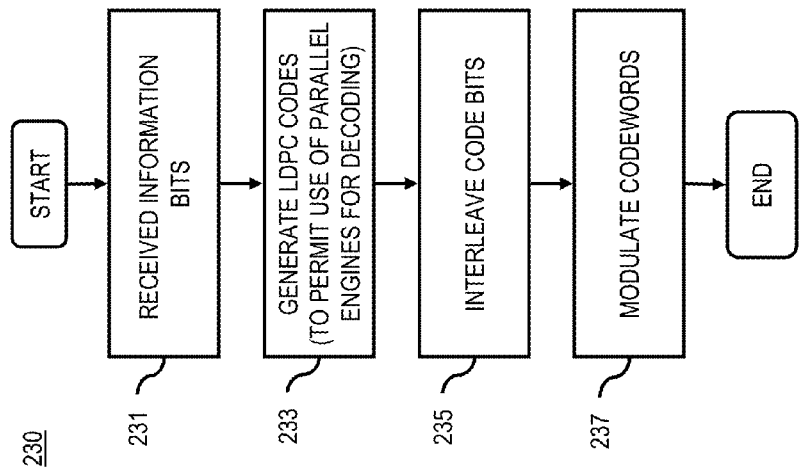
Figure 2C:
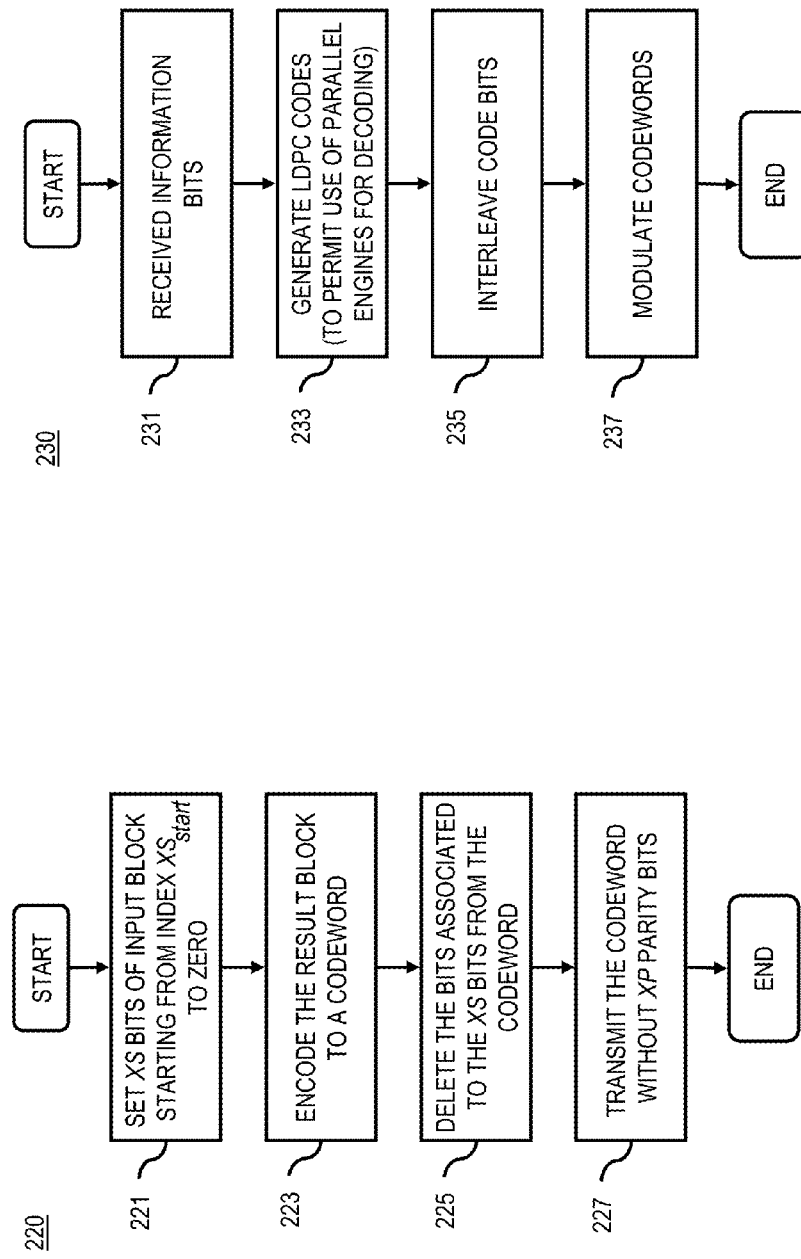

According to an exemplary embodiment, shortening and puncturing process can be explained with respect to FIG. 2C. In on example, for the shortening process, XS bits starting from index $XS_{start}$ in the input block are set to 0 before encoding (per step 221). After encoding, these bits are omitted from the resulting codeword before transmission (per steps 223 and 225). Additionally or alternatively, for the puncturing process, the following XP parity bits are not transmitted $p_0, p_{XP_{period}}, p_{2XP_{period}}, \ldots, p_{(XP-1)XP_{period}}$, where $XP_{period}$ is a code dependent parameter (per step 227).

For each block size which is not a mother code size, the parameters related to shortening and puncturing as well as the mother codes are given in Table 1 below. Note that if $K_{mother}$ and $N_{mother}$ denote the number of un-coded and coded bits of the mother code, respectively, for the derived code:

$$K=K_{mother}-XS,$$

$$N=N_{mother}-XS-XP.$$

Here, K and N denote the number of un-coded and coded bits of the derived code, respectively.

TABLE 1

Parameters Related to Shortening and Puncturing

| Rate/Block Size | XS | $XS_{start}$ | XP | $XP_{period}$ | Mother Code |
|---|---|---|---|---|---|
| 1/2 1200 | 120 | 0 | 120 | 6 | 1/2 1440 |
| 1/2 1680 | 240 | 0 | 240 | 4 | 1/2 2160 |
| 1/2 1920 | 120 | 0 | 120 | 9 | 1/2 2160 |
| 1/2 2400 | 240 | 0 | 240 | 4 | 1/2 2880 |
| 1/2 2640 | 120 | 0 | 120 | 12 | 1/2 2880 |
| 1/2 3120 | 240 | 0 | 240 | 7 | 1/2 3600 |
| 1/2 3360 | 120 | 0 | 120 | 15 | 1/2 3600 |
| 1/2 3840 | 240 | 0 | 240 | 9 | 1/2 4320 |
| 1/2 4080 | 120 | 0 | 120 | 18 | 1/2 4320 |
| 1/2 4560 | 600 | 0 | 600 | 3 | 1/2 5760 |
| 1/2 4800 | 480 | 0 | 480 | 3 | 1/2 5760 |
| 1/2 5040 | 360 | 0 | 360 | 8 | 1/2 5760 |
| 1/2 5280 | 240 | 0 | 240 | 12 | 1/2 5760 |
| 1/2 5520 | 120 | 0 | 120 | 24 | 1/2 5760 |
| 2/3 1200 | 160 | 480 | 80 | 6 | 2/3 1440 |
| 2/3 1680 | 320 | 720 | 160 | 3 | 2/3 2160 |
| 2/3 1920 | 160 | 720 | 80 | 9 | 2/3 2160 |
| 2/3 2400 | 320 | 960 | 160 | 6 | 2/3 2880 |
| 2/3 2640 | 160 | 960 | 80 | 12 | 2/3 2880 |
| 2/3 3120 | 320 | 1200 | 160 | 7 | 2/3 3600 |
| 2/3 3360 | 160 | 1200 | 80 | 15 | 2/3 3600 |
| 2/3 3840 | 320 | 1440 | 160 | 9 | 2/3 4320 |
| 2/3 4080 | 160 | 1440 | 80 | 18 | 2/3 4320 |
| 2/3 4560 | 800 | 1920 | 400 | 3 | 2/3 5760 |
| 2/3 4800 | 640 | 1920 | 320 | 3 | 2/3 5760 |
| 2/3 5040 | 480 | 1920 | 240 | 8 | 2/3 5760 |
| 2/3 5280 | 320 | 1920 | 160 | 7 | 2/3 5760 |
| 2/3 5520 | 160 | 1920 | 80 | 24 | 2/3 5760 |
| 4/5 1200 | 192 | 288 | 48 | 6 | 4/5 1440 |
| 4/5 1680 | 384 | 1104 | 96 | 4 | 4/5 2160 |
| 4/5 1920 | 192 | 432 | 48 | 9 | 4/5 2160 |
| 4/5 2400 | 384 | 576 | 96 | 6 | 4/5 2880 |
| 4/5 2640 | 192 | 576 | 48 | 12 | 4/5 2880 |
| 4/5 3120 | 384 | 720 | 96 | 7 | 4/5 3600 |
| 4/5 3360 | 192 | 720 | 48 | 15 | 4/5 3600 |
| 4/5 3840 | 384 | 864 | 96 | 9 | 4/5 4320 |
| 4/5 4080 | 192 | 864 | 48 | 18 | 4/5 4320 |
| 4/5 4560 | 960 | 1152 | 240 | 4 | 4/5 5760 |
| 4/5 4800 | 768 | 1152 | 192 | 6 | 4/5 5760 |
| 4/5 5040 | 576 | 1152 | 144 | 8 | 4/5 5760 |
| 4/5 5280 | 384 | 1152 | 96 | 12 | 4/5 5760 |
| 4/5 5520 | 192 | 1152 | 48 | 24 | 4/5 5760 |

In this exemplary embodiment, for each mother LDPC code, the degree distribution of bit nodes is given in Table 2 below, where N denotes the total number of bit nodes, i.e., coded block size. For each code, all of the check nodes except one have the same degree, namely $d_c=7$ for rate 1/2, $d_c=11$ for rate 2/3, and $d_c=20$ for rate 4/5. The remaining check node has degree one less.

TABLE 2

Degree Distribution of Bit Nodes

| Rate | 8 | 7 | 6 | 5 | 4 | 3 | 2 | 1 |
|---|---|---|---|---|---|---|---|---|
| 1/2 | | | N/4 | | N/4 | | N/2-1 | 1 |
| 2/3 | N/6 | | | | | N/6 | N/3 | N/3-1 | 1 |
| 4/5 | | | 2N/5 | | | 2N/5 | N/5-1 | 1 |

According to certain embodiments, the task of the LDPC encoder 203 is to determine $N_{ldpc}-k_{ldpc}$ parity bits ($p_0, p_1, \ldots, p_{n_{ldpc}}-k_{ldpc}-1$) for every block of $k_{ldpc}$ information bits, ($i_0, i_1, \ldots, i_{k_{ldpc}}-1$). In one exemplary embodiment, for instance when LDPC codes with code rates 1/2, 2/3, and 4/5 for coded block sizes 720, 960, 1200, 1440, 1680, 1920, 2160, 2400, 2640, 2880, 3120, 3360, 3600, 3840, 4080, 4320, 4560, 4800, 5040, 5280, 5520, and 5760 coded bits are to be generated, the procedure can be as follows. First, the parity bits are initialized; $p_0 = p_1 = p_2 = \ldots = p_{n_{ldpc}-k_{ldpc}-1} = 0$. The first information bit, $i_0$, is accumulated at parity bit addresses specified in the first row of Tables 3 through 26. For example, for rate 2/3 and code block 720 (Table 3), the following results:

$$p_{83} = p_{83} \oplus i_0$$

$$p_{117} = p_{117} \oplus i_0$$

$$p_{156} = p_{156} \oplus i_0$$

$$p_{169} = p_{169} \oplus i_0$$

$$p_{231} = p_{231} \oplus i_0$$

$$p_{126} = p_{126} \oplus i_0$$

$$p_{112} = p_{112} \oplus i_0$$

$$p_{106} = p_{106} \oplus i_0$$

(All additions are in Galois field (2) (GF(2))).

Then, for the next M−1 information bits, $i_m$, m=1, 2, ..., M−1, these bits are accumulated at parity bit addresses {x+m mod M×q} mod($n_{ldpc}-k_{ldpc}$), where x denotes the address of the parity bit accumulator corresponding to the first bit $i_0$, M is number of columns in edge RAM (Table 44), and $$q = \frac{n_{ldpc} - k_{ldpc}}{M}.$$

Continuing with the example, M=30 and q=8 for code rate 2/3 and coded block size 720. By way of example, for information bit $i_1$ the following operations are performed:

$$p_{91} = p_{91} \oplus i_1$$

$$p_{125} = p_{125} \oplus i_1$$

$$p_{164} = p_{164} \oplus i_1$$

$$p_{177} = p_{177} \oplus i_1$$

$$p_{239} = p_{239} \oplus i_1$$

$$p_{134} = p_{134} \oplus i_1$$

$$p_{120} = p_{120} \oplus i_1$$

$$p_{114} = p_{114} \oplus i_1$$

For the $(M+1)^{st}$ information bit $i_M$, the addresses of the parity bit accumulators are given in the second row of the Tables 3 through 26. In a similar manner the addresses of the parity bit accumulators for the following M−1 information bits $i_m$, m=M+1, M+2, ..., 2M−1 are obtained using the formula {x+m mod M×q} mod($n_{ldpc}-k_{ldpc}$), where x denotes the address of the parity bit accumulator corresponding to the information bit $i_M$, i.e., the entries in the second row of the Tables 3-26. In a similar manner, for every group of M new information bits, a new row from Tables 3 through 26 are used to find the addresses of the parity bit accumulators.

After all of the information bits are exhausted, the final parity bits are obtained as follows. First, the following operations are performed, starting with i=1

$$p_i = p_i \oplus p_{i-1}, i=1,2,\ldots,n_{ldpc}-k_{ldpc}-1.$$

Final content of $p_i$, i=0, 1, ..., $n_{ldpc}-k_{ldpc}-1$ is equal to the parity bit $p_i$.

TABLE 3

Address of Parity Bit Accumulators (Rate 2/3 - Coded Block Size 720)

83 117 156 169 231 126 112 106
120 169 106 27 188 213 22 159
160 121 106 203 196 141 174 135
64 137 226 91 180 85 166 7
82 7 198 148
134 24 9 83
149 160 1 151
74 203 116 13
206 12 101
200 45 98
16 235 165
167 25 171
2 83 33
8 174 207
36 170 207
73 172 86

TABLE 4

Address of Parity Bit Accumulators (Rate 2/3 - Coded Block Size 960)

52 293 211 106 128 87 286 89
224 273 74 99 28 301 142 311
160 201 210 123 252 165 198 183
296 105 10 283 244 317 302 263
289 168 207 267
167 170 141 156
270 266 240 171
89 28 237 158
113 67 118
66 160 22
144 269 180
53 59 121
36 183 238
171 140 314
271 168 42
153 173 31

TABLE 5

Address of Parity Bit Accumulators (Rate 2/3 - Coded Block Size 1440)

140 296 319 355 373 182 329 266
144 169 426 155 348 381 78 87
120 169 242 371 292 13 286 95
280 449 10 371 396 405 78 15
317 42 380 336
254 233 301 60
251 175 218 120
465 147 390 407
387 273 287
120 279 97
404 22 283
323 256 453
182 77 449
90 20 48
466 415 301
474 228 350

TABLE 6

Address of Parity Bit Accumulators (Rate 2/3 - Coded Block Size 2160)

458 368 73 243 357 298 305 695
375 511 575 629 186 130 624 561
297 284 204 637 10 623 195 436
300 433 110 712 401 618 379 608
710 700 390 535 73 478 524 641
456 554 363 400 174 463 249 575
228 542 556 493
30 684 581 225

TABLE 6-continued

Address of Parity Bit Accumulators (Rate ⅔ - Coded Block Size 2160)

195 134 61 82
461 45 387 244
91 128 71 246
439 212 274 359
476 394 234
171 501 391
327 528 41
186 62 253
513 295 157
661 152 196
16 490 710
239 257 96
687 710 408
525 160 18
671 331 370
101 68 695

TABLE 7

Address of Parity Bit Accumulators (Rate ⅔ - Coded Block Size 2880)

689 581 139 306 45 371 886 576
864 596 6 651 693 810 770 281
270 557 325 275 561 672 196 22
620 324 77 312 851 642 917 480
375 88 57 746 364 910 527 644
753 823 360 921 218 411 908 190
327 111 217 269 888 307 914 934
785 439 682 171 60 686 959 308
79 103 568 563
337 312 523 352
906 492 471 800
250 867 303 860
287 619 702 706
262 430 9 941
293 225 244 626
629 918 697 381
145 371 102
597 575 280
464 618 388
509 844 631
525 123 362
611 638 271
26 433 548
485 745 726
561 742 125
754 318 457
864 219 632
354 688 116
523 425 552
935 147 735
956 807 610
421 60 142

TABLE 8

Address of Parity Bit Accumulators (Rate ⅔ - Coded Block Size 3600)

157 563 346 756 65 524 238 859
133 475 1007 791 420 858 76 301
284 200 701 389 119 1155 823 1078
812 853 194 459 500 415 346 448
381 418 343 1048 452 724 87 169
402 105 410 511 534 417 676 883
762 170 553 957 559 618 276 41
2 505 486 607 308 389 110 251
1052 834 570 871 69 1124 923 1102
760 445 906 167 68 792 573 254
684 999 752 981
442 651 372 1113
366 204 230 25
1160 426 171 768
909 61 798 10

TABLE 8-continued

Address of Parity Bit Accumulators (Rate ⅔ - Coded Block Size 3600)

369 60 174 167
59 915 728 356
655 456 997 967
37 755 113 1045
142 443 934 297
930 1156 502
597 452 760
439 725 889
1093 1100 48
377 511 752
330 817 1155
239 1006 823
522 725 95
871 813 30
92 539 1164
504 545 707
141 714 38
923 874 369
623 904 541
340 756 382
273 661 1195
194 29 931
1008 1178 687
326 18 927
246 488 976

TABLE 9

Address of Parity Bit Accumulators (Rate ⅔ - Coded Block Size 4320)

1029 1059 593 574 702 1161 695 1357
1081 1333 648 1179 898 1266 88 924
914 633 5 924 1123 291 191 48
113 1434 11 1094 102 337 695 504
348 286 209 712 85 207 748 1340
653 203 1365 377 983 1436 1308 962
1228 319 680 1114 1070 39 307 45
1375 416 1095 982 917 1281 912 434
355 165 527 513 36 655 86 530
313 556 630 1112 1306 851 904 666
44 487 166 565 335 521 699 272
1177 1228 1301 630 10 59 326 639
601 1326 1065 1142
107 1124 1074 1374
469 1262 508 867
525 588 827 209
1105 123 1383 1037
960 992 129 1397
1075 810 1015 1167
244 427 1272 786
44 560 88 787
362 565 688 1365
1066 622 1192 674
727 802 1100 1342
296 801 120
1147 453 1019
800 1332 1139
776 478 1249
1002 1252 862
91 178 1375
375 385 682
1095 51 285
744 187 1343
178 371 415
1119 1325 1332
688 873 494
295 1150 1182
122 733 137
572 981 589
672 1242 914
534 417 277
1288 1070 68
268 1202 884
461 1295 642
335 1384 926

TABLE 9-continued

Address of Parity Bit Accumulators (Rate ⅔ - Coded Block Size 4320)

1433 821 27
97 1156 732
1299 1278 593

TABLE 10

Address of Parity Bit Accumulators (Rate ⅔ - Coded Block Size 5760)

956 226 1821 1871 298 767 474 759
199 742 1600 1277 660 1377 145 482
426 300 1141 614 179 1853 1325 1737
602 658 545 1692 708 1146 131 283
1380 557 1578 525 1552 500 1167 594
1907 1319 757 86 1774 238 76 1841
1428 1568 1071 800 875 102 928 791
1021 1503 1654 1747 1688 1329 910 1393
1473 1754 1215 709 1463 295 118 1262
1216 1614 1717 869 769 661 703 1025
1221 932 1345 1510 943 1367 590 333
259 246 1694 1861 592 551 501 778
1774 98 459 1122 405 83 1466 1186
1542 1072 1405 176 731 704 1609 1115
1320 1803 454 276 247 1748 1899 1630
612 1755 879 1836
695 1118 967 297
1436 30 1222 200
454 926 349 1747
1825 1853 262 1060
1306 50 705 38
1017 1079 516 705
556 1170 624 1143
1370 1533 54 801
51 1483 647 25
1659 1673 764 477
1754 222 858 310
1703 514 692 1381
1578 1769 211 103
1112 378 54 1139
1050 710 670
711 221 1575
1908 101 1705
1006 1085 14
1593 499 1201
1603 1372 74
1214 514 1415
1788 55 393
1102 835 557
513 165 1911
1695 193 990
320 822 1469
518 1260 1266
662 679 65
737 883 1030
642 138 202
97 1539 293
1254 1316 87
238 971 1427
1073 384 1348
447 1502 247
398 997 1467
580 354 1388
236 418 1011
110 656 1583
1291 126 769
849 1756 89
1206 1771 1654
942 99 92
634 226 1559

TABLE 11

Address of Parity Bit Accumulators (Rate ⅘ - Coded Block Size 720)

75 126 40 130 137 104
108 132 7 70 35 95
81 57 97 40 20 125
63 142 128
117 73 110
21 85 125
63 100 83
120 142 134
0 94 113
141 24 70 94 20 143
96 30 43 1 47 104
39 123 13 31 89 65

TABLE 12

Address of Parity Bit Accumulators (Rate ⅘ - Coded Block Size 960)

90 169 14 33 76 59
108 127 8 177 154 119
126 85 116 63 142 11
108 1 86 117 184 191
174 37 44 159 124 23
36 73 20 147 28 41
76 54 47
147 142 121
176 163 41
170 52 1
156 135 122
18 105 113
159 26 155
95 62 163
24 83 7
166 135 187
66 22 62
186 39 58
90 67 110 39 178 107
6 163 104 159 16 71
48 145 98 63 76 173
102 25 104 177 160 155
150 7 110 189 124 113
144 25 80 117 22 71

TABLE 13

Address of Parity Bit Accumulators (Rate ⅘ - Coded Block Size 1440)

264 211 242 129 16 119
48 205 80 63 244 263
216 157 266 117 34 23
138 157 62 69 184 191
54 271 242 255 88 275
84 145 128 219 268 89
127 262 59
148 60 122
80 24 61
27 250 11
75 18 103
278 147 5
63 224 95
201 7 56
213 217 286
42 8 190
42 23 154
42 73 143
84 109 86 63 262 233
126 19 110 207 262 149
210 121 248 279 4 227
264 217 176 99 268 113
108 103 284 225 262 17
42 205 14 129 262 5

TABLE 14

Address of Parity Bit Accumulators (Rate 4/5 - Coded Block Size 2160)

281 315 114 116 176 342
362 150 317 33 131 280
431 137 422 154 68 176
53 391 168 258 17 139
188 69 199 0 57 38
219 108 429 335 414 385
234 323 180 309 39 56
162 3 340 189 214 359
408 9 30
221 305 174
341 208 410
202 272 267
378 165 395
4 383 377
228 15 35
356 86 223
79 225 194
91 314 254
366 393 251
338 181 425
79 29 152
84 72 125
372 63 256
43 204 422
390 59 200 429 351 265
408 118 106 173 68 305
16 233 390 415 219 244
106 251 428 70 311 216
82 413 59 342 337 76
114 357 215 352 174 425
138 83 12 373 287 24
1 50 203 252 85 239

TABLE 15

Address of Parity Bit Accumulators (Rate 4/5 - Coded Block Size 2880)

111 270 437 502 215 181
115 18 330 442 508 57
201 182 392 492 206 124
189 451 399 501 403 32
200 229 331 351 294 55
263 94 539 298 378 475
362 562 320 395 357 540
452 399 202 419 449 393
541 128 462 256 527 206
165 533 465
29 163 494
388 102 474
361 183 11
355 539 347
69 565 162
160 473 76
432 508 35
117 527 385
556 514 422
556 289 534
385 572 3
66 303 14
29 364 514
95 58 411
90 209 222
279 188 292
459 182 359
47 64 413 399 402 275
63 35 345 454 32 353
317 307 34 440 315 112
45 191 352 60 120 151
290 192 503 509 474 52
490 313 123 299 206 345
198 370 265 221 363 7
558 496 166 185 132 8
351 424 436 527 96 430

TABLE 16

Address of Parity Bit Accumulators (Rate 4/5- Coded Block Size 3600)

76 283 600 479 262 505
293 236 203 12 711 181
666 76 24 687 283 527
339 302 389 571 618 659
38 469 340 151 555 34
248 637 466 352 497 571
429 706 259 96 459 378
297 40 656 282 119 682
506 573 228 649 329 702
38 272 81 305 138 154
62 632 93 267 563 172
336 133 650 557 692 309
358 271 456
263 435 533
655 660 29
356 115 160
692 100 396
313 435 57
267 16 575
370 383 398
554 524 221
210 517 585
438 157 10
170 522 333
611 426 28
423 185 78
141 196 602
17 558 250
420 485 668
351 166 129
576 309 235
146 339 348
379 604 23
313 319 694
601 188 611
697 446 464
70 460 23 530 342 627
661 268 10 434 300 3
612 376 351 150 29 287
503 15 326 25 257 680
359 29 342 391 214 108
223 25 131 162 458 29
693 594 574 48 524 343
645 375 106 479 678 408
92 213 691 88 204 221
109 92 165 226 52 698
697 415 704 309 496 158
361 315 689 427 572 513

TABLE 17

Address of Parity Bit Accumulators (Rate 4/5 - Coded Block Size 4320)

67 837 44 354 141 632
292 816 309 137 515 334
709 598 186 77 169 430
398 551 661 99 329 15
752 230 687 837 554 57
308 303 181 138 190 512
646 202 184 382 535 143
440 281 158 673 434 518
329 561 164 854 712 411
45 470 274 759 90 331
50 273 858 732 447 455
835 257 816 72 415 251
444 609 690 263 388 3
299 44 189 403 484 567
592 331 252 621 721 626
688 324 456 251 44 765
529 783 541
290 560 542
447 792 530
365 753 436
356 161 445
402 805 278

TABLE 17-continued

Address of Parity Bit Accumulators (Rate 4/5 - Coded Block Size 4320)

852 799 149
376 599 101
55 240 524
3 331 862
35 140 184
752 811 202
425 444 679
606 731 326
105 234 35
598 585 810
118 175 145
255 506 806
62 825 464
585 594 451
27 581 567
430 722 179
391 195 228
206 165 381
760 480 423
774 748 185
26 337 720
746 189 689
636 120 676
306 831 40
267 124 301
148 485 219
428 157 595 505 575 282
598 201 151 484 627 96
551 148 169 184 845 611
513 688 585 371 855 414
734 139 696 404 252 341
496 577 149 164 339 285
238 827 336 339 631 38
533 738 641 633 463 36
519 767 641 624 748 585
421 848 385 356 747 376
732 222 490 200 406 658
45 410 498 286 135 655
502 152 78 273 13 75
546 122 357 550 120 571
514 362 572 479 155 358
642 389 90 220 749 591

TABLE 18

Address of Parity Bit Accumulators (Rate 4/5 - Coded Block Size 5760)

389 1050 43 678 88 303
988 1112 642 633 59 92
196 260 661 696 74 1098
375 444 435 540 1 542
9 673 1149 388 66 797
1013 404 516 1096 82 811
780 161 190 661 883 745
620 594 79 742 441 435
838 59 501 129 403 117
1139 557 973 110 67 654
44 1132 15 859 885 513
1147 900 748 563 757 927
690 835 1117 477 1010 651
742 587 230 170 748 132
688 1127 1040 413 6 16
886 29 14 593 20 998
540 904 605 932 1115 591
882 1120 533 697 1112 611
976 629 194
799 762 578
577 96 66
203 751 141
365 269 201
549 25 880
217 336 788
146 664 849
893 498 1119
862 490 978

TABLE 18-continued

Address of Parity Bit Accumulators (Rate 4/5 - Coded Block Size 5760)

727 203 717
162 946 1131
1093 824 614
332 982 325
661 604 868
764 1097 603
36 1001 549
774 746 623
384 1028 856
774 381 889
627 261 731
47 97 1045
621 1062 325
1025 208 240
693 734 291
160 932 427
994 619 848
1127 74 44
923 431 318
935 887 1059
970 984 730
696 21 418
266 684 96
358 797 717
602 877 325
184 782 625
1033 304 1094 562 1031 361
566 715 198 975 365 519
268 1109 294 662 287 478
13 419 213 575 842 748
918 363 549 1004 578 408
644 188 128 508 828 844
1009 1101 243 44 426 580
200 858 241 89 119 294
305 64 560 284 675 847
925 916 740 18 1151 1113
90 669 470 1037 733 863
509 937 514 852 792 51
1023 73 245 1138 404 571
780 1034 473 641 676 739
802 963 1102 372 553 173
619 44 844 977 384 249
687 727 81 300 448 636
867 1048 277 891 1056 139

TABLE 19

Address of Parity Bit Accumulators (Rate 1/2 - Coded Block Size 720)

207 174 209 139 68 88
270 136 45 188 329 145
13 335 136 6 213 20
161 74 339 307
30 262 39 212
282 19 124 275

TABLE 20

Address of Parity Bit Accumulators (Rate 1/2 - Coded Block Size 960)

424 467 351 278 130 273
138 208 267 420 457 470
387 230 264 237 68 346
450 148 62 67 5 225
213 471 123 289
159 412 221 434
136 479 246 148
448 65 213 239

TABLE 21

Address of Parity Bit Accumulators (Rate ½ - Coded Block Size 1440)

414 469 23 658 559 440
13 322 153 338 220 539
567 661 680 386 259 347
207 511 215 469 536 420
83 295 133 280 363 378
713 453 579 307 234 676
148 471 150 633
509 417 524 696
681 360 306 281
674 130 544 629
252 326 10 461
72 122 488 562

TABLE 22

Address of Parity Bit Accumulators (Rate ½ - Coded Block Size 2160)

297 811 822 736 708 943
786 553 17 33 889 496
1010 1062 726 681 597 911
911 71 753 446 49 854
717 1046 935 440 228 1
116 572 295 736 517 419
164 80 651 1055 264 493
937 221 845 537 1014 925
472 934 172 1016 122 900
787 1045 113 1071
270 784 605 590
766 5 50 426
316 146 664 581
929 722 251 201
324 184 193 60
436 81 412 342
867 688 819 114
1 453 688 63

TABLE 23

Address of Parity Bit Accumulators (Rate ½ - Coded Block Size 2880)

101 1400 91 580 236 1044
486 1368 512 230 845 573
1160 993 303 140 278 717
646 922 1087 148 542 23
1249 393 1151 1375 903 86
1062 1298 1341 622 392 300
1055 107 950 526 196 1387
48 1325 1143 124 1197 598
875 552 728 175 826 111
708 469 262 1129 723 850
501 570 1081 1058 455 712
1145 1172 228 1302 729 637
836 781 323 1360
720 712 36 138
1220 1375 1185 457
689 115 1298 1372
537 995 1167 906
1039 678 1301 1058
71 1001 481 1178
1042 987 203 832
1086 1090 1059 785
365 1000 133 624
819 954 523 781
795 401 210 1171

TABLE 24

Address of Parity Bit Accumulators (Rate ½ - Coded Block Size 3600)

1615 11 1423 653 1242 3
1164 1604 22 270 1067 941

TABLE 24-continued

Address of Parity Bit Accumulators (Rate ½ - Coded Block Size 3600)

1065 266 40 831 1452 502
1090 1742 345 1123 1309 1293
667 278 947 473 193 1038
1416 1546 358 1344 1081 288
1457 1238 680 1725 1426 1378
130 323 181 1307 1019 616
1401 355 1794 1360 906 1368
175 133 250 1119 1767 963
69 1115 156 1216 34 682
330 113 1399 608 1324 860
897 270 1384 42 887 858
1684 1358 553 1015 1614 819
681 864 1366 1205 540 638
1085 1323 1189 1110
1287 912 1128 779
1473 645 944 1669
1315 554 1031 1229
434 154 515 1321
374 1745 203 97
620 1537 339 589
321 839 962 1507
921 165 1331 478
1571 1466 92 309
1010 1266 1152 897
2 929 1291 380
176 832 1228 1442
1166 1648 787 366
1501 952 1676 417

TABLE 25

Address of Parity Bit Accumulators (Rate ½ - Coded Block Size 4320)

175 41 262 1037 621 1340
2050 2108 353 875 522 896
1948 281 1659 346 198 451
1837 321 608 367 1763 1750
1128 1444 1043 601 674 1352
1410 931 2146 191 383 2007
140 562 1734 2136 2075 1162
879 708 609 37 2135 544
1785 1320 854 1714 1370 1222
169 312 386 1840 743 194
1393 319 1007 1724 1001 1082
1791 600 1761 569 1306 638
1028 1403 2133 1507 868 106
1610 1752 1194 915 1006 121
1891 1497 1025 1556 113 2019
116 1407 1021 455 1665 103
745 1911 1398 1056 1492 1713
396 64 1710 10 2149 1290
2089 767 308 1383
1637 110 1437 18
2090 1374 66 135
28 588 1760 157
1205 1607 186 835
1047 1512 1697 699
489 590 1458 2082
980 1269 265 1281
2 449 1917 631
2152 1888 360 1316
1000 396 927 910
1639 1972 1002 2053
773 1871 991 901
728 1379 1204 799
2030 1411 1438 869
1509 1204 927 1417
1130 1087 912 293
900 1922 2067 736

TABLE 26

Address of Parity Bit Accumulators (Rate ½ - Coded Block Size 5760)

991 2656 114 1713 234 760
883 1301 934 346 2155 1420
2443 2775 1617 1593 159 199
477 646 1667 1713 199 2737
2741 2673 1810 14 120 2234
1578 2252 185 1589 691 951
954 1090 1065 1344 4 1350
26 1700 2872 987 177 2031
567 2277 2248 1348 1618 1892
678 1088 555 291 2685 2702
1874 107 1258 696 2667 1780
976 1578 1289 597 1115 2225
1509 1488 212 1836 1082 1066
2092 157 1240 296 980 313
956 1798 952 806 707 8
2845 1391 2453 295 179 1602
1694 95 2617 1135 840 2655
117 2827 41 2147 2218 1321
198 2869 1414 227 2148 2161
2257 282 818 1179 2178 1817
1023 96 749 2841 725 709
2323 1646 2017 701 2838 2277
454 1851 304 1697 1800 1863
2567 990 46 44 1603 961
175 2194 2443 2183
2198 2302 308 445
126 2026 2569 62
2234 80 6 1463
911 1687 1890 16
2275 1495 2345 2761
1887 832 1464 194
820 2002 2582 375
1231 2864 1161 347
2120 1243 2461 450
1526 2479 146 2618
1010 2389 1718 2592
1103 517 1420 2112
47 829 814 2835
2494 777 2861 510
1265 924 893 8
1230 125 299 1703
2753 1547 1228 2307
1389 2451 756 1991
1965 2149 8 1596
2061 1136 2380 2211
2724 2110 161 1740
2868 284 656 628
2508 1614 2052 332

FIG. 2B shows an LDPC encoder utilized with a Bose Chaudhuri Hocquenghem (BCH) encoder 209 and an interleaver 211, according to another exemplary embodiment. Under this scenario, the codes generated by the LDPS encoder 203 and the BCH 209, can have a concatenated outer BCH code. Further, the output of the LDPC encoder can be bit interleaved using the interleaver 211. In one exemplary embodiment, the interleaver 211 can be a block interleaver. Alternatively, the interleaver 211 can be an optional element in the transmitter and instead an interleaver in a receiver (such as receiver 105) can be used to interleave decoder input. Additionally, a cyclic redundancy check (CRC) encoder (not shown) can be connected to the BCH encoder 209 such that error detection can be achieved using cyclic redundancy check (CRC) codes.

Continuing with this scenario, the LDPC encoder 203 systematically encodes an information block of size $k_{ldpc}$, $i=(i_0, i_1, \ldots, i_{k_{ldpc}}-1)$ onto a codeword of size $n_{ldpc}$, $c=(i_0, i_1, \ldots, i_{k_{ldpc}}-1, p_0, p_1, \ldots p_{n_{ldpc}}-k_{ldpc}-1)$. The transmission of the codeword starts in the given order from $i_0$ and ends with $p_{n_{ldpc}}-k_{ldpc}-1$. According to certain embodiments, another set of LDPC codes can be defined. For example, the LDPC code parameters ($n_{ldpc}$, $k_{ldpc}$), according to these exemplary embodiments, are given in Table 27 below.

TABLE 27

LDPC Code Parameters ($n_{ldpc}$, $k_{ldpc}$)

| Code Rate | LDPC Uncoded Block Length $k_{ldpc}$ | LDPC Coded Block Length $n_{ldpc}$ |
|---|---|---|
| ¼ | 16200 | 64800 |
| ⅓ | 21600 | 64800 |
| ⅖ | 25920 | 64800 |
| ½ | 32400 | 64800 |
| ⅗ | 38880 | 64800 |
| ⅔ | 43200 | 64800 |
| ¾ | 48600 | 64800 |
| ⅘ | 51840 | 64800 |
| ⅚ | 54000 | 64800 |
| 8/9 | 57600 | 64800 |
| 9/10 | 58320 | 64800 |

According to this exemplary embodiment, the LDPC encoder 203 determines $n_{ldpc}-k_{ldpc}$ parity bits ($p_0, p_1, \ldots, p_{n_{ldpc}}-k_{ldpc}-1$) for every block of $k_{ldpc}$ information bits, ($i_0, i_1, \ldots, i_{k_{ldpc}}-1$). Similar to the above-noted embodiments, the procedure can be as follows. First, the parity bits are initialized; $p_0=p_1=p_2=\ldots=p_{n_{ldpc}}-k_{ldpc}-1=0$. The first information bit, $i_0$, are accumulated at parity bit addresses specified in the first row of Tables 28 through 38. For example, for rate 9/10 (Table 28), the following results:

$$p_{853}=p_{853} \oplus i_0$$

$$p_{2958}=p_{2958} \oplus i_0$$

$$p_{3632}=p_{3632} \oplus i_0$$

$$p_{4515}=p_{4515} \oplus i_0$$

(All additions are in GF(2)).

Then, for the next 359 information bits, $i_m$, $m=1, 2, \ldots, 359$, these bits are accumulated at parity bit addresses $$\{x + m \bmod 360\} - \left\{\frac{x + m \bmod 360}{360} - \frac{x}{360}\right\} \times 360,$$

where x denotes the address of the parity bit accumulator corresponding to the first bit $i_0$. By way of example, for information bit $i_1$, the following operations are performed:

$$p_{854}=p_{854} \oplus i_1$$

$$p_{2959}=p_{2959} \oplus i_1$$

$$p_{3633}=p_{3633} \oplus i_1$$

$$p_{4516}=p_{4516} \oplus i_1$$

For the 361$^{st}$ information bit $i_{360}$, the addresses of the parity bit accumulators are given in the second row of the Tables 28 through 38. In a similar manner the addresses of the parity bit accumulators for the following 359 information bits $i_m$, $m=361, 362, \ldots, 719$ are obtained using the formula $$\{x + m \bmod 360\} - \left\{\frac{x + m \bmod 360}{360} - \frac{x}{360}\right\} \times 360,$$

where x denotes the address of the parity bit accumulator corresponding to the information bit $i_{360}$, i.e., the entries in the second row of the Tables 28 through 38. In a similar manner, for every group of 360 new information bits, a new row from Tables 28 through 38 are used to find the addresses of the parity bit accumulators.

After all of the information bits are exhausted, the following operations are preformed sequentially where M=360, $$p_M = p_M \oplus p_0$$

$$p_{2M} = p_{2M} \oplus p_M$$

$$p_{3M} = p_{3M} \oplus p_{2M}$$

$$\vdots \quad \vdots \quad \vdots$$

$$p_{n_{ldpc}-k_{ldpc}-M} = p_{n_{ldpc}-k_{ldpc}-M} \oplus p_{n_{ldpc}-k_{ldpc}-2M}$$

$$p_1 = p_1 \oplus p_{n_{ldpc}-k_{ldpc}-M}$$

$$p_{M+1} = p_{M+1} \oplus p_1$$

$$p_{2M+1} = p_{2M+1} \oplus p_{M+1}$$

$$\vdots \quad \vdots \quad \vdots$$

$$p_{n_{ldpc}-k_{ldpc}-M+1} = p_{n_{ldpc}-k_{ldpc}-M+1} \oplus p_{n_{ldpc}-k_{ldpc}-2M+1}$$

$$p_2 = p_2 \oplus p_{n_{ldpc}-k_{ldpc}-M+1}$$

$$p_{M+2} = p_{M+2} \oplus p_2$$

$$p_{2M+2} = p_{2M+2} \oplus p_{M+2}$$

$$\vdots \quad \vdots \quad \vdots$$

$$p_{n_{ldpc}-k_{ldpc}-M+2} = p_{n_{ldpc}-k_{ldpc}-M+2} \oplus p_{n_{ldpc}-k_{ldpc}-2M+2}$$

$$p_3 = p_3 \oplus p_{n_{ldpc}-k_{ldpc}-M+2}$$

$$p_{M+3} = p_{M+3} \oplus p_3$$

$$p_{2M+3} = p_{2M+3} \oplus p_{M+3}$$

$$\vdots \quad \vdots \quad \vdots$$

$$p_{n_{ldpc}-k_{ldpc}-M+3} = p_{n_{ldpc}-k_{ldpc}-M+3} \oplus p_{n_{ldpc}-k_{ldpc}-2M+3}$$

$$\vdots \quad \vdots \quad \vdots \quad \vdots \quad \vdots$$

$$p_{M-1} = p_{M-1} \oplus p_{n_{ldpc}-k_{ldpc}-2}$$

$$p_{2M-1} = p_{2M-1} \oplus p_{M-1}$$

$$p_{3M-1} = p_{3M-1} \oplus p_{2M-1}$$

$$\vdots \quad \vdots \quad \vdots$$

$$p_{n_{ldpc}-k_{ldpc}-1} = p_{n_{ldpc}-k_{ldpc}-1} \oplus p_{n_{ldpc}-k_{ldpc}-M-1}$$

Final content of $p_i$, i=0, 1, . . . , $n_{ldpc}$–$k_{ldpc}$–1 is equal to the parity bit $p_i$.

TABLE 28

Address of Parity Bit Accumulators (Rate 9/10 - Coded Block Size 64800)

853 2958 3632 4515
1434 4116 4989 5634
956 4019 4864 5826
2532 4509 5262 6167
739 1530 4498 5247
3702 4931 5465 6270
1120 2178 3845 5151
860 1124 3462 5411
369 3339 4144 4846
122 2027 3691 5416
262 1354 2338 4093
1573 1950 2733 3244
540 4585 6053 6153
1500 2589 3263 5842
126 535 2167 2851
450 1639 2380 3010
2123 3229 5049 5772

TABLE 28-continued

Address of Parity Bit Accumulators (Rate 9/10 - Coded Block Size 64800)

234 1833 3121 6332
3837 5603 6118
1508 3146 3403
233 447 2661
407 1040 6302
1453 4073 6091
2498 3347 6253
2019 3356 4664
753 1184 4888
882 2521 3870
476 2255 2523
3997 4593 5914
1455 2130 2958
84 4217 4371
1407 3850 4794
160 2118 6164
2949 4691 5226
1111 5043 5621
2186 5370 5596
3093 5233 6382
340 3265 5540
278 1666 1883
154 1203 3583
1946 3000 6258
2010 3644 5852
1546 2436 5506
765 3582 4362
1566 2642 5023
1120 4415 6217
1274 4777 5663
2607 4905 5329
429 741 2271
419 2861 3227
595 4276 4577
855 4269 5322
2182 3654 5979
3710 4137 5946
875 4259 5751
305 2387 6465
1039 2552 4422
473 1567 2876
86 433 6038
771 2242 4226
2298 4312 5160
151 1104 5223
584 4865 6443
1351 2789 5736
1104 4867 5210
1551 3806 4771
5682 6074 6155
1678 4509 5883
2934 3723 4530
2155 3451 3623
2012 2913 3395
2081 3019 3550
269 604 1918
2397 2735 3571
247 1410 4047
788 1906 4585
2993 3783 5318
2392 3527 4509
1829 4402 5626
796 3206 5660
406 812 3768
3663 4160 5625
3042 4219 4996
1176 2485 4699
271 360 4695
1415 3372 5921
5159 6118 6466
1699 2861 6151
1581 5066 6060
1482 2649 6313
2270 3658 6419
550 2114 3514
415 5165 5735
2775 3277 5182
1622 2345 3570

TABLE 28-continued

Address of Parity Bit Accumulators (Rate 9/10 - Coded Block Size 64800)

2865 3643 4519
2632 3685 4527
2226 3972 5927
1311 5722 6001
1602 4026 6106
3009 5053 5448
813 1800 2910
1551 2026 3139
517 1223 4953
0 4828 6461
1132 4040 6223
274 745 4778
319 807 4625
1745 1977 5221
296 1451 6474
607 4594 6054
2034 2210 3466
1701 3223 5633
3605 4513 4818
3209 4817 5696
1063 1404 4558
1015 2736 4760
3199 3921 5773
162 871 2135
71 5698 6079
4010 5377 6332
367 3524 5046
2345 2666 3410
2505 2523 3646
1425 4183 6203
459 1102 4163
229 1479 5965
197 671 2247
2221 5136 5542
1092 3353 6170
3140 3789 5437
382 1455 3090
815 4661 6000
2845 4675 6184
2412 2802 5612
1452 4546 6320
2628 2888 5147
362 3915 5810
3442 3666 4755
2054 4036 5025
305 3562 4123
4106 4836 5096
796 1152 2096
958 1329 2122
4439 5432 5802
1689 2298 3816
45 3141 3295
3912 5161 5712
1440 2996 6050
2533 3702 4119
4193 5468 5890
129 1298 4574
3187 3438 4264
1085 1892 4442
457 2552 3594
1340 2466 2781
160 659 2182
641 1612 1826
1063 5226 6345
2011 4735 5207
853 4933 6426
966 4754 6250

TABLE 29

Address of Parity Bit Accumulators (Rate 8/9 - Coded Block Size 64800)

2049 2756 3671 5395
2062 4593 6161 6519
3594 3660 5409 6024

TABLE 29-continued

Address of Parity Bit Accumulators (Rate 8/9 - Coded Block Size 64800)

4566 5595 5783 7088
2197 4281 6587 7010
2107 2430 3117 5274
2090 3237 3762 3961
1606 2603 6401 6537
309 1180 1760 3760
126 1009 5264 5809
300 558 2285 2525
3021 5282 5418 6419
2923 3450 6423 6635
0 1408 2588 4524
582 2368 4008 5411
957 1214 1503 6914
1321 3344 4555 4994
998 1792 4319 4966
519 4925 5921 7124
534 873 3499 4697
578 945 4712 6370
1890 2785 5021 6703
68 3981 5697 6062
354 1841 2857 3267
350 2675 4109 6496
396 4311 4365 5334
5100 5520 6718 6953
1670 2251 2968 4645
1438 2267 3362 3781
840 4252 4440 4835
2117 2756 3263 6959
2397 4592 4930 6336
180 1834 2941 5811
1075 1265 3295 5046
371 949 1704 3804
712 2402 6678 7163
2996 5227 5939 6174
1314 3045 6029 6180
1357 1588 3946 5524
1619 3630 5642 7165
523 1284 5809 6374
1037 2350 3499 5006
450 754 3228 5304
61 1511 3994 5371
5008 5057 5920 7067
872 5505 6243 7060
1950 4250 5059 6284
1530 2449 3873 5981
3594 3941 3993 4476
1071 2100 2959 4081
1408 1503 3668 5595
62 4403 4904 6819
248 650 4973 6699
1177 3464 4504 5642
6 1346 3086 5537
2525 4542 6832 6995
2044 2426 2980 6815
1641 2695 3699 6351
2480 2723 6032 6942
562 2056 2600 3465
311 2303 4701
112 5234 5635
530 1388 4324
2156 4941 6375
1339 2518 6760
2549 3803 6776
975 2190 3459
1270 2712 6091
2633 4075 4591
717 6263 6666
3794 4948 5802
852 1759 5613
1440 5404 7008
2904 3916 4213
3488 5772 6874
212 2011 6308
923 1557 2032
3060 4041 5161
3026 4568 7013
370 3262 5202

TABLE 29-continued

Address of Parity Bit Accumulators (Rate 8/9 - Coded Block Size 64800)

1896 6264 7194
3276 4049 5925
79 550 1582
4867 5376 6999
2703 3553 6995
827 2135 2502
325 4289 5840
1194 3917 4961
3327 4281 5699
1756 2340 2602
1487 2239 4541
202 719 5449
2560 2886 4884
459 5990 6597
742 2046 3944
976 4567 5244
2933 4619 5259
3805 5495 6748
1398 6213 6480
1343 3228 6435
4830 6779 7088
1327 1676 5259
340 488 1702
2811 3854 5534
30 1837 5582
579 785 3869
2899 3333 3628
785 2657 4541
971 2749 6480
597 4445 5355
299 1437 2441
2085 4247 6375
1145 4488 6912
1833 3292 4959
3963 6561 7162
2443 3112 4950
1670 3499 4106
5338 6060 6278
3220 5837 6120
2292 5674 6110
352 2557 7127
655 1431 3892
950 3789 5468
2165 5720 6598
367 2196 7138
4333 5153 6322
1579 2361 4996
1325 2123 5720
317 1513 4311
1286 1693 4722
3066 5803 6995
2888 5376 6535
1875 2817 6013
2553 4671 6228
961 1839 4361
4104 5800 6762
233 3178 4110
800 3507 4766
3539 3669 5388
585 3512 6134
1666 4308 5458
112 4239 6625
110 3973 5250
3298 4395 6336
2354 3379 3711
210 459 1563
2426 3198 6308
1786 3216 6566
586 2233 6149
3278 3784 4918
1167 1843 6728
1411 3084 4696
1165 2050 4655
2147 5642 5955
2827 4333 5671
1021 5092 5872
620 768 6058
2583 5111 6915

TABLE 29-continued

Address of Parity Bit Accumulators (Rate 8/9 - Coded Block Size 64800)

3860 4766 7032
876 2834 7114

TABLE 30

Address of Parity Bit Accumulators (Rate 5/6 - Coded Block Size 64800)

214 1287 3599 6203 6732 8430 9194 9395 9980
1994 2299 4496 4929 5365 5467 5843 6676 8669
2304 2633 3344 4927 5414 6989 7952 9334 9950
1189 1789 2261 2650 3036 4827 6167 7373 9965
992 1133 2522 3853 4977 5278 7483 8206 9230
53 3258 3647 6282 7168 7432 7961 10198 10799
549 1014 1300 4660 4859 7493 7834 8428 10330
435 1379 2897 3293 6178 7642 8384 8661 9720
1844 2609 3924 4101 4912 5290 8307 9089 9411
32 3899 4047 4952 5210 7160 7800 7944 10479
501 1282 1612 5682 6026 8191 9819 10430 10516
556 4506 5254 5500 7675 8450 9389 10255 10701
1723 4051 5530 6927 7833 8298 9041 10424 10643
188 1424 2420 3365 5047 6245 6615 7521 8232
265 1072 1787 2257 4495 5961 6198 9058 9402
236 1138 1815 2696 3214 5306 6634 8592 10173
529 1184 3160 5116 5730 6119 6497 8182 8536
43 922 1479 3406 3836 4130 8455 10196 10528
692 5108 5734 6146 8897 9105 9662 9961 10742
632 3323 4475 5450 7253 8169 9288 9731 10628
4 936 1597 3475 4654 4998 5410 6786 8141
18 424 2199 3817 5917 6701 6847 9168 9436
1669 1947 4208 5007 5857 7067 7850 8740 10008
1951 2758 3548 3619 6060 7068 7628 8800 10408
1606 1858 3799 4297 4433 6323 9927 10420 10647
741 2877 3077 3893 5825 6438 7156 7234 9368
2737 3159 4054 5831 6498 7157 7276 7571 8910
376 908 1908 2462 3031 3988 4464 7283 8778
987 1902 2379 2543 2951 4319 7857 8643 9520
966 1719 2014 2473 3225 4552 6774 8760 9544
5031 6470 10479
5483 7147 8908
2987 4043 9531
2490 3786 8463
2641 3703 8786
342 4576 8364
2894 5906 7978
2212 2892 3662
30 1264 6077
5087 6982 8946
699 5800 10701
627 4350 7062
747 2198 4497
1539 8017 9640
2146 6630 10573
60 4159 6739
428 5711 9203
6650 9315 10101
5298 7993 10192
2031 2726 8602
1553 6178 9771
1964 5248 5667
745 6339 9929
1088 3316 9783
880 7367 9536
4840 7763 9250
3429 7754 10209
2690 4781 7598
1422 4058 7546
1441 3387 7262
3064 3941 4027
1166 2919 4966
214 1688 6563
4848 7445 8724
1085 8334 9687
7210 8968 10531
1380 1992 3748
7145 8003 10575

TABLE 30-continued

Address of Parity Bit Accumulators (Rate 5/6 - Coded Block Size 64800)

4408 8357 9875
278 3029 3784
277 2495 8171
5166 6104 8529
4799 5228 9084
5391 5830 9757
3315 5989 6217
3276 5475 9632
7014 9320 10243
823 8272 10248
783 7690 9959
2816 3970 8732
2794 4387 6479
3324 6192 7225
1701 4453 5609
810 9036 10384
637 6817 7056
2303 2754 10582
1793 2269 7771
2105 4256 5584
702 2057 7844
692 6581 9446
2820 6317 8314
958 1639 6298
2814 3558 7028
4275 5027 5715
6036 7021 9687
4642 5440 6751
3192 3867 4810
992 5736 8424
1756 6605 9514
1819 4087 4950
2113 7082 9867
1763 3762 4068
4360 8056 9032
656 5807 8379
3064 4655 8930
2877 3320 9505
1255 9232 9761
3708 5287 9219
2182 6351 8801
968 6048 8826
1867 7725 9908
2935 7539 8128
323 607 10701
83 3287 5241
352 6761 10091
1140 5277 10408
655 7334 10660
1278 7271 8113
2515 7564 10307
2183 7827 10788
739 6672 7442
2430 8693 9658
211 788 10694
1188 6340 10064
3273 6890 9455
5164 8796 9938
619 1487 9872
577 6316 9134
2929 4828 5650
3536 7557 8995
1445 6562 7647
3770 5525 7910
3883 4543 9429
248 4857 10091
768 1997 2820
2180 2996 8401
2239 3521 6476
3987 4687 10188
90 6658 8634
1100 3621 3977
3969 7344 10605
1473 7069 10558
2917 5784 8427
1816 5508 8015
2823 7668 9330
428 2534 6106

TABLE 30-continued

Address of Parity Bit Accumulators (Rate 5/6 - Coded Block Size 64800)

1431 1909 4632
4542 5877 10409
5075 8151 9244
5127 7046 8018

TABLE 31

Address of Parity Bit Accumulators (Rate 4/5 - Coded Block Size 64800)

1817 3054 3488 3751 6890 9140 10502 11378 11868 12275 12936
89 1422 2236 4571 7578 7924 8512 9841 11152 11710 12163
1594 1810 5237 5879 8395 8758 9026 9510 10850 11269 12504
95 2174 3644 6691 7843 8008 8793 9672 9822 10706 11883
476 913 1307 4253 4779 7094 7769 8067 11781 12260 12888
468 1587 2359 2574 3003 4914 5729 6998 8109 10577 12728
63 955 3518 4330 4813 6145 6717 8288 11362 12139 12398
3574 5338 5719 6564 7926 9411 9738 10573 11384 12585 12653
80 1484 3563 3641 5022 8702 9886 10212 11794 12028 12872
437 982 4635 5280 5971 6780 9604 10377 10863 11315 12260
2194 3066 3302 3898 4234 5128 5486 7405 10533 12046 12837
46 1156 2937 4281 4490 5381 5479 6007 6387 9396 11775
188 2285 3734 4624 6268 6829 7001 8405 10446 12400 12783
346 668 925 4282 5327 7520 7817 9313 10570 11825 11996
1467 2279 3713 4516 5065 6797 7107 8644 9652 10181 12218
1578 3175 3572 3728 6761 7874 8342 10059 10108 11367 11823
980 2624 4486 4915 5812 6862 7858 9215 10201 10922 11261
1268 1932 2258 3530 4265 6280 6919 7770 8412 10225 10875
1616 2859 9569
640 1570 6438
1087 2148 7242
1103 3185 10259
375 1316 8620
998 9881 10833
807 2869 9225
4067 6069 9030
2052 2650 10005
3972 5589 7258
5823 8891 9002
4846 6300 8921
5721 8655 10955
2046 3235 8170
698 2007 8170
2859 5824 7244
2550 5723 7215
4847 6343 7305
2105 6124 11240
1124 1938 3181
6289 6924 10699
1686 8088 12123
3064 10067 11948
6393 7637 9716
3215 9559 10253
3615 8261 12704
3857 5906 12451
6657 8720 10939
331 2123 7912
623 6582 12185
4308 5148 7350
474 4404 7275
8141 8758 12871
1452 5399 11009
2705 10291 10869
856 2785 12538
1254 3656 6705
1332 7476 11775
2496 5237 12796
830 8732 9436
4501 9115 11855
747 2833 10559
4825 9111 10709
3322 4838 7631
3334 5714 8624
1625 2248 10401
2220 9932 11602
153 4580 12491
6877 9144 9766

TABLE 31-continued

Address of Parity Bit Accumulators (Rate 4/5 - Coded Block Size 64800)

3275 4178 11366
4784 6097 7097
4223 5572 8471
329 5500 8464
409 6085 11403
976 4542 12885
1314 7136 9557
876 3109 10866
5194 5950 12311
1729 1990 4996
5868 9658 11497
2492 3252 4058
3266 5373 11134
1518 9489 11357
1319 2447 7169
2443 9842 12756
6948 8482 10132
5548 10188 11787
5055 7735 8385
399 7891 10182
2872 5928 11928
8103 8467 11981
333 11709 12110
1778 5003 10559
4284 6383 12297
1384 7374 11087
3119 3240 8171
1057 11199 12906
5564 8692 12291
8086 8824 11655
4431 5009 7525
2024 2709 7894
7349 8668 10028
143 9918 10502
136 3778 4492
715 4125 6553
3704 6505 10477
3836 5737 6592
2652 6152 9059
1985 3081 9000
611 6229 9123
5299 5444 9951
2537 9840 10862
2410 10471 11971
10221 11129 11718
9313 11077 12924
4733 6403 8554
3461 7033 10336
4815 6292 11823
5173 6984 7388
1728 3079 7734
242 2085 3327
2018 3217 9375
7067 10017 12906
3270 8294 11412
7757 12061 12664
3172 8248 12497
523 3999 4708
5994 8202 8401
498 4083 11935
4557 5092 6119
871 1887 12341
4612 7572 8164
2333 8759 11268
4449 9350 10409
6610 8814 10553
2219 6761 9503
1041 1336 1635
2607 4127 12437
640 1047 6570
1246 1558 2530
5689 6006 11652
1141 6211 9170
91 7545 8808
3618 7244 10595
292 3726 11289
3855 5480 9570

TABLE 32

Address of Parity Bit Accumulators (Rate 3/4 - Coded Block Size 64800)

1760 5736 6289 7119 10593 11012 11496 12025 13422 14631
15154 15673 164 1100 2695 3317 3653 4302 7667 11415 11619
13880 15436 16050 1798 4091 6449 7366 7671 10967 12595
13629 13966 14443 15223 15611 257 3408
3732 4255 6895 7345 7743 8849 9020 9850 10986 13188
70 1455 2981 3365 4050 5044 6202 10072 10204 11606 12669 14768
3442 3685 3992 4326 4898 6793 8840 10582 14008 15061 15727 16033
2719 2917 3500 7784 7966 9057 9474 10303 13882 14234 14619 15245
358 1409 4373 6036 6255 7719 8372 9901 11377 12136 14297 15856
1310 2865 3153 3872 5675 8007 8333 10705 12144 12744 13726 14361
856 3445 3922 5407 6218 7163 7747 8997 10762 10825 12929 13859
891 1579 1912 2609 5373 5670 7097 9162 9678 9912 10356 15425
625 1387 3199 5183 6621 8984 9526 10345 11699 12574 14743 15124
1742 1987 2391 4667 6117 7258 8405 9868 12463 12994 13483 14267
358 594 1887 2555 8155 9537 9885 10328 12711 13234 14450 15773
860 2486 2800 4768 5233 6000 6722 7266 9136 9652 10100 14784
498 5911 8999
5609 11076 12022
2133 9167 15546
8543 12322 15688
3797 10622 12643
5701 9273 13284
2080 6582 13468
2213 7188 14413
661 1020 15912
811 10657 13443
4141 8200 14159
4339 12968 14909
8170 12226 13434
1073 2241 13160
1128 1835 6989
2931 12449 14377
153 2987 11746
687 11918 15905
5921 9434 11859
2516 5393 11701
1329 12412 14801
5762 7932 8496
702 2276 6428
4360 8416 8830
4849 11516 15858
1666 4913 15031
5088 7537 10862
4535 4923 7243
4802 6622 11323
6523 11319 12635
6176 11036 14971
3326 3995 12286
1763 2765 5759
4840 7736 13622
13588 14213 15892
3018 4027 12553
3025 5092 11688
4289 6084 10428
2367 7460 11358
6209 7415 8678
1617 4863 10623
8931 10797 13847
7259 8904 14244
1409 11923 12890
6304 12408 13132
41 7821 13459
6022 10056 13846
8363 11395 16119
7065 15388 15794
5891 8064 11461
5695 9159 15426
2329 4675 16050
2041 12119 15695
5499 9713 15791
655 10137 11619
1896 4703 14660
5204 6886 10810
5133 10666 13767
2828 3812 11725
10934 14068 14604
2360 9460 14878
8060 9050 12993

TABLE 32-continued

Address of Parity Bit Accumulators (Rate ¾ - Coded Block Size 64800)

303 14652 14887
6859 8555 15203
3667 7971 9209
3906 6498 11984
2997 9700 12935
115 7751 8359
2058 3573 10188
648 1315 13058
602 9890 12654
988 1778 9843
2564 3529 6744
972 4602 6484
807 1302 4343
4196 6634 13931
5962 12749 15238
9661 11863 15553
5675 11586 15637
1167 12382 13040
7 5049 9141
8139 9994 11767
3401 7610 13054
541 8910 13153
5173 8362 14231
3018 6572 10557
5245 8559 16096
663 1594 12876
3325 4490 12417
2573 14222 16104
2466 3120 13939
2240 4656 15279
717 3102 12604
734 4505 14156
1152 1815 5691
1126 12352 15553
3594 10949 11900
2275 6381 10326
99 10188 13327
2655 14519 15909
991 1850 12173
7052 10172 13789
6056 6395 15366
3907 6202 12054
4804 11472 13436
7146 7900 14798
3674 8102 9375
4077 7423 11380
306 11199 14687
2879 7603 14956
1569 3781 9492
1663 6808 14985
4897 5766 10659
4086 7472 7992
4868 9749 13476
7079 8892 14719
2029 8392 8642
949 9330 10964
9296 10742 11015
5686 7483 9968

TABLE 33

Address of Parity Bit Accumulators (Rate ⅔ - Coded Block Size 64800)

186 2705 11911 14746 14866 19054 20583
589 2493 5010 12476 14348 15395 19934
3080 4591 7819 10713 18428 18772 20882
2768 4190 4529 5656 7331 18496 20932
2339 3987 5445 6511 15705 16316 16766
1295 2179 11422 12912 13250 18457 20138
4303 6701 8649 11078 11809 14451 17240
3942 7841 8254 8668 9925 18788 19387
1418 9303 10257 14548 15808 17149 20716
777 6711 10002 10711 12550 17952 18446
1581 2148 5630 6397 8165 15108 16517
1173 1911 4755 8232 11675 12224 14445

TABLE 33-continued

Address of Parity Bit Accumulators (Rate ⅔ - Coded Block Size 64800)

2573 5706 7295 13171 13467 15691 20519
544 3371 3803 9894 10663 13295 17349
2903 9162 11813 12604 13528 15554 16639
1885 10990 12657 13183 13956 15403 17674
4435 5234 7142 8315 16582 17274 17470
945 2640 5938 6344 7639 10356 19633
3557 4866 9995 18249 19954 20391 21054
603 2541 4772 5153 7110 7471 8080
1765 4778 10022 11673 12545 17802 19483
980 1173 4386 9288 15145 17227 20934
200 3139 5585 6068 11242 13092 19481
6282 7238 7979 10200 14602 17038 20545
8869 10185 10856 11403 13791 15670 19237
3489 6615 11829 14125 16528 17782 20100
632 1062 4084 7445 9718 18831 21283
3541 3991 10093 16067 19007 19373 20621
3384 6000 6869 8715 10800 11910 16145
2052 8353 9453 11515 16036 18212 21519
6028 7063 7740
2917 5857 16345
5223 8453 11937
6444 9067 18083
9142 13670 20123
2370 5200 16404
823 1854 18333
6791 12202 18118
2373 10455 19524
1234 11042 11405
493 12359 19781
1448 14380 16865
5050 6343 21344
10604 14808 17544
8482 15289 18443
8993 16807 20689
1520 13400 14306
12731 14799 15930
12550 13324 14361
7113 14024 19136
3193 7614 12672
14982 17679 20412
4557 17527 20284
314 15256 20920
1516 9522 13718
3911 9656 13870
180 8572 15928
3848 9380 19334
186 20241 21301
3762 17533 21593
2500 8094 20116
4822 15317 17920
4883 7241 19226
1513 17294 18444
13197 14416 21397
6420 13981 14678
118 3981 8018
3655 8742 16735
1978 6412 15584
9679 12837 20027
15535 17421 21258
1206 16712 21219
2491 4233 6564
7971 10528 11712
10592 12847 16156
5295 13708 16655
6070 15542 17706
5712 5981 8432
1408 19968 2251
2617 3499 15856
15339 18614 18850
2724 4249 10874
3092 9614 11876
1048 10613 14312
5129 18541 19036
8603 11165 20068
938 1263 17272
7272 14649 15341
3111 14296 18913
8459 11613 17541

TABLE 33-continued

Address of Parity Bit Accumulators (Rate ⅔ - Coded Block Size 64800)

10334 10899 12365
396 4594 7000
7656 9120 10070
12079 13628 15008
16480 18347 19548
2082 20174 20525
3912 4927 12697
13030 13930 20406
5566 19268 20942
6576 11255 13410
152 17852 20802
1562 15044 17236
216 7491 13354
3128 6493 7054
1448 9525 17085
14307 15029 21560
5360 13103 21047
9305 9901 10103
3306 5451 7165
709 12054 16399
3800 4646 12177
2824 3523 15961
900 16239 19378
6314 11295 19778
10055 10113 12317
4530 19691 20332
10923 12532 18027
644 7838 9011
5932 8840 20595
7870 8667 18005

TABLE 34

Address of Parity Bit Accumulators (Rate ⅗ - Coded Block Size 64800)

11321 12093 14740 17157 17595 20195 23259 24646
11 2432 8805 10373 12516 15842 19698 24066
135 2803 4080 10491 16241 16758 17748 19867
2099 2993 10236 13026 13786 14200 17299 19957
75 2778 6647 8553 10132 13861 23999 24170
1658 3252 4357 6701 7187 13646 19015 25712
2001 4424 10467 11353 12918 16937 21896 22829
6358 7559 10402 14888 15995 17271 20484 22169
2000 4467 7863 9989 14311 16241 23410 24873
1361 3974 5222 10532 10984 17694 20378 25468
1544 7077 10921 12059 19923 22020 24017 24988
3513 14006 14377 16519 21006 21755 23229 25366
15 1247 7113 8215 13179 21142 23839 25245
5640 6141 7024 7418 10598 11979 12587 14298
1945 6827 9994 11500 11888 17446 21492 25439
7773 9202 9531 11080 15728 16419 18092 23716
407 18370 18793 20991 21559 22401 23755 24267
902 3720 4773 6030 11856 15252 19226 20853
1761 4079 12622 13351 16895 19802 23716 25765
1097 3637 6487 11788 12644 13436 17822 25663
1140 2231 3054 5975 11667 12902 13310 23022
4542 4795 15063 17421 17990 18608 21208 25716
5957 8403 11533 16178 16590 19337 21936 22010
939 5012 8468 11512 13595 18980 23151 25171
5857 8639 12470 18486 18782 19268 20531 25158
2945 5413 7244 12571 18305 18658 22658 23030
8975 9144 9984 13118 15061 19436 20308 22959
1462 7201 7652 9076 16674 18216 24160 24593
2183 2870 8206 9391 15293 22608 23163 24181
2498 4728 5065 8998 10844 15172 19603 21473
5105 8919 9457 15378 16040 17164 19450 22550
2858 3726 4027 8058 9458 13970 15544 22251
541 924 5642 6425 7937 14699 15484 21840
378 3495 7676 9280 14688 20727 21482 24745
9837 14747 14931 15632 18040 19755 20574 24585
588 857 3129 3258 3613 5087 5545 6154
8203 12127 12848
14077 15922 24447
2906 21236 22074
2092 4829 17082

TABLE 34-continued

Address of Parity Bit Accumulators (Rate ⅗ - Coded Block Size 64800)

4295 5675 18564
1681 15114 24211
341 12877 20467
323 17818 18380
9271 14655 22658
1471 13161 13320
289 8845 25307
533 15353 21423
3142 11533 20028
1933 3693 4375
7338 19500 21282
10422 11066 24968
1343 7027 18665
1356 7515 14602
6284 17691 20657
3297 10391 24693
11426 20934 23813
19342 19725 21530
10923 16535 23406
4889 24913 25283
5050 10818 12236
7074 19102 21017
5886 16748 25712
5584 6358 22353
10354 13346 15312
3375 9935 25495
4997 11522 15270
4468 18734 25869
9392 17056 22069
2236 7876 22925
4640 6011 8753
10020 21852 25599
7363 8030 24591
6288 6865 20673
4130 5835 19386
3051 10706 20518
3768 6484 23644
15847 18340 20440
2115 14190 18267
14639 16843 19917
10055 23506 24520
6818 12446 15040
1243 5642 22144
3829 13321 13867
10510 19526 22746
628 15857 16637
18343 20836 23351
849 3411 22968
9062 17694 18998
6660 8542 13719
2757 8726 11729
8089 10673 20091
1691 8446 21849
9096 14789 21754
14137 18816 22399
893 2430 24423
4109 13856 17456
8280 12805 24063
488 12106 12282
2457 9509 15757
9411 11511 16932
11352 16346 23973
5377 16529 24978
782 5090 7808
13317 15836 23080
7847 12471 15669
2543 13225 17284
2661 17549 23285

TABLE 35

Address of Parity Bit Accumulators (Rate ½ - Coded Block Size 64800)

3111 10821 12690 21446 21936 22833 27169 29136 31422
3864 7321 13358 14931 17859 19350 22505 22724 29342

TABLE 35-continued

Address of Parity Bit Accumulators (Rate ½ - Coded Block Size 64800)

1776 4735 5405 6757 10722 14671 22344 26656 29357
459 5147 14564 15500 22996 23742 25375 27615 30450
39 2020 2938 7612 12329 15698 15902 25163 31344
6647 8249 14871 15478 22091 23395 24971 28606 31269
2922 10356 13860 14238 22025 23586 26446 27232 31239
5436 6084 8594 10547 12720 14591 16454 26434 32185
2710 7917 10870 11726 12755 14599 24958 27996 28218
486 4934 5284 12406 14723 17460 23403 29725 30963
347 1169 3982 8271 8662 15028 18174 25459 31413
876 1312 2565 7422 10788 11931 16541 18283 23574
90 7129 8288 10792 12326 19925 20242 23116 30201
6470 13138 14268 17835 20001 20315 22200 25985 27855
1112 12000 12355 12793 13064 14036 28038 29518 30365
5814 8048 8312 9008 13571 16110 26199 31241 31486
3042 4178 5196 10280 14074 19558 24789 29667 31873
1454 5389 7107 7543 7862 16024 16626 17490 28242
2044 5054 10355 10824 11440 12775 15710 16297 27461
6029 9526 11735 22611 24555 26819 28137 28825 31324
1021 5580 6702 7823 18869 19850 21862 28725 29352
5706 6585 8712 11948 21714 26302 27152 27420 28364
2404 3906 4797 6227 8259 10754 14230 28897 30151
2240 9684 12342 15800 17252 19282 20858 23539 27301
4538 5033 5728 13970 16527 17614 19575 29978 32092
2354 7290 9783 13771 15981 22928 28083 30097 32322
135 2737 7742 9051 9599 16013 18075 24173 31256
1056 9731 11337 15201 21705 22111 22331 25134 27614
3390 11099 13353 18555 20915 23865 25697 29332 30761
3330 4535 16747 16939 18532 18954 20854 21064 21406
11022 12187 15275
3883 8843 22303
17714 21104 27550
3562 13705 20167
329 3338 16387
11592 18421 30914
6566 17134 26143
24607 26923 29562
4806 8465 15423
1088 30544 31855
1832 3806 27250
7337 20964 21323
18580 22620 29095
13386 21101 32396
13262 25229 30015
10150 12199 25755
3556 18602 30378
3905 8082 24259
17251 18773 24705
6133 8450 17854
1074 9896 26078
11372 23996 25612
9603 28654 29625
4304 16791 20819
3161 8835 24541
15186 16924 27847
8957 9805 26249
13286 20209 30933
10413 18729 29543
5912 28899 30687
2479 17644 20863
1901 6239 9157
1524 19166 25761
6363 15526 19685
14219 15047 20662
15079 17594 19410
25330 27868 32037
793 7156 19618
20323 21339 23201
2358 5863 9534
4079 9184 22987
4490 16838 24186
11175 11670 28552
4137 18732 25266
11812 19809 23870
1430 9775 26754
11447 18070 21285
1686 4676 23221
9096 25011 28651
619 23154 26495

TABLE 35-continued

Address of Parity Bit Accumulators (Rate ½ - Coded Block Size 64800)

1731 30544 30849
24449 26990 32018
2085 2668 19271
612 4434 19612
13258 13475 25651
2546 16649 23874
18224 23943 26533
454 24290 32166
7013 21848 31936
7119 17485 20152

TABLE 36

Address of Parity Bit Accumulators (Rate ⅔ - Coded Block Size 64800)

3297 6933 9162 10693 13628 16986 21668 24076 27719 34685 36422
37739 4652 4971 7019 11188 11972 14893 22173 25272 30894 31959
32110 32910 33 2031 3088 5881 6560 7368 12348 15738 19440 25780
29541 36439 4838 5721 20883 21606 22567 22986 24682 25476 28059
28329 32101 34721 3910 5188 6809 7103 8947 15790 17739 20635
23085 25564 29622 33785 754 7097 11883 13104 26248 29038 30443
32405 34759 35136 37093 37672 1707 16575 18649 19982 22302 22594
24413 24650 24863 27001 30158 35491 11590 14788 17345 18420 25603
26066 27769 29284 32938 34185 37362 38026 1191 5551 6047 6440
7220 19670 23562 24767 28850 29605 34642 36747 73 3562 4812 5485
10606 17058 18823 19886 23862 33399 35836 38303 148 1992 5102
10987 15393 18180 20481 20736 26419 28466 31129 33882 1557 3055
3864 9232 16927 17532 20398 21135 23488 28675 37064 37164 2299
3015 7708 8554 10042 13328 18143 18530 19261 27909 34018 37935
847 3011 10137 10590 16671 18094 22798 23767 26705 28042 30499
37945 7459 10256 13212 15953 18091 18994 19811 21830 24229 27062
30608 31698 4291 7727 9723 11579 14429 17901 19968 21353 21669
24945 26048 37260 8562 10389 14937 18581 19549 25603 26485 27174
27436 31927 35525 35984 313 8332 10393 15540 17894 19646 23002
27585 29791 31986 34296 36379 1702 2421 2618 12062 16028 16335
16941 17977 29478 30317 31110 34407 2160 5891 12839 14343 19004
19409 21422 25504 26798 29009 31299 36959 4274 6690 11683 12511
16512 19286 21483 23227 23800 30618 34963 38195 4201 8747 9890
23136 23655 25057 28985 31586 33091 35202 35524 35802 672 8275
9499 11040 12791 13807 28193 30610 33814 35232 36151 38784 474
1284 2527 4342 6449 8196 9405 11420 13704 14180 14622 15412
2624 29511 30469
6464 9577 23494
5287 12022 37078
2430 27323 29341
11446 16533 21979
1515 4931 15026
14283 28529 37489
6187 8185 38253
3590 12342 38608
4265 24259 25368
4430 9081 33466
3617 35591 35696
6589 14391 19353
442 5510 29991
4540 9738 10838
3668 24706 26339
1068 34334 38759
9514 13852 14717
8103 28428 38419
32505 37656 38114
1273 15352 21066
731 16322 36602
1316 8670 31632
1883 13552 17631
21987 24366 34050
1975 7839 12747
5878 33159 36329
8921 14451 22488
15497 25044 36004
22413 28126 32363
7540 12285 14033
13658 16177 31025
33068 33557 38569
7758 10893 21031

TABLE 36-continued

Address of Parity Bit Accumulators (Rate 2/3 - Coded Block Size 64800)

11470 22993 34436
10747 13227 28666
11552 20439 30092
2727 9297 26837
399 26517 33759
3340 20692 36108
15419 20712 27403
13303 16716 23361
26065 32482 33457
8336 19015 20421
15940 17475 32359
12953 21349 30059
5348 16562 31348
26830 31400 32657

TABLE 37

Address of Parity Bit Accumulators (Rate 1/3 - Coded Block Size 64800)

2157 7955 9237 12284 15020 21866 26422 34666 37352 37649 40586
41640 2448 14737 15550 16081 17094 17625 20941 25888 28556 30985
37172 37835 15 8525 11078 14053 16293 19293 24791 26407 27582
39222 40665 42625 1375 3933 17007 22218 26176 29045 33156 34027
35634 36351 37899 38537 3834 4701 5234 11773 12241 15776 22750
25325 31725 34901 37942 39619 131 7591 10089 17781 28087 28457
29129 34492 34839 37106 38744 40179 436 13828 15551 17812 18220
19395 21501 21626 27152 27767 38852 40888 540 11011 11679 20209
21034 22605 25164 27269 29337 30522 31373 36883 2543 3173 7364
8241 9312 9758 17052 17964 30221 31992 34465 38515 5215 5805
11147 12748 21633 22899 23290 23728 24307 33389 36827 40040
6286 10490 11914 13545 20483 26178 27262 30138 32686 33700 39563
42394 467 1041 2435 11535 12476 13551 18023 18376 23405 30912
35507 42404 2199 3140 7331 8280 10562 12024 25005 25275 29030
30212 36319 38314 2154 6304 7076 8838 9473 20932 23170 26489
28564 32024 42165 42929 1799 3518 5196 8564 9091 11222 12922
23435 24958 26673 36880 40908 7283 8671 12840 14171 17366 20117
26736 30930 33455 40993 41143 42874 296 4975 5566 8182 8757 9456
28414 29216 34949 38307 40102 43111 6916 7794 10169 14680 15377
15966 20826 21311 22927 32352 39039 42681 976 1259 1729 2864 5589
10515 13418 16261 20645 29477 31036 32960 4158 4535 6826 13129
16597 18952 19609 23900 29625 35992 36644 42109
3832 31315 35811
14289 33747 34952
3565 5878 27411
1024 26178 41783
18863 27617 35897
18834 30626 36715
10201 34187 41196
7800 19919 34976
3510 26951 32912
24819 25731 29630
2703 25366 32046
23853 25668 32622
4294 16030 37743
9417 12037 18132
6190 16478 29644
11516 23198 36470
1792 13080 20405
5570 22207 23944
7082 19308 32227
14027 15050 32862
9767 15020 34431
3168 24560 37568
4416 19904 21514
4088 22431 28406
16894 28072 38951
4452 30580 41428
4884 16851 33758
6736 32730 39284
6101 39673 41788
13079 39346 41111
11346 15217 33923
20796 22368 36184
14741 30445 40480
13894 17431 27939

TABLE 37-continued

Address of Parity Bit Accumulators (Rate 1/3 - Coded Block Size 64800)

35318 39772 41661
18691 19729 24200
15454 31656 42660
1386 6793 24331
9893 22002 31360
2069 18590 19794

TABLE 38

Address of Parity Bit Accumulators (Rate 1/4 - Coded Block Size 64800)

407 1429 6319 18004 18662 20568 23535 24031 28882 36124 38892
41880 4223 5536 10333 16475 20735 20954 25347 26862 32235
36257 42827 48304 8161 11446 13040 13661 19722 24632 27008 29029
32746 40449 42030 45883 9899 12505 13916 18635 22605 25914 32903
39146 39661 40372 44350 45823 8074 11266 13787 15452 21319 25518
25892 26799 40269 41320 41665 48438 1489 8464 9203 15278 16613
18235 26387 29744 31948 32293 35378 46447 122 1365 4344 7853 8453
24475 25034 28298 28718 35347 36473 40014 2485 4555 12437 18736
20994 23449 30387 33800 35867 36980 43101 46693 1654 3284 5191
11122 13092 16366 22522 22933 28511 29977 37120 38428 2362 6555
10708 12679 14474 20301 22230 29510 38500 39610 43175 48173 3678
5189 17724 19148 26279 27265 30034 33819 37195 42327 46261 47137
572 4115 7440 9690 11879 14861 15577 22163 32927 43761 46260
46925 3504 9628 10218 10694 11795 20016 23062 24390 31075 31419
33120 43388 1065 1994 2867 3148 5022 6019 7191 8667 12009 14190
16097 17095 17594 21917 27700 27977 30813 33953 34373 34911 35152
37725 38153 38708
7292 31185 42413
2710 25038 27784
35910 36713 48159
24092 36740 38594
6108 10842 34900
14373 16000 24603
1065 17856 27441
3072 33982 43211
210 14879 19713
6222 16708 31602
15679 22926 29610
18859 32651 37802
2010 5677 21606
19985 35082 47221
6656 37684 44496
12919 14510 42727
13439 21553 47800
9340 40814 43721
6892 8839 31686
11896 34323 47500
26624 33369 44968
20262 26137 43948
3892 9900 29429
4740 39439 45622
39274 41553 47703
30819 41225 44970
7879 28439 45392
17023 17635 44279
30598 40951 45118
19335 23107 45091

In this exemplary embodiment, the outer BCH code can be a 12 bit error correcting, with $n_{bch} = k_{bch} + 192$. It is noted that $n_{bch} = k_{ldpc}$.

The generator polynomial of the t error correcting BCH encoder 209 is obtained by multiplying the first t polynomials in the following list of Table 39:

TABLE 39

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |

TABLE 39-continued

| | |
|---|---|
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}$ |

BCH encoding of information bits $m=(m_{k_{bch}}-1, m_{k_{bch}}-2, \ldots, m_1, m_0)$ onto a codeword $c=(m_{k_{bch}}-1, m_{k_{bch}}-2, \ldots, m_1, m_0, d_{n_{bch}-k_{bch}}-1, d_{n_{bch}-k_{bch}}-2, \ldots, d_1, d_0)$ is achieved as follows. The message polynomial $m(x)=m_{k_{bch}-1}x^{k_{bch}-2}+m_{k_{bch}-2}x^{k_{bch}-2}+\ldots+m_1 x+m_0$ is multiplied by $x^{n_{bch}-k_{bch}}$. Next, $x^{n_{bch}-k_{bch}}m(x)$ is divided by $g(x)$. With $d(x)=d_{n_{bch}-k_{bch}-1}x^{n_{bch}-k_{bch}-1}+\ldots+d_1 x+d_0$ as the remainder, the codeword polynomial is set as follows: $c(x)=x^{n_{bch}-k_{bch}}m(x)+d(x)$.

Continuing with this exemplary embodiment, the output of the LDPC encoder 203 can be bit interleaved using the interleaver 211. According to certain embodiments, the interleaving process can be performed for 8-PSK and/or 16-APSP modulations. Data can be serially written into the interleaver 211 column-wise (from the top to the bottom), and can be serially read out row-wise (from the left to the right except for the rate 3/5 8-PSK case where data is read out from the right to the left). The configuration of the interleaver 211 for each modulation format can be viewed in Table 40.

TABLE 40

Bit Interleaver Structure

| Modulation | Rows (for $n_{ldpc}$ = 64800) | Rows (for $n_{ldpc}$ = 16200) | Columns |
|---|---|---|---|
| 8-PSK | 21600 | 5400 | 3 |
| 16-APSK | 16200 | 4050 | 4 |

FIG. 2D is a flowchart of the LDPC encoding process as discussed above, according to an exemplary embodiment. At step 231 the information bits are received and LDPC codes are generated at step 233. It is noted that the structure of the LDPC codes (stemming from the design of the parity check matrix) permits an efficient decoding process, whereby parallel computation engines can be utilized. According to certain embodiment, the LDPC code can be generated with out BCH codes and codes also can contain a CRC code. At step 235, the coded bits are altered by the interleaver 211, as described above. Next the codes are modulated per step 237 and are transmitted on the communication channel.

The above LDPC codes, in an exemplary embodiment, can be used to variety of digital video applications, such as MPEG (Motion Pictures Expert Group) packet transmission.

Figure 3:
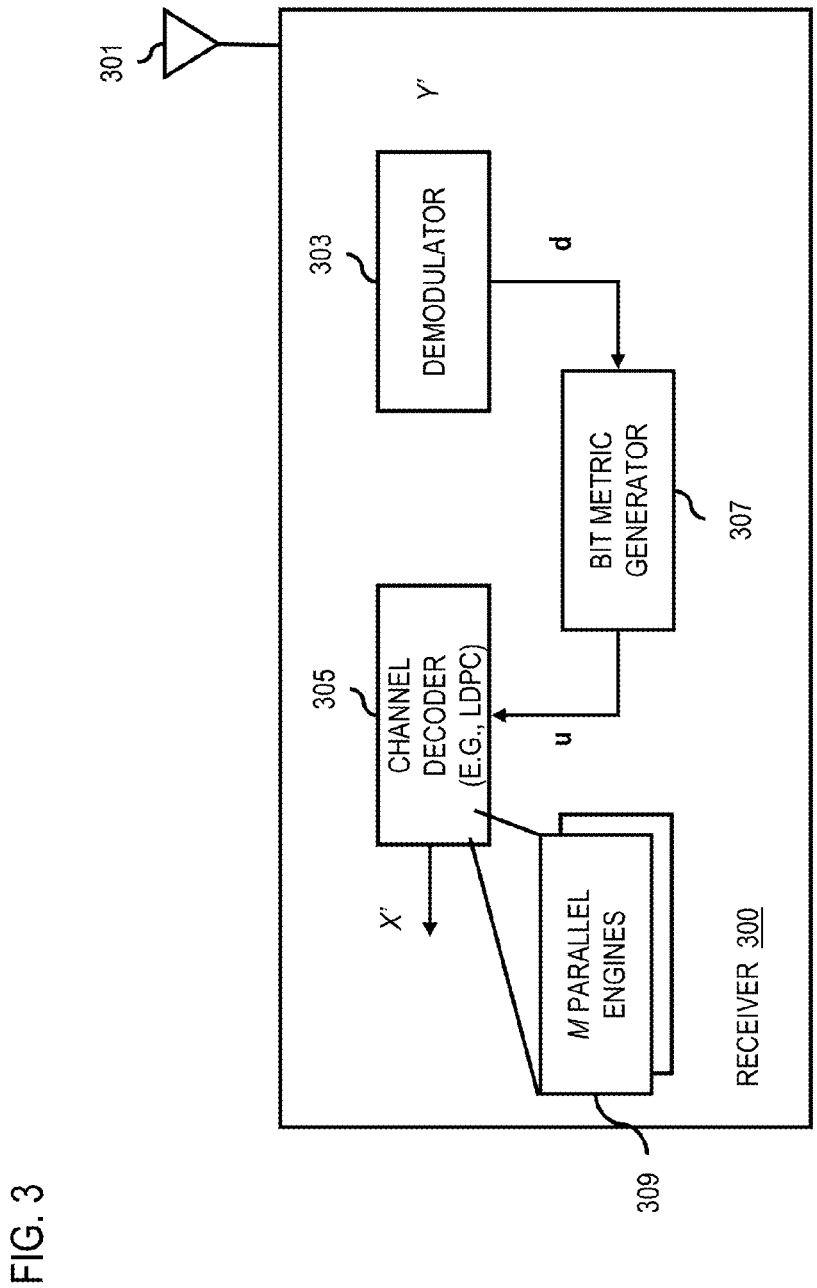
FIG. 3 is a diagram of an exemplary receiver in the system of FIG. 1, according to an exemplary embodiment.

FIG. 3 is a diagram of a receiver configured to operate in the system of FIG. 1, according to an exemplary embodiment. At the receiving side, a receiver 300 includes an antenna 301 that receives the waveforms emitted over the channel 103. The receiver provides a demodulator 303 that performs demodulation of the received signals from, for instance, transmitter 200. After demodulation, the received signals are forwarded to a decoder 305, which attempts to reconstruct the original source messages by generating messages, X', in conjunction with a bit metric generator 307. According to certain embodiments, the decoder 305 can employ M parallel engines 309 to efficiently decode the received signals. By way of example, M may correspond to the groupings of M bit nodes for processing; this parallel approach is more fully described later. In one exemplary embodiment, the demodulator 303 in accordance with the bit metric generator 307 can provide a priori probabilities of log likelihood ratios of coded bits.

It is contemplated that the above transmitter 200 and receiver 300 can be deployed within a single wireless terminal, in which case a common antenna system can be shared. The wireless terminal can for example be configured to operate within a satellite communication, a cellular system, wireless local area network (WLAN), etc.

Figures 4, 5, 6:
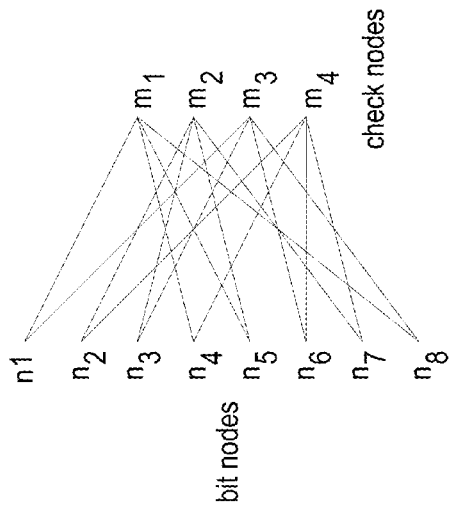
FIG. 4 is a diagram of a sparse parity check matrix, according to an exemplary embodiment.
FIG. 5 is a diagram of a bipartite graph of an LDPC code of the matrix of FIG. 4, according to an exemplary embodiment.
FIG. 6 is a diagram of a sub-matrix of a sparse parity check matrix, wherein the sub-matrix contains parity check values restricted to the lower triangular region, according to an exemplary embodiment.

To appreciate the advantages offered by the present embodiments, it is instructive to examine how LDPC codes are generated, as discussed in FIG. 4.

FIG. 4 is a diagram of a sparse parity check matrix, in accordance with an exemplary embodiment. LDPC codes are long, linear block codes with sparse parity check matrix $H_{(n-k) \times n}$. Typically the block length, n, ranges from thousands to tens of thousands of bits. For example, a parity check matrix for an LDPC code of length n=8 and rate 1/2 is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning to the receiver 300, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an exemplary embodiment. As described previously, the encoder 203 (of FIG. 2) can employ a simple encoding technique by restricting the values of the lower triangular area of the parity check matrix. According to an exemplary embodiment, the restriction imposed on the parity check matrix is of the form:

$$H_{(n-k)\times n} = [A_{(n-k)\times k} B_{(n-k)\times(n-k)}],$$

where B is lower triangular.

Any information block $i=(i_0, i_1, \ldots, i_{k-1})$ can be encoded to a codeword $c=(i_0, i_1, i_{k-1}, p_0, p_1, \ldots, p_{n-k-1})$ using $Hc^T=0$, and recursively solving for parity bits; for example, $$a_{00}i_0 + a_{01}i_1 + \ldots + a_{0,k-1}i_{k-1} + p_0 \Rightarrow \text{Solve } p_0$$

$$a_{10}i_0 + a_{11}i_1 + \ldots + a_{1,k-1}i_{k-1} + b_{10}p_0 + p_1 = 0 \Rightarrow \text{Solve } p_1$$

and similarly for $p_2, p_3, \ldots, p_{n-k-1}$.

Figure 7B:
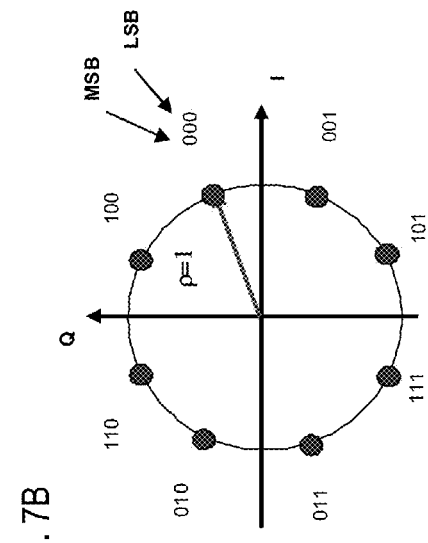
FIGS. 7A-7C are, respectively, a diagram of a quadrature phase-shift keying (QPSK), an 8-PSK, and a 16 amplitude and phase-shift keying (16-APSK) modulation scheme, respectively, each of which can be used in the system of FIG. 1, according to an exemplary embodiment.
Figure 7A:
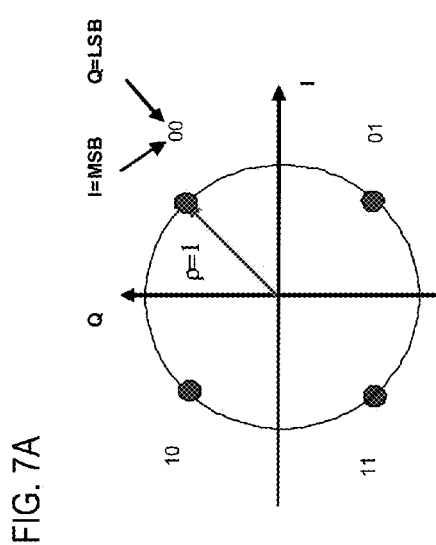
Figure 7C:
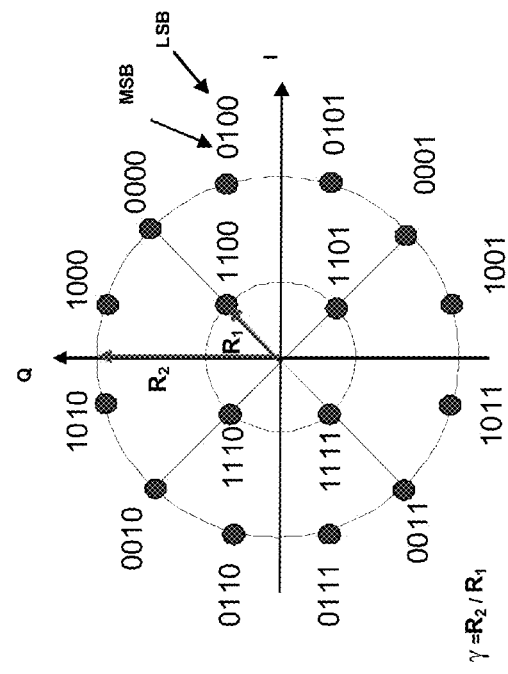

FIGS. 7A-7C illustrate, respectively, diagrams of QPSK, 8-PSK, and 16-APSK modulation schemes, which can be used in the system of FIG. 1, according to various exemplary embodiments. In one exemplary embodiment, where code rates 1/2, 2/3, and 4/5 for coded block sizes 720, 960, 1200, 1440, 1680, 1920, 2160, 2400, 2640, 2880, 3120, 3360, 3600, 3840, 4080, 4320, 4560, 4800, 5040, 5280, 5520, and 5760 coded bits, are used, the QPSK modulation scheme of FIG. 7A can be used. According to this exemplary embodiment, the I/Q demodulated output of demodulator 303 of receiver 305 can be first multiplied by a constant and then quantized to a nearest integer between a predetermined range, e.g., −15 and +15. In one exemplary embodiment, it can be assumed that the noise-free QPSK symbol is on the unit circle.

Further, according to certain embodiments, the QPSK, 8-PSK, and 16-APSK modulation schemes of FIGS. 7A-7C can be used for LDPC codes with code rates 1/4, 1/3, 2/5, 1/2, 3/5, 2/3, 3/4, 4/5, 5/6, 8/9, and 9/10 with coded block size 64800. In one exemplary embodiment, for QPSK bits 2i and 2i+1 determine the $i^{th}$ QPSK symbol, where i=0, 1, 2 . . . , (N/2)−1 and N is the coded LDPC block size. Alternatively or additionally, for 8-PSK, bits 3i, 3i+1, and 3i+2 of the output of the interleaver 211 of FIG. 2B determine the $i^{th}$ 8-PSK symbol where i=0, 1, 2, . . . , (N/3)−1 and N is the coded LDPC block size (except rate 3/5). For rate 3/5, bits 3i+2, 3i+1, 3i of the output of the interleaver 211 of FIG. 2B determine the $i^{th}$ 8-PSK symbol. Also, for 16-APSK, bits 4i, 4i+1, 4i+2, and 4i+3 of the interleaver output determine the $i^{th}$ 16-APSK symbol, where i=0, 1, 2, . . . , (N/4)−1 and N is the coded LDPC block size.

According to certain embodiments, different decoding processes can be used. In one exemplary embodiment, a decoding process in accordance with Gray mapping can be used. In this example, outgoing messages from bit nodes are initialized, check nodes are updated, bit nodes are updated, a posteriori probability information is outputted, a determination is made whether all parity check equations are satisfied, and a hard decision is outputted. Otherwise, check node update, bit node update, and outputting a posteriori probability information is repeated. Alternatively, a decoding process in accordance with non-Gray mapping can used such that probability information can be exchanged back and forth (iteratively) between the decoder 305 and bit metric generator 307 (of FIG. 3) during the decoding process. In this example, after initialization and check node update a posteriori probability information is output and if all parity check equations are satisfied, hard decision is output. Otherwise, bit metrics and channel input are re-derived, bit node is updated, and the decoding process repeats with updating the check nodes.

Figure 8B:
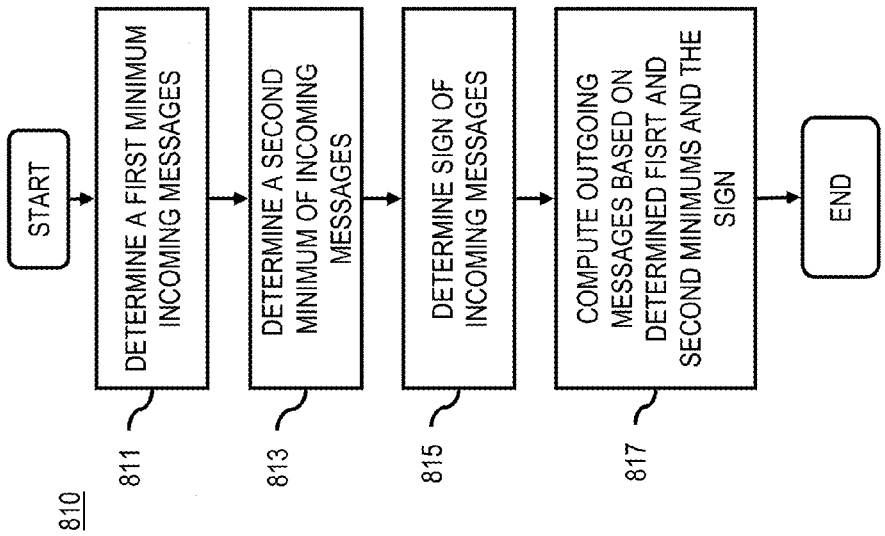
FIGS. 8A and 8B are flowcharts of processes for computing outgoing messages between the check nodes and the bit nodes using, respectively, a forward-backward approach and an enhanced layered belief decoding (LBD) scheme, according to various exemplary embodiments.
Figure 8A:
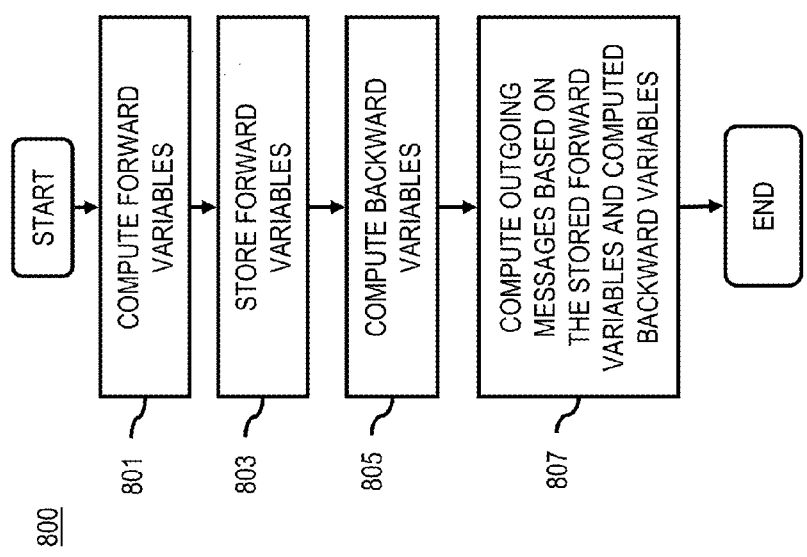
Figure 9A:
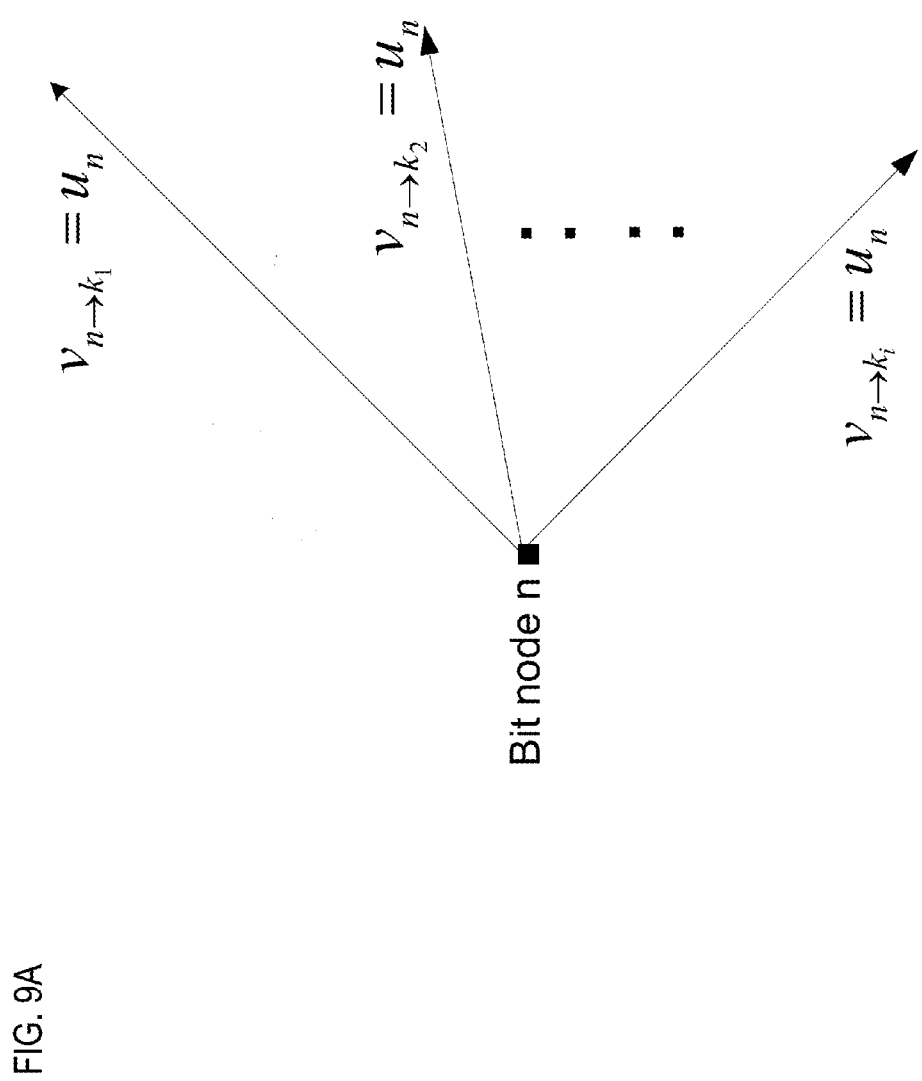
FIGS. 9A-9C are diagrams of the interactions between the check nodes and the bit nodes in a decoding process, according to an exemplary embodiment.

FIG. 8A is a flowchart of a process for computing outgoing messages between the check nodes and the bit nodes using a forward-backward approach, according to an exemplary embodiment. The process 800 of FIG. 8A is explained with reference to diagrams of FIGS. 9A-9C. After an initialization process (that, for example, can be performed in accordance with FIG. 9A), check nodes can be updated based on incoming messages (that, for example, can be performed in accordance with FIG. 9B). For a check node with $d_c$ adjacent edges, the computation of $d_c(d_c-1)$ and numerous g(.,.) functions are performed. However, the forward-backward approach can reduce the complexity of the computation to almost $3d_c$ (for example, $3(d_c-2)$), in which $d_c-1$ variables are stored.

Figure 9B:
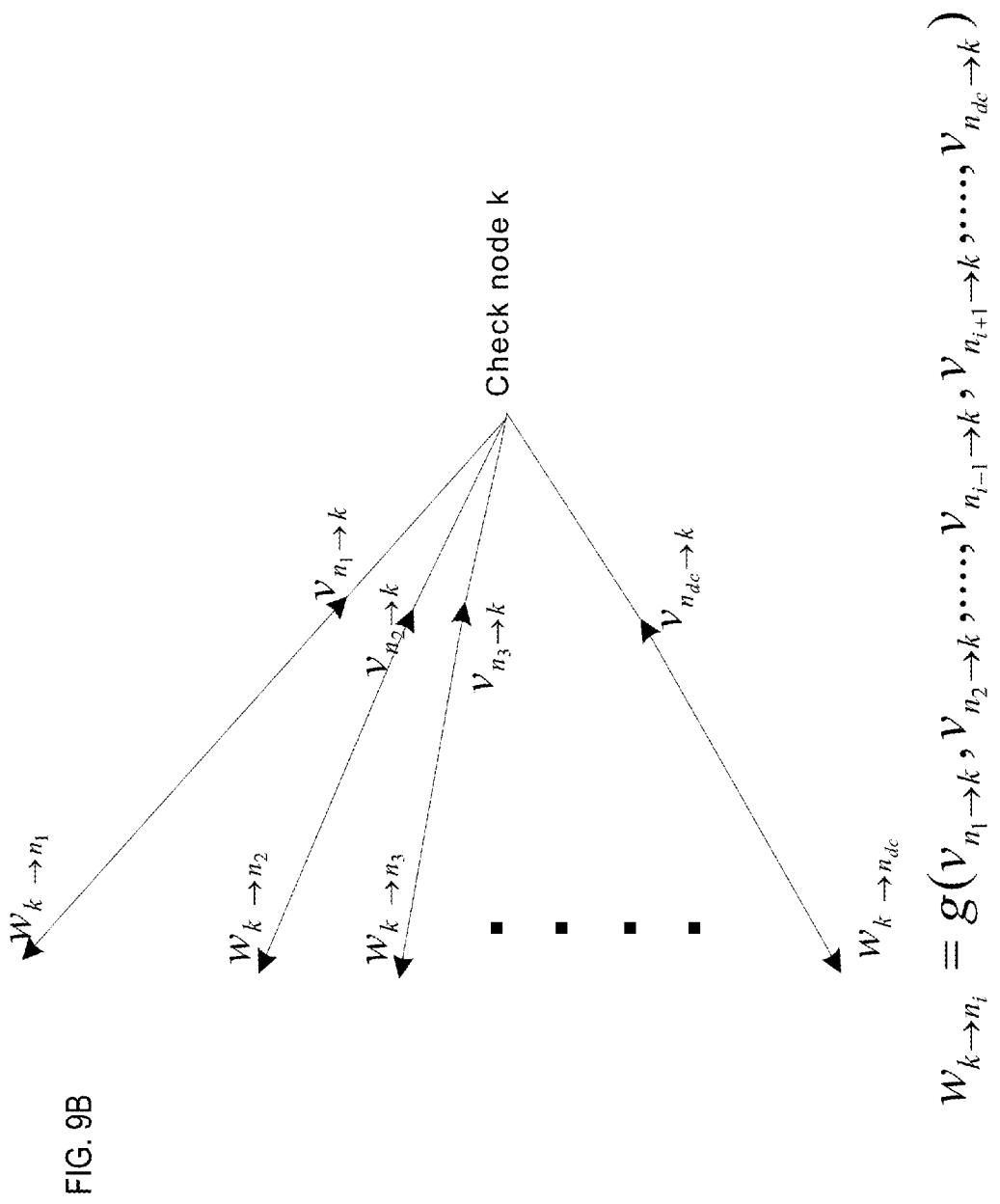
Figure 9C:
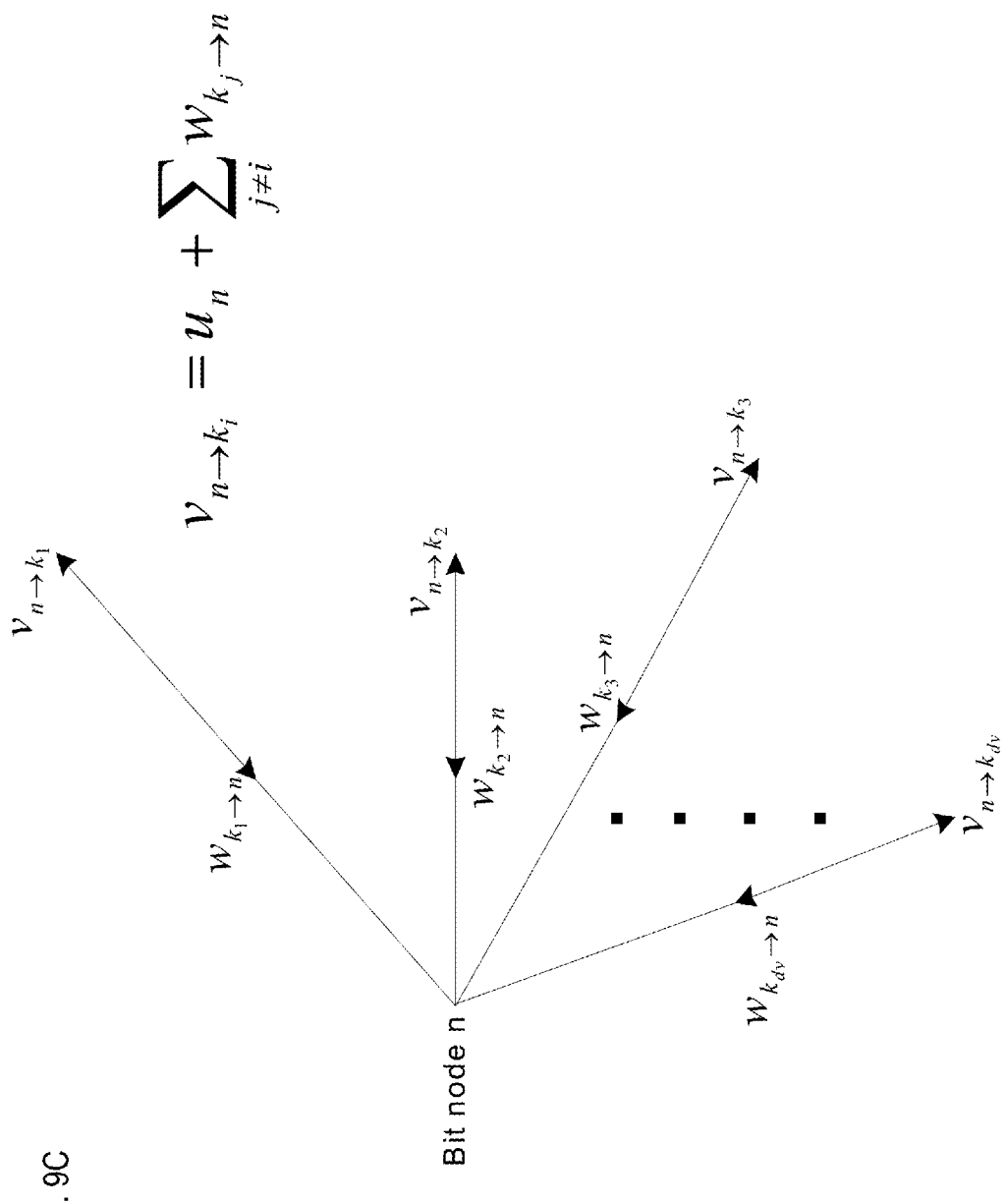

Referring to FIG. 9B, the incoming messages to the check node k from $d_c$ adjacent bit nodes are denoted by $v_{n_1 \to k}, v_{n_2 \to k}, \ldots, v_{n_{d_c} \to k}$. It is desired that the outgoing messages are computed from the check node k back to $d_c$ adjacent bit nodes; these outgoing messages are denoted by $w_{k \to n_1}, w_{k \to n_2}, \ldots, w_{k \to n_{d_c}}$.

Under the forward-backward approach, to compute these outgoing messages, forward variables, $f_1, f_2, \ldots, f_{dc}$, are defined as follows:

$$f_1 = v_{1 \to k}$$
$$f_2 = g(f_1, v_{2 \to k})$$
$$f_3 = g(f_2, v_{3 \to k})$$
$$\vdots$$
$$f_{dc} = g(f_{dc-1}, v_{dc \to k})$$

At step 801, these forward variables are computed (which can be performed in almost $d_c$ clock cycle), and stored, per step 803.

Similarly, backward variables, $b_1, b_2, \ldots, b_{dc}$, are defined by the following:

$$b_{dc} = v_{dc \to k}$$
$$b_{dc-1} = g(b_{dc}, v_{dc-1 \to k})$$
$$\vdots$$
$$b_1 = g(b_2, v_{1 \to k})$$

At step 805, these backward variables are then computed (which can be performed in almost $d_c$ clock cycles). Thereafter, the outgoing messages are computed, as in step 807, based on the stored forward variables and the computed backward variables. The outgoing messages are computed as follows (which can be performed in almost $d_c$ clock cycle):

$$w_{k \to 1} = b_2$$
$$w_{k \to i} = g(f_{i-1}, b_{i+1}) \; i=2, 3, \ldots, d_c-1$$
$$w_{k \to dc} = f_{dc-1}$$

Under this approach, only the forward variables, $f_2, f_3, \ldots, f_{dc}$, are required to be stored. As the backward variables $b_i$ are computed, the outgoing messages, $w_{k \to i}$, are simultaneously computed, thereby negating the need for storage of the backward variables.

The computation load can be further enhanced by using an enhanced layered belief decoding (LBD) approach, as discussed next. In one exemplary embodiment, use of the LBD approach can enhance the decoding technique by improving convergence of about half the standard belief decoding (SBD) iterations, therefore, increasing the speed of decoding by almost 2. Further, improvements discussed below with respect to FIG. 8B can further increase the speed of LBD approach by another factor of almost 2.5 by simplifying the g(.,.) function.

FIG. 8B is a flowchart of process for computing outgoing messages between the check nodes and the bit nodes using an enhanced layered belief decoding (LBD) approach, according to an exemplary embodiment. In the exemplary embodiment of FIG. 8B, a simplified g(.,.) function is computed which decreases the clock cycle of the forward-backward approach of FIG. 8A from almost $3d_c$ clock cycles to $d_c$ clock cycles.

Referring to FIG. 9B, the incoming messages to the check node k from $d_c$ adjacent bit nodes are denoted by $v_{n_1 \to k}$, $v_{n_2 \to k}, \ldots, v_{n_{dc} \to k}$. It is desired that the outgoing messages are computed from the check node k back to $d_c$ adjacent bit nodes; these outgoing messages are denoted by $w_{k \to n_1}$, $w_{k \to n_2}, \ldots, w_{k \to n_{dc}}$. Under the enhanced LBD approach, a first minimum of the absolute values of the incoming messages are determined, per step 811, as follows:

$$|v_{n_p \to k}| = \min\{|v_{n_1 \to k}|, |v_{n_2 \to k}|, \ldots, |v_{n_{dc} \to k}|\}$$

Further, a second minimum of the absolute values of the incoming messages are determined, per step 813, as follows:

$$x = \text{second min}\{|v_{n_1 \to k}|, |v_{n_2 \to k}|, \ldots, |v_{n_{dc} \to k}|\}$$

At step 815, a sign of the incoming messages is determined as follows:

$$s = \text{sign}(v_{n_1 \to k}) \times \text{sign}(v_{n_2 \to k}) \times \ldots \times \text{sign}(v_{n_{dc} \to k})$$

Thereafter, the outgoing messages are computed, as in step 817, based on the determined variables, according to one exemplary embodiment. The outgoing messages are computed as follows:

$$w_{k \to n_p} \cong x \times s \times \text{sign}(v_{n_p \to k})$$

$$w_{k \to n_i} \cong (|v_{n_p \to k}| - 1) \times s \times \text{sign}(v_{n_i \to k})\ i = 1, 2, \ldots, p-1, p+1, \ldots d_c$$

Alternatively, the outgoing messages can be computed, as per step 817, based on the determined variables, according to another exemplary embodiment, as follows:

$$w_{k \to n_p} \cong (x-1) \times s \times \text{sign}(v_{n_p \to k})\ \text{if}\ x \geq 1$$

$$w_{k \to n_i} \cong (|v_{n_p \to k}| - 1) \times s \times \text{sign}(v_{n_i \to k})\ i = 1, 2, \ldots, p-1, p+1, \ldots d_c\ \text{of}\ |v_{n_p \to k}| \geq 1$$

Based on the exemplary process 810 of the embodiment of FIG. 8B, the computation of the outgoing messages can be performed in $d_c$ clock cycles.

Incoming message $v_{n_i \to k}\ i=1, 2, \ldots, d_c$ can be computed based on a posteriori probabilities and outgoing message $w_{k \to n_i}\ i=1, 2, \ldots, d_c$, as follows:

$$v_{n_i \to k} = a_i - w_{k \to n_i}\ i = 1, 2, \ldots, d_c$$

Further, the a posteriori probabilities can be updated, after outgoing messages are computed, as follows:

$$a_i = v_{n_i \to k} + w_{k \to n_i}\ i = 1, 2, \ldots, d_c$$

These two processes usually can take $d_c$ clock cycles each. However, in an exemplary embodiment, two adders can be used for these processes such that each can be performed in $d_c/2$ clock cycles and therefore, decrease the total iteration time from $5d_c$ to $2d_c$ clock cycles. Hence, use of the enhanced LBD improves decoding speed of the standard LBD by a factor of 2.5.

Figure 10:
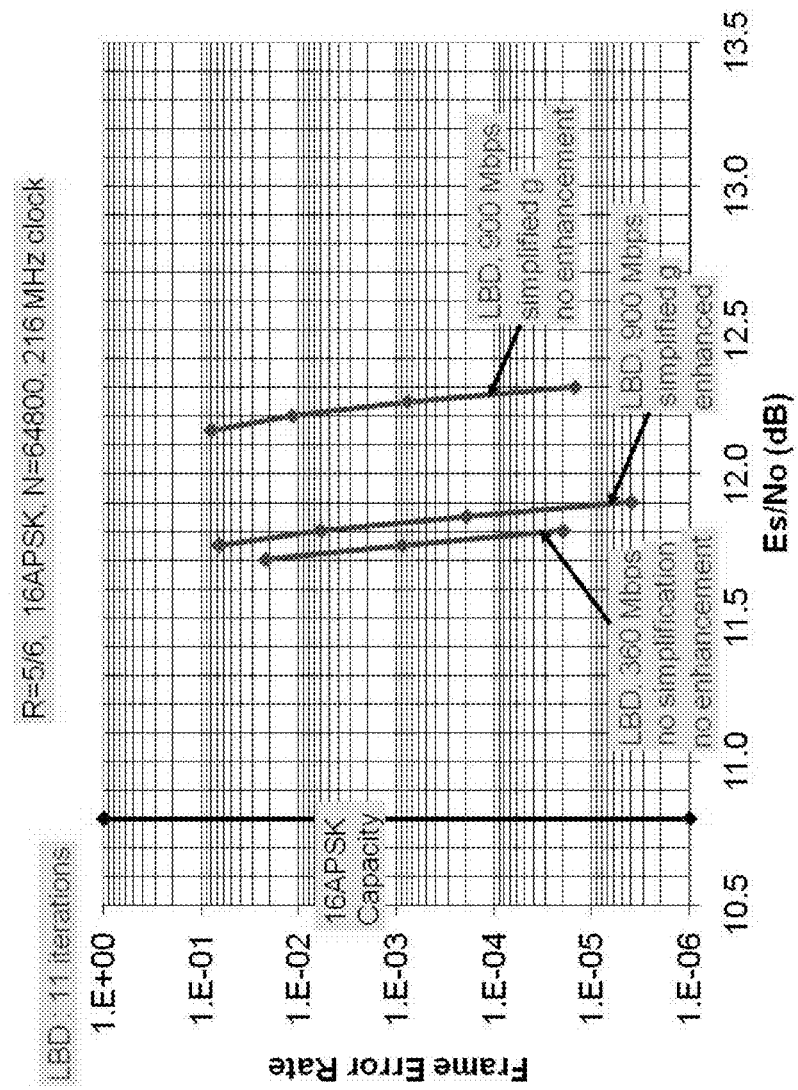
FIG. 10 is a graph illustrating simulation results for the enhanced LBD scheme, according to an exemplary embodiment.

FIG. 10 is a graph illustrating simulation results for the LBD scheme without simplified g(.,.) function, with simplified g(.,.) function with enhancement, and with g(.,.) function without enhancement, according to an exemplary embodiment. The simulations are performed for a LDPC code with code rate of 5/6, with 16-APSK, and with coded block size of 64800. It is noted that performance of the LBD scheme without simplification and the LBD scheme with simplification and with enhancements are close, although the speed of the LBD scheme with simplification and with enhancements is almost 2.5 times higher than the LBD scheme without simplification. Further, FIG. 10 illustrates that how the enhancements in the simplification of the g(.,.) function can improve the overall performance of the enhanced LBD scheme.

Figure 11:
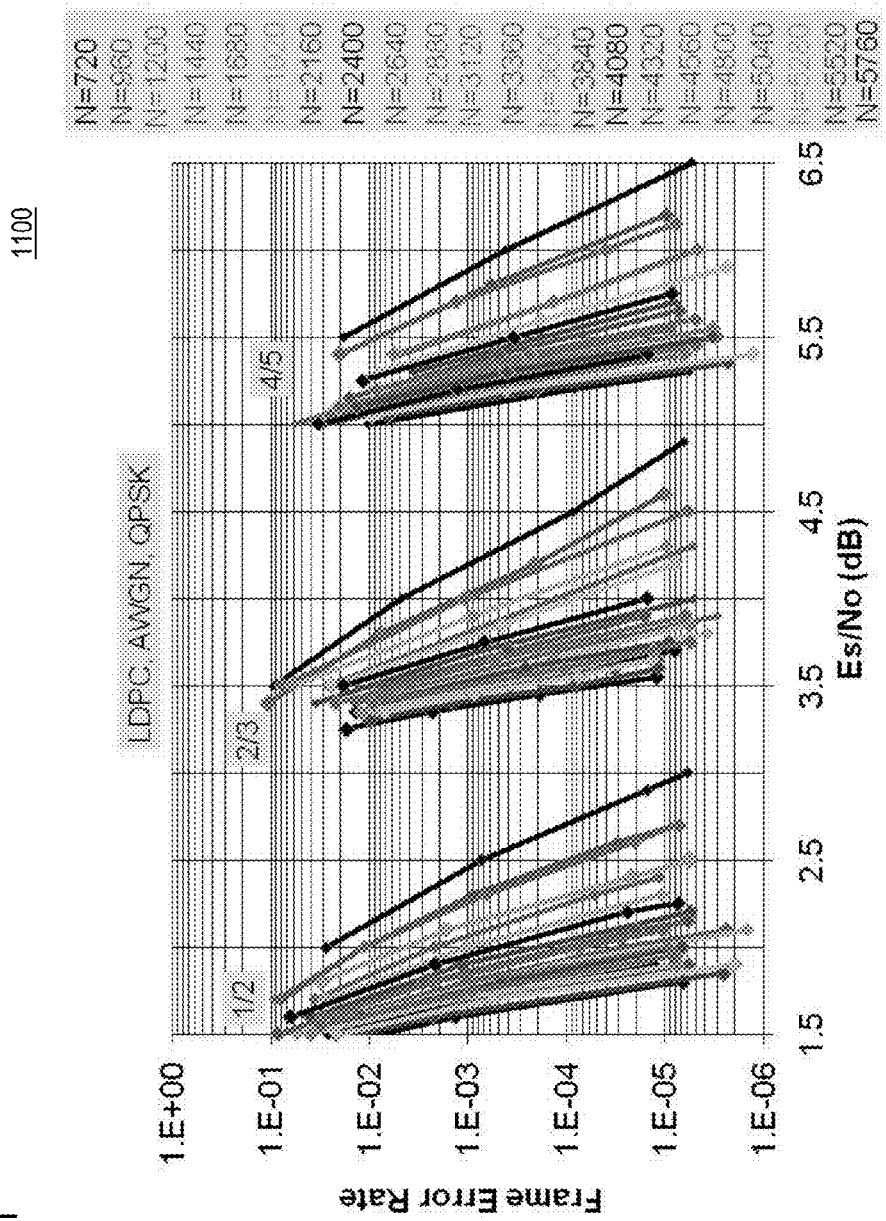
FIG. 11 is a graph showing simulation results of LDPC codes generated in accordance with various exemplary embodiments.

FIG. 11 is a graph showing simulation results of LDPC codes for code rates 1/2, 2/3, and 4/5 for coded block sizes 720, 960, 1200, 1440, 1680, 1920, 2160, 2400, 2640, 2880, 3120, 3360, 3600, 3840, 4080, 4320, 4560, 4800, 5040, 5280, 5520, and 5760 coded bits generated in accordance with various exemplary embodiments. In particular, FIG. 11 shows the performance of fixed-point LDPC codes with 50 decoder iterations.

Two general approaches exist to realize the interconnections between check nodes and bit nodes: (1) a fully parallel approach, and (2) a partially parallel approach. In fully parallel architecture, all of the nodes and their interconnections are physically implemented. The advantage of this architecture is speed.

The fully parallel architecture, however, may involve greater complexity in realizing all of the nodes and their connections. Therefore with fully parallel architecture, a smaller block size may be required to reduce the complexity. In that case, for the same clock frequency, a proportional reduction in throughput and some degradation in FER versus Es/No performance may result.

The second approach to implementing LDPC codes is to physically realize only a subset of the total number of the nodes and use only these limited number of "physical" nodes to process all of the "functional" nodes of the code. Even though the LDPC decoder operations can be made extremely simple and can be performed in parallel, the further challenge in the design is how the communication is established between "randomly" distributed bit nodes and check nodes. The decoder 305 (of FIG. 3), according to one embodiment, addresses this problem by accessing memory in a structured way, as to realize a seemingly random code. This approach is explained with respect to FIGS. 12A and 12B.

Figure 12A:
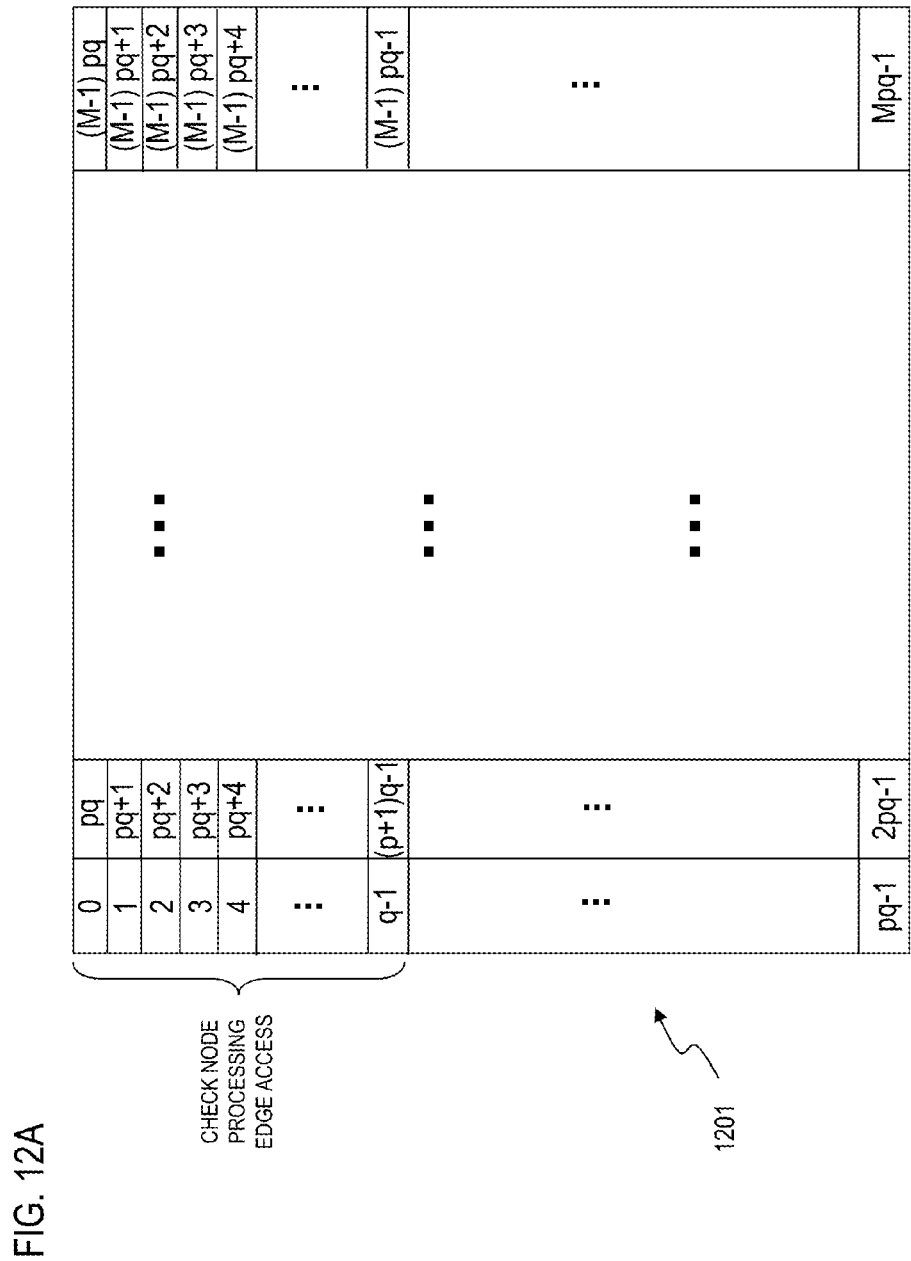
FIGS. 12A and 12B are diagrams of the top edge and bottom edge, respectively, of memory organized to support structured access as to realize randomness in LDPC coding, according to an exemplary embodiment.
Figure 12B:
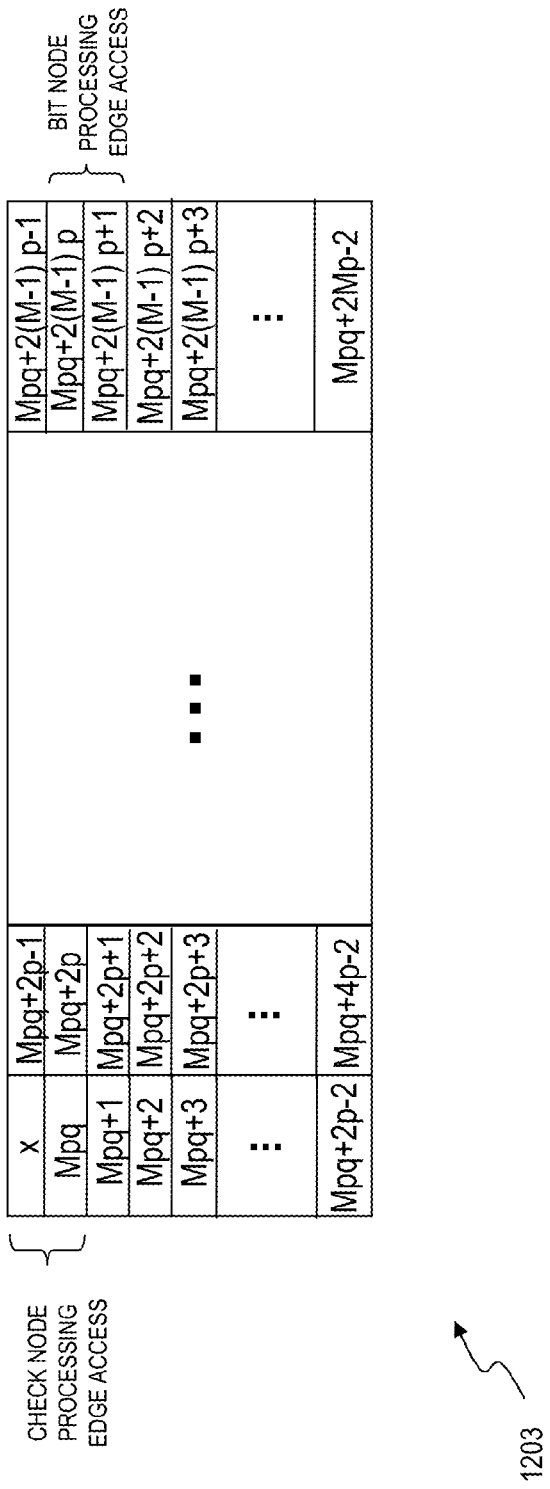

FIGS. 12A and 12B are diagrams of the top edge and bottom edge, respectively, of memory organized to support structured access as to realize randomness in LDPC coding, according to an exemplary embodiment. Structured access can be achieved without compromising the performance of a truly random code by focusing on the generation of the parity check matrix. In general, a parity check matrix can be specified by the connections of the check nodes with the bit nodes. For example, the bit nodes can be divided into groups of a fixed size, which for illustrative purposes is M. In one example, M is number of parallel computation engines. Additionally, assuming the check nodes connected to the first bit node of degree 3, for instance, are numbered as a, b and c, then the check nodes connected to the second bit node are numbered as a+p, b+p and c+p, the check nodes connected to the third bit node are numbered as a+2p, b+2p and c+2p etc.; where p=(number of check nodes)/M. For the next group of M bit nodes, the check nodes connected to the first bit node are different from a, b, c so that with a suitable choice of p, all the check nodes have the same degree. A random search can be performed over the free constants such that the resulting LDPC code is cycle-4 and cycle-6 free. According to one exemplary embodiment, because of the structural characteristics of the parity check matrix, the edge information can be stored to permit concurrent access to a group of relevant edge values during decoding.

In other words, the approach, according to certain embodiments, facilitates memory access during check node and bit node processing. The values of the edges in the bipartite graph can be stored in a storage medium, such as random access memory (RAM). It is noted that for a truly random LDPC code during check node and bit node processing, the values of the edges would need to be accessed one by one in a random fashion. However, such a conventional access scheme would be too slow for a high data rate application. The RAM of FIGS. 12A and 12B are organized in a manner, whereby a large group of relevant edges can be fetched in one clock cycle; accordingly, these values are placed "together" in memory, according to a predetermined scheme or arrangement. It is observed that, in actuality, even with a truly random code, for a group of check nodes (and respectively bit nodes), the relevant edges can be placed next to one another in RAM, but then the relevant edges adjacent to a group of bit nodes (respectively check nodes) will be randomly scattered in RAM. Therefore, the "togetherness," under the present approach, stems from the design of the parity check matrices themselves. That is, the check matrix design ensures that the relevant edges for a group of bit nodes and check nodes are simultaneously placed together in RAM.

As illustrated in FIGS. 12A and 12B, each box contains the value of an edge, which is multiple bits (e.g., 6 bits). Edge RAM, according to an exemplary embodiment, is conceptually divided into two parts, top edge RAM 1201 (FIG. 12A) and bottom edge RAM 1203 (FIG. 12B). Bottom edge RAM 1303 contains the edges between bit nodes of degree 2, for instance, (or 1 for one single bit node) and check nodes. Top edge RAM 1201 contains the edges between bit nodes of degree greater than 2 and check nodes. Therefore, according to an exemplary embodiment, for every check node, 2 adjacent edges are stored in the bottom RAM 1203, and the rest of the edges are stored in the top edge RAM 1201.

In an exemplary embodiment, a group of M bit nodes and M check nodes is processed at a time. According to another exemplary embodiment, for M check node processing, $q=d_c-2$ consecutive rows from top edge RAM 1201 and 2 consecutive rows from bottom edge RAM 1203 is accessed, which the value of $d_c$ can depend on the code rate. In this exemplary embodiment, $d_c=7$, 11, and 20 for rates 1/2, 2/3, and 4/5, respectively.

For bit node processing, if the group of M bit nodes are parity bit nodes, their edges are located in 2 consecutive rows of the bottom edge RAM 1303. If the bit nodes are information bit nodes with degree $d_v>2$, their edges are located in some $d_v$ rows of the top edge RAM 1201. The address of these $d_v$ rows can be stored in non-volatile memory, such as Read-Only Memory (ROM). The edges in one of the rows correspond to the first edges of M bit nodes, the edges in another row correspond to the second edges of M bit nodes, etc. Moreover for each row, the column index of the edge that belongs to the first bit node in the group of M can also be stored in ROM. The edges that correspond to the second, third, etc. bit nodes follow the starting column index in a "wrapped around" fashion. For example, if the $j^{th}$ edge in the row belongs to the first bit node, then the (j+1)st edge belongs to the second bit node, (j+2)nd edge belongs to the third bit node, ..., and (j−1)st edge belongs to the $M^{th}$ bit node.

With the organization shown in FIGS. 12A and 12B, speed of memory access is greatly enhanced during LDPC coding.

FIGS. 13A-13D are diagrams of parity check matrix, bipartite graph, top edge RAM, and bottom edge RAM, respectively, to support structured access as to realize randomness in LDPC coding, according to an exemplary embodiment. This exemplary LDPC coding can be employed for DVB-S2 codes for a rate of 2/3 and code length of N=18.

Figure 13A:
FIGS. 13A-13D are diagrams of parity check matrix, bipartite graph, top edge RAM, and bottom edge RAM, respectively, to support structured access as to realize randomness in LDPC coding/decoding, according to an exemplary embodiment.
Figure 13B:
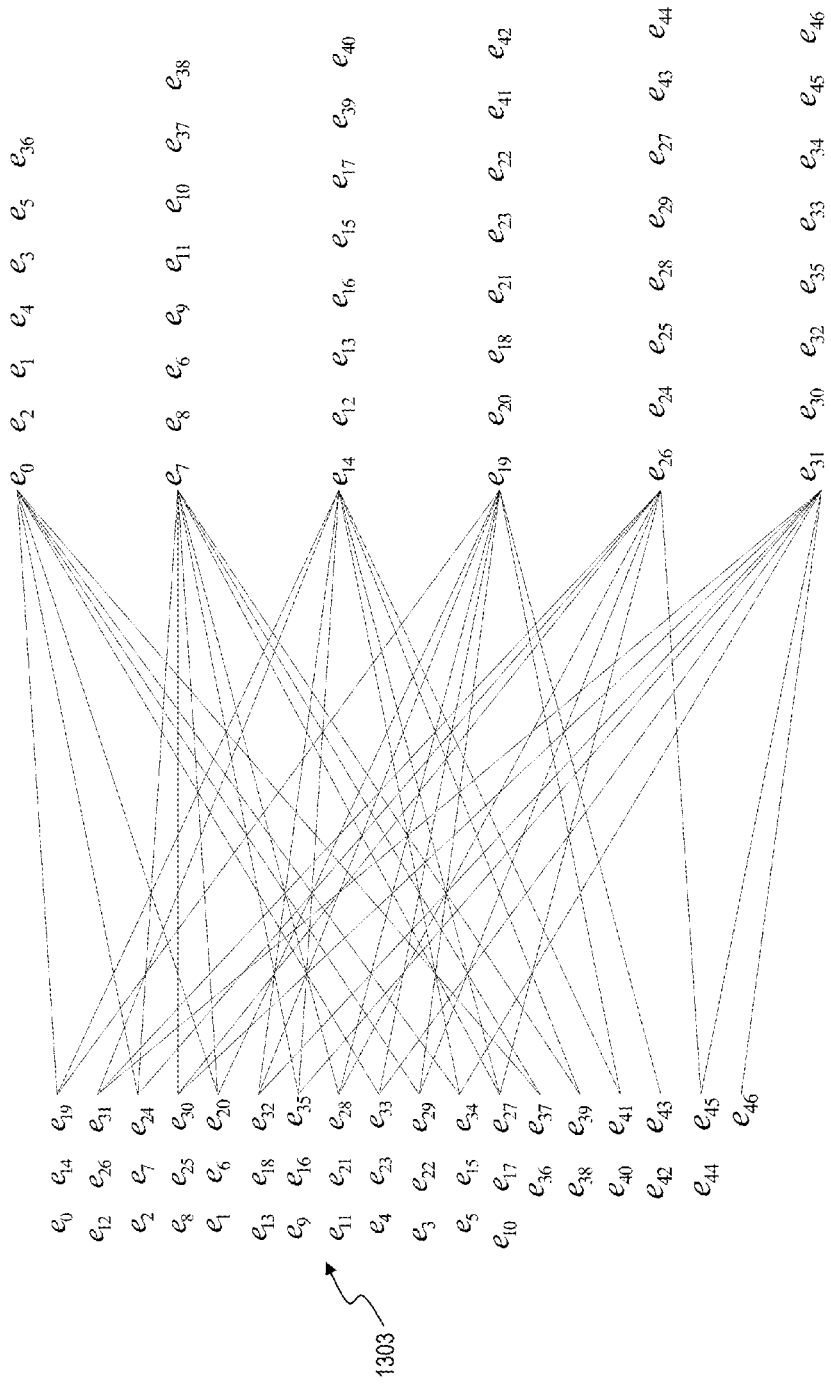
Figure 13D:
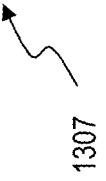
Figure 13C:
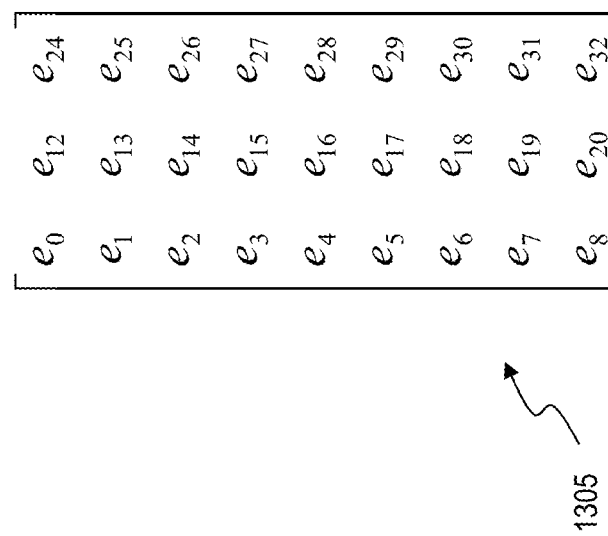

FIG. 13A illustrates a sparse parity check matrix 1301 of an LDPC code, according to an exemplary embodiment and FIG. 13B illustrates the corresponding bipartite graph 1303 of the LDPC code of the matrix 1301. In this exemplary embodiment, all but one check node has degree $d_c=8$ and M=3 nodes are processed in parallel. The arrangement of top edge RAM 1305 is illustrated in FIG. 13C and the arrangement of bottom edge RAM 1307 is illustrated in FIG. 13D.

In this exemplary embodiment, check nodes are partitioned into groups of M=3 {0,2,4} and {1,3,5}. There is no need to store the groups since the computation engines do not care which nodes are processed. For the first group, $d_{c-2}=6$ adjacent edges are $e_0\ e_1\ e_2\ e_3\ e_4\ e_5$, $e_{12}\ e_{13}\ e_{14}\ e_{15}\ e_{16}\ e_{17}$, $e_{24}\ e_{25}\ e_{26}\ e_{27}\ e_{28}\ e_{29}$. All the above edges are stored in the first 6 rows of top edge RAM 1305. Therefore, it is only needed that those 6 rows be fetched. Moreover, in each row the $j^{th}$ element belongs to the $j^{th}$ check node in the group. The remaining adjacent edges are $e_{36}\ e_{39}\ e_{40}\ e_{43}\ e_{44}$. These remaining edges are stored in the first two rows of bottom edge RAM 1307. Similar to top edge RAM 1305 case, in each row, the $j^{th}$ element belongs to the $j^{th}$ check node in the group. Similar structure exists for the other group of check nodes. Therefore, as far as check node processing is concerned, there is no need for any ROM storage. Simply, consecutive rows of edge RAM's are accessed and within each row, it is known exactly where to find the edge for a particular check node in the group.

Also, bit nodes of degree $d_v>2$ are partitioned into groups of M=3: {0,1,2}, {3,4,5}, {6,7,8}, {9,10,11}. Bit nodes in the first group have degree 3 and their adjacent edges are $e_0\ e_{14}\ e_{19}$, $e_{12}\ e_{26}\ e_{31}$, $e_2\ e_7\ e_{24}$. All these edges can appear in top edge RAM 1305, namely rows indexed 0, 2 and 7. These row indices can be stored in ROM. Row 0 carries $e_0\ e_{12}\ e_{24}$; row 2 carries $e_2\ e_{14}\ e_{26}$; and row 7 carries $e_7\ e_{19}\ e_{31}$. Similar to the check node case, each row carries one adjacent edge per bit node. On the other hand they might not be in perfect order as in the case of check nodes. In other words the $j^{th}$ element in each row does not necessarily belong to the $j^{th}$ node. However, as it was explained before, if the $j^{th}$ element belongs to the first bit node, then $(j+1)^{st}$ element belongs to the second bit, $(j+2)^{nd}$ element belongs to the third bit node. etc., and finally $(j-1)^{st}$ element belongs to the $M^{th}$ bit node (in a barrel shifted manner). Therefore, all needed to be stored in ROM is the index j of each row that belongs to the first bit node in the group. In this example, it can be noticed that for row indexed 0, $e_0$ belongs to the first bit node (hence j=0); for row indexed 2, $e_{14}$ belongs to the first bit node (hence j=1) and for row indexed 7, $e_{19}$ belongs to the first bit node (hence j=1). Therefore, the first part of our ROM table reads 0/0 2/1 7/1. Going through the other groups in a similar manner, following ROM table can be obtained

| | | |
|---|---|---|
| 0/0 | 2/1 | 7/1 |
| 1/2 | 6/2 | 8/0 |
| 4/1 | 9/0 | 11/2 |
| 3/0 | 5/2 | 10/1 |

Following with this example, bit nodes of degree $d_v=2$ can be divided into the following groups: {12,14,16}, {13,15, 17}. It can be verified that adjacent edges of each group occur in two consecutive rows of bottom edge RAM 1307 and moreover, in each row the $j^{th}$ element belongs to the $j^{th}$ bit node in the group (except for the last group where $j^{th}$ element of the bottom row and (j+1)mod M element of the top row belong to the same bit node). Therefore, for this case too, there is no need for ROM storage.

Next, a decoding scheme for LDPC codes with code rates 1/4, 1/3, 2/5, 1/2, 3/5, 2/3, 3/4, 4/5, 5/6, 8/9, and 9/10 with coded block size 64800, according to an exemplary embodiment, is described in accordance with FIGS. 14A-14C.

As mentioned before regarding LDPC codes with code rates 1/4, 1/3, 2/5, 1/2, 3/5, 2/3, 3/4, 4/5, 5/6, 8/9, and 9/10 with coded block size 64800, for QPSK modulation scheme, the I/Q demodulation output can be multiplied by a constant (quantized to the nearest integer between −15 and +15), and can be further fed to the LDCP decoder.

In the exemplary embodiment in accordance with LDPC codes with code rates 1/4, 1/3, 2/5, 1/2, 3/5, 2/3, 3/4, 4/5, 5/6, 8/9, and 9/10 with coded block size 64800, check nodes can have degree d More specifically all the check nodes in the code bipartite graph (as illustrated in, for instance, FIG. 9B) have degree d (i.e., they have d adjacent edges) except the first check node which has degree d−1.

Therefore (N−K)d−1 edges exist. These edges are denoted by $e_1, e_2, e_3, \ldots, e_{d-1}, e_{d+1}, \ldots, e_{(N-K)d}$. Here, denote the edges adjacent to the first check node, $e_{d+1}, e_{d+2}, e_{d+3}, \ldots, e_{2d}$ denote the edges adjacent to the second check node, etc. Furthermore, $b_0, b_1, b_2, \ldots, b_{N-1}$ denote a posteriori probability values for all the LDPC coded bits (N=64800 for long codes and N=16200 for short codes).

FIGS. 14A-14C are diagrams of the edge, a posteriori, and shifted a posteriori, respectively, of memory organized to support LDPC decoding, according to an exemplary embodiment. In one example, the decoding process based on FIGS. 14A-14C is performed in accordance with LDPC codes with code rates 1/4, 1/3, 2/5, 1/2, 3/5, 2/3, 3/4, 4/5, 5/6, 8/9, and 9/10 with coded block size 64800. However, it is contemplated that other code rates and block sizes can be used.

According to certain embodiments, the edge values and a posteriori probability values, as discussed above, can be arranged in the edge storage medium (such as random access memory (RAM)) 1401 of FIG. 14A and a posteriori storage medium (such as random access memory (RAM)) 1403 of FIG. 14B, respectively.

According to an exemplary embodiment, the first d rows of edge RAM 1401 can carry the edges adjacent to the first group of M check nodes. Further, the next d rows of the edge RAM 1401 can carry the edges adjacent to the second group of M check nodes, etc. Moreover in each row of the edge RAM 1401, the element in the $i^{th}$ column carries the edge adjacent to the $i^{th}$ check node in a group of M check nodes. It is noted that there is no edge value for the entry x in the edge RAM 1401. In one example, 9 bits can be allocated for the edge RAM 1401. Also, the edge RAM 1401 can be initialized with all zero entries. Moreover, a posteriori RAM 1403 includes a posteriori probability values and in one example, 10 bits are allocated for the entries a posteriori RAM 1403. The a posteriori RAM 1403 can, initially be filled with LDPC decoder soft inputs, which, for instance, can be 6 bits. As the iterations of the decoder, for instance, decoder 303, are run, new a posteriori probability values for each coded bit overwrites the pervious value in the a posteriori RAM 1403.

According to this exemplary embodiment, the LDPC decoder, such as decoder 303 of FIG. 3, can process M check nodes in parallel. In the exemplary embodiment of LDPC codes with code rates 1/4, 1/3, 2/5, 1/2, 3/5, 2/3, 3/4, 4/5, 5/6, 8/9, and 9/10 with coded block size 64800, M=360. For the first group of M check nodes, the decoder reads the first d rows of the edge RAM 1401 and a certain set of d rows from the a posteriori RAM 1403. Moreover, for each row of the a posteriori RAM 1403, the entries are circularly shifted to the left a certain number of times before they are aligned by the contents of the edge RAM 1401. FIG. 14C illustrates a shifted a posteriori RAM 1405 with the elements of the d circularly shifted rows, according to an exemplary embodiment.

The d inputs messages to the $i^{th}$ check node are then formed as follows:

$$v_k = b_{j_{id+k}} - e_{id+k}, k=1,2,\ldots,d.$$

The output message from the $i^{th}$ check node is also computed as follows:

$$z = \min\{|v_1|, |v_2|, \ldots |v_d|\}, \text{let } z=|v_p|, \text{for some } p$$

$$x = \text{second min}\{|v_1|, |v_2|, \ldots |v_d|\}$$

$$s = \text{sign}(v_1) \times \text{sign}(v_2) \times \ldots \text{sign}(v_d)$$

Also, define t=2 for code rate 1/4 and t=1 for all the other code rates. The output message from the $i^{th}$ check node to d bit nodes is computed as follows:

$$w_p = (x-t) \times s \times \text{sign}(v_p) \text{ if } x \geq 1, \text{otherwise } w_p = 0$$

$$w_k = (z-t) \times s \times \text{sign}(v_k) k=1,2,\ldots,p-1,p+1,\ldots,d \text{ if } z \geq 1, \text{otherwise } w_k = 0$$

After all M check nodes are processed in parallel, the values $w_k$, k=1, 2, . . . , Md overwrite $e_k$ in the edge RAM 1401. Further, the updated a posteriori values are computed by $v_k + w_k$ and overwrite the old a posteriori values in the a posteriori RAM 1403. It is noted that, the new a posteriori values need to be circularly shifted back by the same amount before being written back to the memory. Also, it is noted that the first check node has one less degree (number of inputs) than the other check nodes.

Figure 15A:
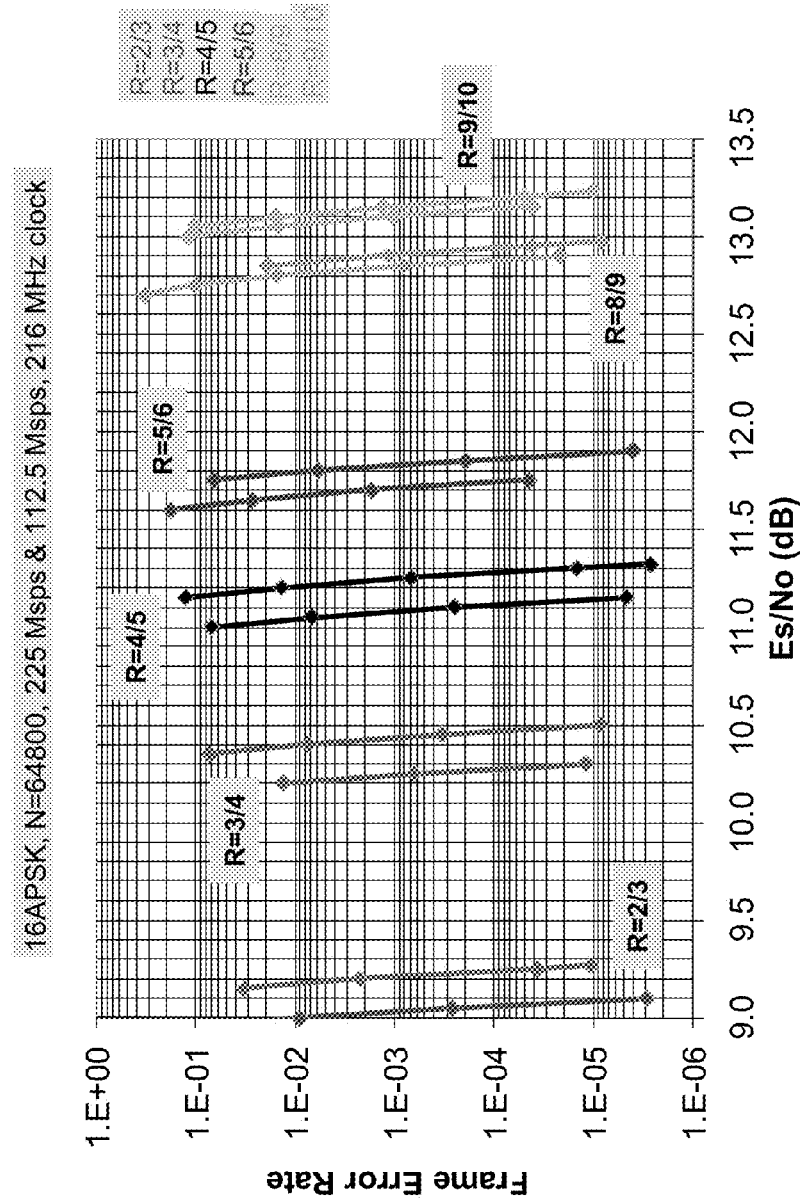
FIGS. 15A-15C are graphs showing simulation results of LDPC codes generated in accordance with various exemplary embodiments.
Figure 15B:
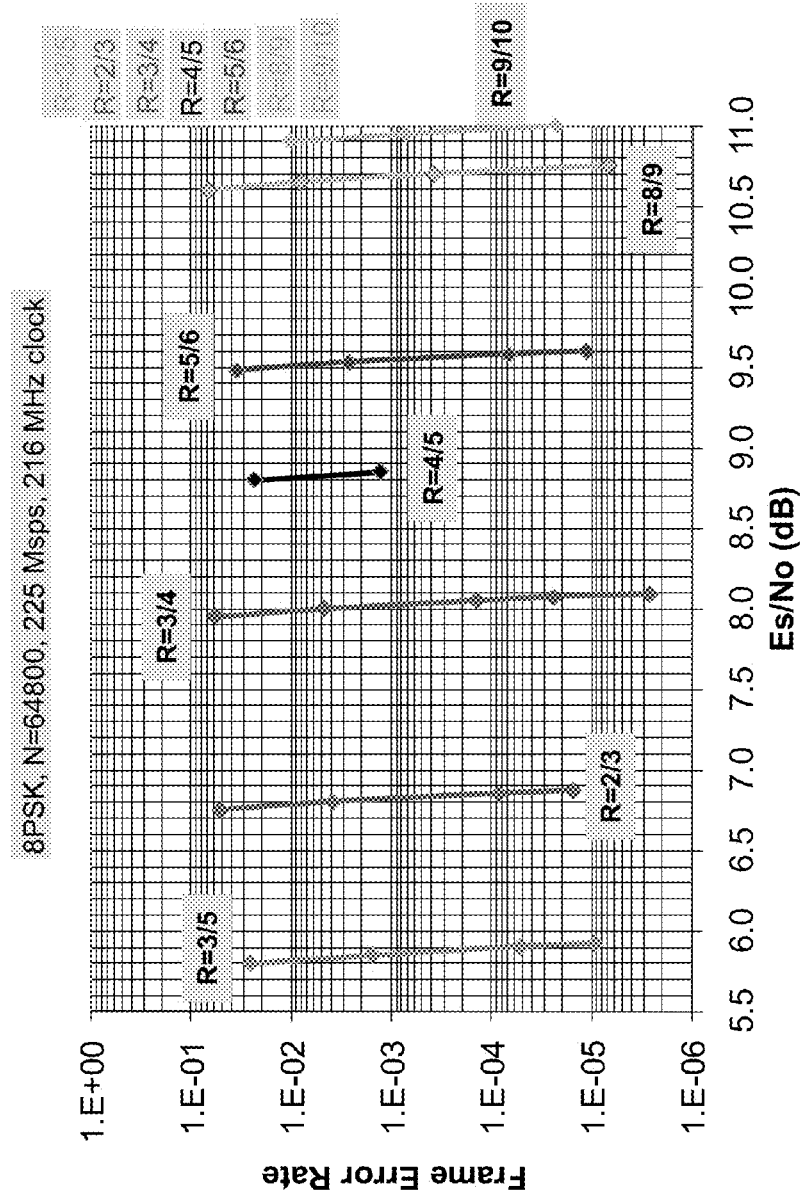
Figure 15C:
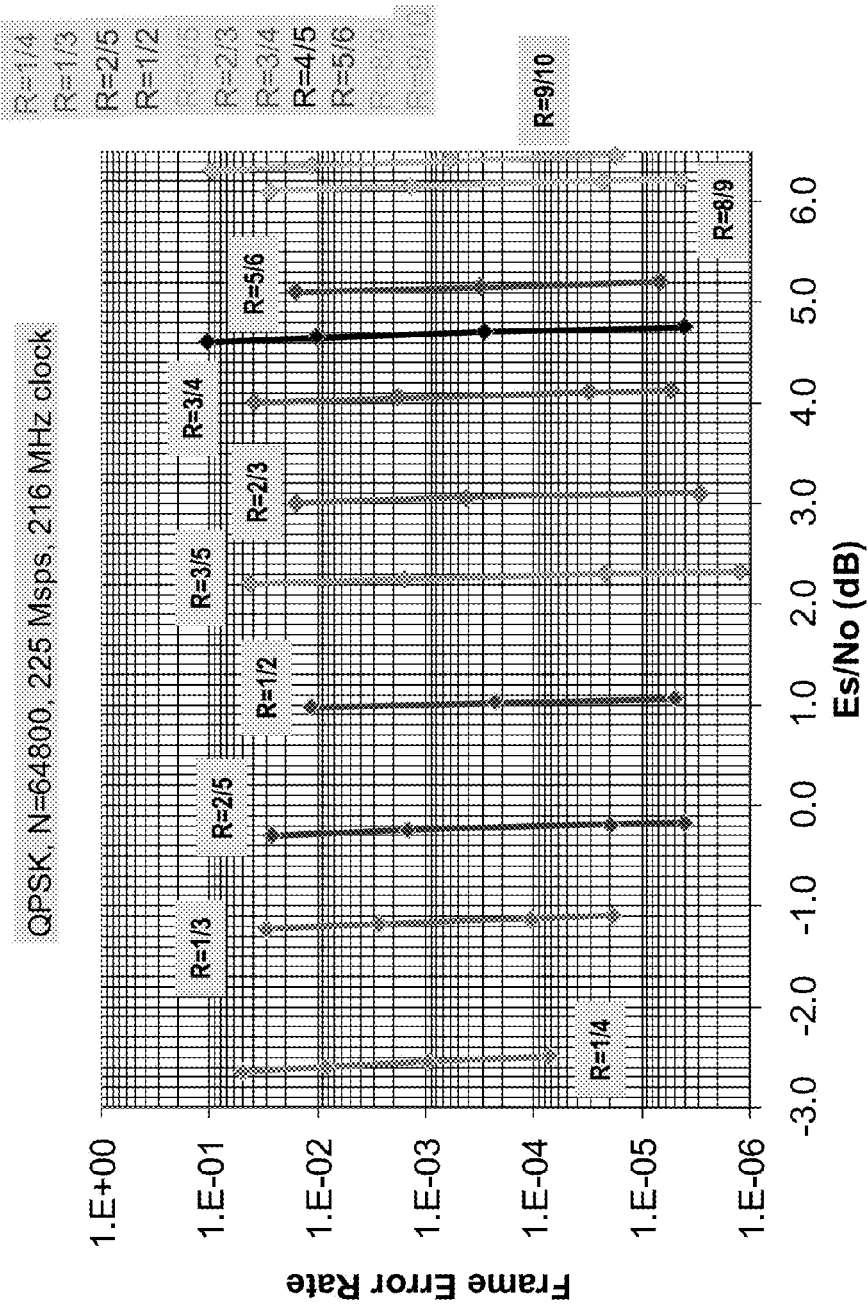

FIGS. 15A-15C are graphs showing simulation results of LDPC codes generated in accordance with various exemplary embodiments. In particular, FIGS. 15A-15C illustrate the performance of LDPC codes with QPSK, 8-PSK, and 16-APSK for different code rates.

The processes for encoding and decoding structured Low Density Parity Check (LDPC) codes are described herein may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. Such exemplary hardware for performing the described functions is detailed below.

Figure 16:
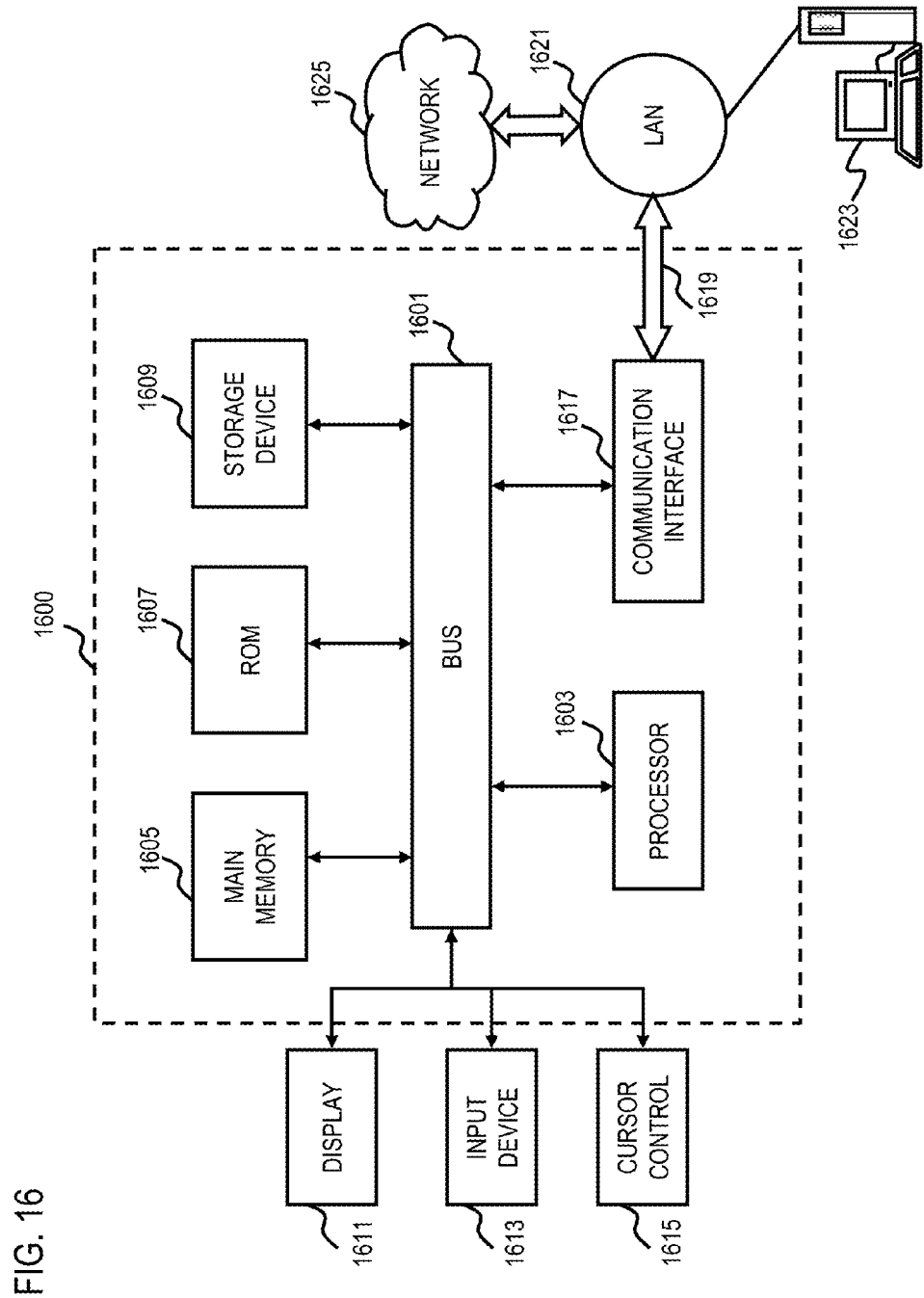
FIG. 16 is a diagram of a computer system that can perform the processes of encoding and decoding of LDPC codes, in accordance with embodiments of the present invention.

FIG. 16 illustrates computing hardware (e.g., computer system) 1600 upon which an embodiment according to the invention can be implemented. The computer system 1600 includes a bus 1601 or other communication mechanism for communicating information and one or more processors (of which one is shown) 1603 coupled to the bus 1601 for processing information. The computer system 1600 also includes main memory 1605, such as a random access memory (RAM) or other dynamic storage device, coupled to the bus 1601 for storing information and instructions to be executed by the processor 1603. Main memory 1605 can also be used for storing temporary variables or other intermediate information during execution of instructions by the processor 1603. The computer system 1600 may further include a read only memory (ROM) 1607 or other static storage device coupled to the bus 1601 for storing static information and instructions for the processor 1603. A storage device 1609, such as a magnetic disk or optical disk, is coupled to the bus 1601 for persistently storing information and instructions.

The computer system 1600 may be coupled via the bus 1601 to a display 1611, such as a cathode ray tube (CRT), liquid crystal display, active matrix display, or plasma display, for displaying information to a computer user. An input device 1613, such as a keyboard including alphanumeric and other keys, is coupled to the bus 1601 for communicating information and command selections to the processor 1603. Another type of user input device is a cursor control 1615, such as a mouse, a trackball, or cursor direction keys, for communicating direction information and command selections to the processor 1603 and for adjusting cursor movement on the display 1611.

According to an embodiment of the invention, the processes described herein are performed by the computer system 1600, in response to the processor 1603 executing an arrangement of instructions contained in main memory 1605. Such instructions can be read into main memory 1605 from another computer-readable medium, such as the storage device 1609. Execution of the arrangement of instructions contained in main memory 1605 causes the processor 1603 to perform the process steps described herein. One or more processors in a multi-processing arrangement may also be employed to execute the instructions contained in main memory 1605. In alternative embodiments, hard-wired circuitry may be used in place of or in combination with software instructions to implement the embodiment of the invention. Thus, embodiments of the invention are not limited to any specific combination of hardware circuitry and software.

The computer system 1600 also includes a communication interface 1617 coupled to bus 1601. The communication interface 1617 provides a two-way data communication coupling to a network link 1619 connected to a local network 1621. For example, the communication interface 1617 may be a digital subscriber line (DSL) card or modem, an integrated services digital network (ISDN) card, a cable modem, a telephone modem, or any other communication interface to provide a data communication connection to a corresponding type of communication line. As another example, communication interface 1617 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1617 sends and receives electrical, electromagnetic, or optical signals that carry digital data streams representing various types of information. Further, the communication interface 1617 can include peripheral interface devices, such as a Universal Serial Bus (USB) interface, a PCMCIA (Personal Computer Memory Card International Association) interface, etc. Although a single communication interface 1617 is depicted in FIG. 16, multiple communication interfaces can also be employed.

The network link 1619 typically provides data communication through one or more networks to other data devices. For example, the network link 1619 may provide a connection through local network 1621 to a host computer 1623, which has connectivity to a network 1625 (e.g. a wide area network (WAN) or the global packet data communication network now commonly referred to as the "Internet") or to data equipment operated by a service provider. The local network 1621 and the network 1625 both use electrical, electromagnetic, or optical signals to convey information and instructions. The signals through the various networks and the signals on the network link 1619 and through the communication interface 1617, which communicate digital data with the computer system 1600, are exemplary forms of carrier waves bearing the information and instructions.

The computer system 1600 can send messages and receive data, including program code, through the network(s), the network link 1619, and the communication interface 1617. In the Internet example, a server (not shown) might transmit requested code belonging to an application program for implementing an embodiment of the invention through the network 1625, the local network 1621 and the communication interface 1617. The processor 1603 may execute the transmitted code while being received and/or store the code in the storage device 1609, or other non-volatile storage for later execution. In this manner, the computer system 1600 may obtain application code in the form of a carrier wave.

The term "computer-readable medium" as used herein refers to any medium that participates in providing instructions to the processor 1603 for execution. Such a medium may take many forms, including but not limited to computer-readable storage medium ((or non-transitory)—i.e., non-volatile media and volatile media), and transmission media. Non-volatile media include, for example, optical or magnetic disks, such as the storage device 1609. Volatile media include dynamic memory, such as main memory 1605. Transmission media include coaxial cables, copper wire and fiber optics, including the wires that comprise the bus 1601. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the embodiments of the invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A method comprising:
   accessing, by a processor of a device, memory storing information representing a predetermined structured parity check matrix of a Low Density Parity Check (LDPC) code for encoding information bits, the information representing the structured parity check matrix being organized in tabular form, wherein each row represents occurrences of one values within a respective column of the parity check matrix, wherein the columns of the parity check matrix are derived according to a predetermined operation based on the respective rows of the tabular information; and encoding the information bits, and outputting an LDPC coded signal comprising the encoded information bits, wherein the LDPC code is of a structure that facilitates use of a plurality of parallel engines for decoding the coded signal;

wherein the encoding comprises:

initializing parity bit accumulators to zero;

accumulating a first information bit in a $j^{th}$ group of M information bits in an $i^{th}$ parity bit accumulator if the $i^{th}$ entry in the $(jM)^{th}$ column of the parity check matrix is 1, where j=0, 1, 2, 3, . . . $k_{ldpc}$/M−1;

accumulating the remaining (M−1) information bits m=jM+1, jM+2, jM+3, . . . (j+1)M−1 of the $j^{th}$ group in the parity bit accumulators according to {x+m mod M*q} mod($n_{ldpc}$−$k_{ldpc}$), wherein x denotes an address of the parity bit accumulator corresponding to the first bit, jM, in the group, and q=($n_{ldpc}$−$k_{ldpc}$)/M is a code rate dependent constant; and after all of the information bits are accumulated, performing operations, starting with i=1 according to $p_i = p_i \oplus p_{i-1}$, i=1, 2, . . . ($n_{ldpc}$−$k_{lpdc}$−1), wherein final content of $p_i$, i=0, 1, . . . ($n_{ldpc}$−$k_{lpdc}$−1) is equal to the parity bit $p_i$;

wherein the tabular information representing the structured parity check matrix comprises a one of Tables 1 through 24 (below), wherein the row indices of 1's in the column index j*M (j=0, 1, 2, 3, . . . $k_{lpdc}$/M−1) of the parity check matrix are given at the $j^{th}$ row according to the one Table, and wherein $k_{ldpc}$ is associated with a length of the bit streams;

TABLE 1

Address of Parity Bit Accumulators (Rate ⅔ - Coded Block Size 720)

83 117 156 169 231 126 112 106
120 169 106 27 188 213 22 159
160 121 106 203 196 141 174 135
64 137 226 91 180 85 166 7
82 7 198 148
134 24 9 83
149 160 1 151
74 203 116 13
206 12 101
200 45 98
16 235 165
167 25 171
2 83 33
8 174 207
36 170 207
73 172 86

TABLE 2

Address of Parity Bit Accumulators (Rate ⅔ - Coded Block Size 960)

52 293 211 106 128 87 286 89
224 273 74 99 28 301 142 311
160 201 210 123 252 165 198 183
296 105 10 283 244 317 302 263
289 168 207 267
167 170 141 156
270 266 240 171
89 28 237 158
113 67 118
66 160 22
144 269 180
53 59 121

TABLE 2-continued

Address of Parity Bit Accumulators (Rate ⅔ - Coded Block Size 960)

36 183 238
171 140 314
271 168 42
153 173 31

TABLE 3

Address of Parity Bit Accumulators (Rate ⅔ - Coded Block Size 1440)

140 296 319 355 373 182 329 266
144 169 426 155 348 381 78 87
120 169 242 371 292 13 286 95
280 449 10 371 396 405 78 15
317 42 380 336
254 233 301 60
251 175 218 120
465 147 390 407
387 273 287
120 279 97
404 22 283
323 256 453
182 77 449
90 20 48
466 415 301
474 228 350

TABLE 4

Address of Parity Bit Accumulators (Rate ⅔ - Coded Block Size 2160)

458 368 73 243 357 298 305 695
375 511 575 629 186 130 624 561
297 284 204 637 10 623 195 436
300 433 110 712 401 618 379 608
710 700 390 535 73 478 524 641
456 554 363 400 174 463 249 575
228 542 556 493
30 684 581 225
195 134 61 82
461 45 387 244
91 128 71 246
439 212 274 359
476 394 234
171 501 391
327 528 41
186 62 253
513 295 157
661 152 196
16 490 710
239 257 96
687 710 408
525 160 18
671 331 370
101 68 695

TABLE 5

Address of Parity Bit Accumulators (Rate ⅔ - Coded Block Size 2880)

689 581 139 306 45 371 886 576
864 596 6 651 693 810 770 281
270 557 325 275 561 672 196 22
620 324 77 312 851 642 917 480
375 88 57 746 364 910 527 644
753 823 360 921 218 411 908 190
327 111 217 269 888 307 914 934
785 439 682 171 60 686 959 308
79 103 568 563
337 312 523 352
906 492 471 800
250 867 303 860

TABLE 5-continued

Address of Parity Bit Accumulators (Rate 2/3 - Coded Block Size 2880)

287 619 702 706
262 430 9 941
293 225 244 626
629 918 697 381
145 371 102
597 575 280
464 618 388
509 844 631
525 123 362
611 638 271
26 433 548
485 745 726
561 742 125
754 318 457
864 219 632
354 688 116
523 425 552
935 147 735
956 807 610
421 60 142

TABLE 6

Address of Parity Bit Accumulators (Rate 2/3 - Coded Block Size 3600)

157 563 346 756 65 524 238 859
133 475 1007 791 420 858 76 301
284 200 701 389 119 1155 823 1078
812 853 194 459 500 415 346 448
381 418 343 1048 452 724 87 169
402 105 410 511 534 417 676 883
762 170 553 957 559 618 276 41
2 505 486 607 308 389 110 251
1052 834 570 871 69 1124 923 1102
760 445 906 167 68 792 573 254
684 999 752 981
442 651 372 1113
366 204 230 25
1160 426 171 768
909 61 798 10
369 60 174 167
59 915 728 356
655 456 997 967
37 755 113 1045
142 443 934 297
930 1156 502
597 452 760
439 725 889
1093 1100 48
377 511 752
330 817 1155
239 1006 823
522 725 95
871 813 30
92 539 1164
504 545 707
141 714 38
923 874 369
623 904 541
340 756 382
273 661 1195
194 29 931
1008 1178 687
326 18 927
246 488 976

TABLE 7

Address of Parity Bit Accumulators (Rate 2/3 - Coded Block Size 4320)

1029 1059 593 574 702 1161 695 1357
1081 1333 648 1179 898 1266 88 924
914 633 5 924 1123 291 191 48

TABLE 7-continued

Address of Parity Bit Accumulators (Rate 2/3 - Coded Block Size 4320)

113 1434 11 1094 102 337 695 504
348 286 209 712 85 207 748 1340
653 203 1365 377 983 1436 1308 962
1228 319 680 1114 1070 39 307 45
1375 416 1095 982 917 1281 912 434
355 165 527 513 36 655 86 530
313 556 630 1112 1306 851 904 666
44 487 166 565 335 521 699 272
1177 1228 1301 630 10 59 326 639
601 1326 1065 1142
107 1124 1074 1374
469 1262 508 867
525 588 827 209
1105 123 1383 1037
960 992 129 1397
1075 810 1015 1167
244 427 1272 786
44 560 88 787
362 565 688 1365
1066 622 1192 674
727 802 1100 1342
296 801 120
1147 453 1019
800 1332 1139
776 478 1249
1002 1252 862
91 178 1375
375 385 682
1095 51 285
744 187 1343
178 371 415
1119 1325 1332
688 873 494
295 1150 1182
122 733 137
572 981 589
672 1242 914
534 417 277
1288 1070 68
268 1202 884
461 1295 642
335 1384 926
1433 821 27
97 1156 732
1299 1278 593

TABLE 8

Address of Parity Bit Accumulators (Rate 2/3 - Coded Block Size 5760)

956 226 1821 1871 298 767 474 759
199 742 1600 1277 660 1377 145 482
426 300 1141 614 179 1853 1325 1737
602 658 545 1692 708 1146 131 283
1380 557 1578 525 1552 500 1167 594
1907 1319 757 86 1774 238 76 1841
1428 1568 1071 800 875 102 928 791
1021 1503 1654 1747 1688 1329 910 1393
1473 1754 1215 709 1463 295 118 1262
1216 1614 1717 869 769 661 703 1025
1221 932 1345 1510 943 1367 590 333
259 246 1694 1861 592 551 501 778
1774 98 459 1122 405 83 1466 1186
1542 1072 1405 176 731 704 1609 1115
1320 1803 454 276 247 1748 1899 1630
612 1755 879 1836
695 1118 967 297
1436 30 1222 200
454 926 349 1747
1825 1853 262 1060
1306 50 705 38
1017 1079 516 705
556 1170 624 1143
1370 1533 54 801
51 1483 647 25

TABLE 8-continued

Address of Parity Bit Accumulators (Rate ⅔ - Coded Block Size 5760)

1659 1673 764 477
1754 222 858 310
1703 514 692 1381
1578 1769 211 103
1112 378 54 1139
1050 710 670
711 221 1575
1908 101 1705
1006 1085 14
1593 499 1201
1603 1372 74
1214 514 1415
1788 55 393
1102 835 557
513 165 1911
1695 193 990
320 822 1469
518 1260 1266
662 679 65
737 883 1030
642 138 202
97 1539 293
1254 1316 87
238 971 1427
1073 384 1348
447 1502 247
398 997 1467
580 354 1388
236 418 1011
110 656 1583
1291 126 769
849 1756 89
1206 1771 1654
942 99 92
634 226 1559

TABLE 9

Address of Parity Bit Accumulators (Rate ⅘ - Coded Block Size 720)

75 126 40 130 137 104
108 132 7 70 35 95
81 57 97 40 20 125
63 142 128
117 73 110
21 85 125
63 100 83
120 142 134
0 94 113
141 24 70 94 20 143
96 30 43 1 47 104
39 123 13 31 89 65

TABLE 10

Address of Parity Bit Accumulators (Rate ⅘ - Coded Block Size 960)

90 169 14 33 76 59
108 127 8 177 154 119
126 85 116 63 142 11
108 1 86 117 184 191
174 37 44 159 124 23
36 73 20 147 28 41
76 54 47
147 142 121
176 163 41
170 52 1
156 135 122
18 105 113
159 26 155
95 62 163
24 83 7
166 135 187
66 22 62
186 39 58

TABLE 10-continued

Address of Parity Bit Accumulators (Rate ⅘ - Coded Block Size 960)

90 67 110 39 178 107
6 163 104 159 16 71
48 145 98 63 76 173
102 25 104 177 160 155
150 7 110 189 124 113
144 25 80 117 22 71

TABLE 11

Address of Parity Bit Accumulators (Rate ⅘ - Coded Block Size 1440)

264 211 242 129 16 119
48 205 80 63 244 263
216 157 266 117 34 23
138 157 62 69 184 191
54 271 242 255 88 275
84 145 128 219 268 89
127 262 59
148 60 122
80 24 61
27 250 11
75 18 103
278 147 5
63 224 95
201 7 56
213 217 286
42 8 190
42 23 154
42 73 143
84 109 86 63 262 233
126 19 110 207 262 149
210 121 248 279 4 227
264 217 176 99 268 113
108 103 284 225 262 17
42 205 14 129 262 5

TABLE 12

Address of Parity Bit Accumulators (Rate ⅘ - Coded Block Size 2160)

281 315 114 116 176 342
362 150 317 33 131 280
431 137 422 154 68 176
53 391 168 258 17 139
188 69 199 0 57 38
219 108 429 335 414 385
234 323 180 309 39 56
162 3 340 189 214 359
408 9 30
221 305 174
341 208 410
202 272 267
378 165 395
4 383 377
228 15 35
356 86 223
79 225 194
91 314 254
366 393 251
338 181 425
79 29 152
84 72 125
372 63 256
43 204 422
390 59 200 429 351 265
408 118 106 173 68 305
16 233 390 415 219 244
106 251 428 70 311 216
82 413 59 342 337 76
114 357 215 352 174 425
138 83 12 373 287 24
1 50 203 252 85 239

TABLE 13

Address of Parity Bit Accumulators (Rate 4/5 - Coded Block Size 2880)

111 270 437 502 215 181
115 18 330 442 508 57
201 182 392 492 206 124
189 451 399 501 403 32
200 229 331 351 294 55
263 94 539 298 378 475
362 562 320 395 357 540
452 399 202 419 449 393
541 128 462 256 527 206
165 533 465
29 163 494
388 102 474
361 183 11
355 539 347
69 565 162
160 473 76
432 508 35
117 527 385
556 514 422
556 289 534
385 572 3
66 303 14
29 364 514
95 58 411
90 209 222
279 188 292
459 182 359
47 64 413 399 402 275
63 35 345 454 32 353
317 307 34 440 315 112
45 191 352 60 120 151
290 192 503 509 474 52
490 313 123 299 206 345
198 370 265 221 363 7
558 496 166 185 132 8
351 424 436 527 96 430

TABLE 14

Address of Parity Bit Accumulators (Rate 4/5 - Coded Block Size 3600)

76 283 600 479 262 505
293 236 203 12 711 181
666 76 24 687 283 527
339 302 389 571 618 659
38 469 340 151 555 34
248 637 466 352 497 571
429 706 259 96 459 378
297 40 656 282 119 682
506 573 228 649 329 702
38 272 81 305 138 154
62 632 93 267 563 172
336 133 650 557 692 309
358 271 456
263 435 533
655 660 29
356 115 160
692 100 396
313 435 57
267 16 575
370 383 398
554 524 221
210 517 585
438 157 10
170 522 333
611 426 28
423 185 78
141 196 602
17 558 250
420 485 668
351 166 129
576 309 235
146 339 348
379 604 23
313 319 694

TABLE 14-continued

Address of Parity Bit Accumulators (Rate 4/5 - Coded Block Size 3600)

601 188 611
697 446 464
70 460 23 530 342 627
661 268 10 434 300 3
612 376 351 150 29 287
503 15 326 25 257 680
359 29 342 391 214 108
223 25 131 162 458 29
693 594 574 48 524 343
645 375 106 479 678 408
92 213 691 88 204 221
109 92 165 226 52 698
697 415 704 309 496 158
361 315 689 427 572 513

TABLE 15

Address of Parity Bit Accumulators (Rate 4/5 - Coded Block Size 4320)

67 837 44 354 141 632
292 816 309 137 515 334
709 598 186 77 169 430
398 551 661 99 329 15
752 230 687 837 554 57
308 303 181 138 190 512
646 202 184 382 535 143
440 281 158 673 434 518
329 561 164 854 712 411
45 470 274 759 90 331
50 273 858 732 447 455
835 257 816 72 415 251
444 609 690 263 388 3
299 44 189 403 484 567
592 331 252 621 721 626
688 324 456 251 44 765
529 783 541
290 560 542
447 792 530
365 753 436
356 161 445
402 805 278
852 799 149
376 599 101
55 240 524
3 331 862
35 140 184
752 811 202
425 444 679
606 731 326
105 234 35
598 585 810
118 175 145
255 506 806
62 825 464
585 594 451
27 581 567
430 722 179
391 195 228
206 165 381
760 480 423
774 748 185
26 337 720
746 189 689
636 120 676
306 831 40
267 124 301
148 485 219
428 157 595 505 575 282
598 201 151 484 627 96
551 148 169 184 845 611
513 688 585 371 855 414
734 139 696 404 252 341
496 577 149 164 339 285
238 827 336 339 631 38
533 738 641 633 463 36

TABLE 15-continued

Address of Parity Bit Accumulators (Rate ⅘ - Coded Block Size 4320)

519 767 641 624 748 585
421 848 385 356 747 376
732 222 490 200 406 658
45 410 498 286 135 655
502 152 78 273 13 75
546 122 357 550 120 571
514 362 572 479 155 358
642 389 90 220 749 591

TABLE 16

Address of Parity Bit Accumulators (Rate ⅘ - Coded Block Size 5760)

389 1050 43 678 88 303
988 1112 642 633 59 92
196 260 661 696 74 1098
375 444 435 540 1 542
9 673 1149 388 66 797
1013 404 516 1096 82 811
780 161 190 661 883 745
620 594 79 742 441 435
838 59 501 129 403 117
1139 557 973 110 67 654
44 1132 15 859 885 513
1147 900 748 563 757 927
690 835 1117 477 1010 651
742 587 230 170 748 132
688 1127 1040 413 6 16
886 29 14 593 20 998
540 904 605 932 1115 591
882 1120 533 697 1112 611
976 629 194
799 762 578
577 96 66
203 751 141
365 269 201
549 25 880
217 336 788
146 664 849
893 498 1119
862 490 978
727 203 717
162 946 1131
1093 824 614
332 982 325
661 604 868
764 1097 603
36 1001 549
774 746 623
384 1028 856
774 381 889
627 261 731
47 97 1045
621 1062 325
1025 208 240
693 734 291
160 932 427
994 619 848
1127 74 44
923 431 318
935 887 1059
970 984 730
696 21 418
266 684 96
358 797 717
602 877 325
184 782 625
1033 304 1094 562 1031 361
566 715 198 975 365 519
268 1109 294 662 287 478
13 419 213 575 842 748
918 363 549 1004 578 408
644 188 128 508 828 844
1009 1101 243 44 426 580
200 858 241 89 119 294

TABLE 16-continued

Address of Parity Bit Accumulators (Rate ⅘ - Coded Block Size 5760)

305 64 560 284 675 847
925 916 740 18 1151 1113
90 669 470 1037 733 863
509 937 514 852 792 51
1023 73 245 1138 404 571
780 1034 473 641 676 739
802 963 1102 372 553 173
619 44 844 977 384 249
687 727 81 300 448 636
867 1048 277 891 1056 139

TABLE 17

Address of Parity Bit Accumulators (Rate ½ Coded Block Size 720)

207 174 209 139 68 88
270 136 45 188 329 145
13 335 136 6 213 20
161 74 339 307
30 262 39 212
282 19 124 275

TABLE 18

Address of Parity Bit Accumulators (Rate ½ - Coded Block Size 960)

424 467 351 278 130 273
138 208 267 420 457 470
387 230 264 237 68 346
450 148 62 67 5 225
213 471 123 289
159 412 221 434
136 479 246 148
448 65 213 239

TABLE 19

Address of Parity Bit Accumulators (Rate ½ - Coded Block Size 1440)

414 469 23 658 559 440
13 322 153 338 220 539
567 661 680 386 259 347
207 511 215 469 536 420
83 295 133 280 363 378
713 453 579 307 234 676
148 471 150 633
509 417 524 696
681 360 306 281
674 130 544 629
252 326 10 461
72 122 488 562

TABLE 20

Address of Parity Bit Accumulators (Rate ½ - Coded Block Size 2160)

297 811 822 736 708 943
786 553 17 33 889 496
1010 1062 726 681 597 911
911 71 753 446 49 854
717 1046 935 440 228 1
116 572 295 736 517 419
164 80 651 1055 264 493
937 221 845 537 1014 925
472 934 172 1016 122 900
787 1045 113 1071
270 784 605 590
766 5 50 426
316 146 664 581

TABLE 20-continued

Address of Parity Bit Accumulators (Rate ½ - Coded Block Size 2160)

929 722 251 201
324 184 193 60
436 81 412 342
867 688 819 114
1 453 688 63

TABLE 21

Address of Parity Bit Accumulators (Rate ½ - Coded Block Size 2880)

101 1400 91 580 236 1044
486 1368 512 230 845 573
1160 993 303 140 278 717
646 922 1087 148 542 23
1249 393 1151 1375 903 86
1062 1298 1341 622 392 300
1055 107 950 526 196 1387
48 1325 1143 124 1197 598
875 552 728 175 826 111
708 469 262 1129 723 850
501 570 1081 1058 455 712
1145 1172 228 1302 729 637
836 781 323 1360
720 712 36 138
1220 1375 1185 457
689 115 1298 1372
537 995 1167 906
1039 678 1301 1058
71 1001 481 1178
1042 987 203 832
1086 1090 1059 785
365 1000 133 624
819 954 523 781
795 401 210 1171

TABLE 22

Address of Parity Bit Accumulators (Rate ½ - Coded Block Size 3600)

1615 11 1423 653 1242 3
1164 1604 22 270 1067 941
1065 266 40 831 1452 502
1090 1742 345 1123 1309 1293
667 278 947 473 193 1038
1416 1546 358 1344 1081 288
1457 1238 680 1725 1426 1378
130 323 181 1307 1019 616
1401 355 1794 1360 906 1368
175 133 250 1119 1767 963
69 1115 156 1216 34 682
330 113 1399 608 1324 860
897 270 1384 42 887 858
1684 1358 553 1015 1614 819
681 864 1366 1205 540 638
1085 1323 1189 1110
1287 912 1128 779
1473 645 944 1669
1315 554 1031 1229
434 154 515 1321
374 1745 203 97
620 1537 339 589
321 839 962 1507
921 165 1331 478
1571 1466 92 309
1010 1266 1152 897
2 929 1291 380
176 832 1228 1442
1166 1648 787 366
1501 952 1676 417

TABLE 23

Address of Parity Bit Accumulators (Rate ½ - Coded Block Size 4320)

175 41 262 1037 621 1340
2050 2108 353 875 522 896
1948 281 1659 346 198 451
1837 321 608 367 1763 1750
1128 1444 1043 601 674 1352
1410 931 2146 191 383 2007
140 562 1734 2136 2075 1162
879 708 609 37 2135 544
1785 1320 854 1714 1370 1222
169 312 386 1840 743 194
1393 319 1007 1724 1001 1082
1791 600 1761 569 1306 638
1028 1403 2133 1507 868 106
1610 1752 1194 915 1006 121
1891 1497 1025 1556 113 2019
116 1407 1021 455 1665 103
745 1911 1398 1056 1492 1713
396 64 1710 10 2149 1290
2089 767 308 1383
1637 110 1437 18
2090 1374 66 135
28 588 1760 157
1205 1607 186 835
1047 1512 1697 699
489 590 1458 2082
980 1269 265 1281
2 449 1917 631
2152 1888 360 1316
1000 396 927 910
1639 1972 1002 2053
773 1871 991 901
728 1379 1204 799
2030 1411 1438 869
1509 1204 927 1417
1130 1087 912 293
900 1922 2067 736

TABLE 24

Address of Parity Bit Accumulators (Rate ½ - Coded Block Size 5760)

991 2656 114 1713 234 760
883 1301 934 346 2155 1420
2443 2775 1617 1593 159 199
477 646 1667 1713 199 2737
2741 2673 1810 14 120 2234
1578 2252 185 1589 691 951
954 1090 1065 1344 4 1350
26 1700 2872 987 177 2031
567 2277 2248 1348 1618 1892
678 1088 555 291 2685 2702
1874 107 1258 696 2667 1780
976 1578 1289 597 1115 2225
1509 1488 212 1836 1082 1066
2092 157 1240 296 980 313
956 1798 952 806 707 8
2845 1391 2453 295 179 1602
1694 95 2617 1135 840 2655
117 2827 41 2147 2218 1321
198 2869 1414 227 2148 2161
2257 282 818 1179 2178 1817
1023 96 749 2841 725 709
2323 1646 2017 701 2838 2277
454 1851 304 1697 1800 1863
2567 990 46 44 1603 961
175 2194 2443 2183
2198 2302 308 445
126 2026 2569 62
2234 80 6 1463
911 1687 1890 16
2275 1495 2345 2761
1887 832 1464 194
1231 2864 1161 347
2120 1243 2461 450
1526 2479 146 2618

TABLE 24-continued

Address of Parity Bit Accumulators (Rate ½ - Coded Block Size 5760)

```
1010 2389 1718 2592
1103 517 1420 2112
47 829 814 2835
2494 777 2861 510
1265 924 893 8
1230 125 299 1703
2753 1547 1228 2307
1389 2451 756 1991
1965 2149 8 1596
2061 1136 2380 2211
2724 2110 161 1740
2868 284 656 628
2508 1614 2052 332.
```

2. A method according to claim 1, further comprising:
modulating the LDPC coded signal according to a signal constellation that includes one of OQPSK (Offset Quadrature Amplitude Modulation), QPSK (Quadrature Phase Shift Keying), 8-PSK (Phase Shift Keying), and 16-APSK (Amplitude Phase Shift Keying).

3. A method comprising:
accessing, by a processor of a device, memory storing information representing a predetermined structured parity check matrix of a Low Density Parity Check (LDPC) code for encoding information bits, the information representing the structured parity check matrix being organized in tabular form, wherein each row represents occurrences of one values within a respective column of the parity check matrix, wherein the columns of the parity check matrix are derived according to a predetermined operation based on the respective rows of the tabular information; and
encoding the information bits, and outputting an LDPC coded signal comprising the encoded information bits, wherein the encoding comprises:
  initializing parity bit accumulators to zero,
  accumulating a first information bit in a $j^{th}$ group of M information bits in an $i^{th}$ parity bit accumulator if the $i^{th}$ entry in the $(jM)^{th}$ column of the parity check matrix is 1, where $j=0, 1, 2, 3, \ldots k_{ldpc}/M-1$,
  accumulating the remaining (M−1) information bits $m=jM+1, jM+2, jM+3, \ldots (j+1)M-1$ of the $j^{th}$ group in the parity bit accumulators according to $\{x+m \bmod M*q\} \bmod(n_{ldpc}-k_{ldpc})$, wherein x denotes the address of the parity bit accumulator corresponding to the first bit, jM, in the group, and
  after all of the information bits are exhausted, performing operations, starting with i=1 according to $$p_M = p_M \oplus p_0$$

$$p_{2M} = p_{2M} \oplus p_M$$

$$p_{3M} = p_{3M} \oplus p_{2M}$$

$$\vdots \quad \vdots \quad \vdots$$

$$p_{n_{ldpc}-k_{ldpc}-M} = p_{n_{ldpc}-k_{ldpc}-M} \oplus p_{n_{ldpc}-k_{ldpc}-2M}$$

$$p_1 = p_1 \oplus p_{n_{ldpc}-k_{ldpc}-M}$$

$$p_{M+1} = p_{M+1} \oplus p_1$$

$$p_{2M+1} = p_{2M+1} \oplus p_{M+1}$$

$$\vdots \quad \vdots \quad \vdots$$

$$p_{n_{ldpc}-k_{ldpc}-M+1} = p_{n_{ldpc}-k_{ldpc}-M+1} \oplus p_{n_{ldpc}-k_{ldpc}-2M+1}$$

$$p_2 = p_2 \oplus p_{n_{ldpc}-k_{ldpc}-M+1}$$

$$p_{M+2} = p_{M+2} \oplus p_2$$

$$p_{2M+2} = p_{2M+2} \oplus p_{M+2}$$

$$\vdots \quad \vdots \quad \vdots$$

$$p_{n_{ldpc}-k_{ldpc}-M+2} = p_{n_{ldpc}-k_{ldpc}-M+2} \oplus p_{n_{ldpc}-k_{ldpc}-2M+2}$$

$$p_3 = p_3 \oplus p_{n_{ldpc}-k_{ldpc}-M+2}$$

$$p_{M+3} = p_{M+3} \oplus p_3$$

$$p_{2M+3} = p_{2M+3} \oplus p_{M+3}$$

$$\vdots \quad \vdots \quad \vdots$$

$$p_{n_{ldpc}-k_{ldpc}-M+3} = p_{n_{ldpc}-k_{ldpc}-M+3} \oplus p_{n_{ldpc}-k_{ldpc}-2M+3}$$

$$\vdots \quad \vdots \quad \vdots \quad \vdots \quad \vdots$$

$$p_{M-1} = p_{M-1} \oplus p_{n_{ldpc}-k_{ldpc}-2}$$

$$p_{2M-1} = p_{2M-1} \oplus p_{M-1}$$

$$p_{3M-1} = p_{3M-1} \oplus p_{2M-1}$$

$$\vdots \quad \vdots \quad \vdots$$

$$p_{n_{ldpc}-k_{ldpc}-1} = p_{n_{ldpc}-k_{ldpc}-1} \oplus p_{n_{ldpc}-k_{ldpc}-M-1}$$

wherein final content of $p_i$, $i=0, 1, \ldots (n_{ldpc}-k_{ldpc}-1)$ is equal to the parity bit $p_i$.

4. A method according to claim 3, wherein M=360.

5. A method according to claim 4, wherein coded block size $n_{ldpc}$ is 64800 code rates are 1/4, 1/3, 2/5, 1/2, 3/5, 2/3, 3/4, 4/5, 5/6, 8/9, and 9/10, respectively.

6. A method according to claim 3, wherein the tabular information representing the structured parity check matrix comprises a one of Tables 25 through 35 (below), wherein the row indices of 1's in the column index j*M, (j=0, 1, 2, 3, . . . $k_{ldpc}/360-1$) of the parity check matrix are given at the $j^{th}$ row according to the one Table, and wherein $k_{ldpc}$ is associated with a length of the bit streams;

TABLE 25

Address of Parity Bit Accumulators (Rate 9/10 - Coded Block Size 64800)

```
853 2958 3632 4515
1434 4116 4989 5634
956 4019 4864 5826
2532 4509 5262 6167
739 1530 4498 5247
3702 4931 5465 6270
1120 2178 3845 5151
860 1124 3462 5411
369 3339 4144 4846
122 2027 3691 5416
262 1354 2338 4093
1573 1950 2733 3244
540 4585 6053 6153
1500 2589 3263 5842
126 535 2167 2851
450 1639 2380 3010
2123 3229 5049 5772
234 1833 3121 6332
3837 5603 6118
1508 3146 3403
233 447 2661
407 1040 6302
1453 4073 6091
2498 3347 6253
2019 3356 4664
753 1184 4888
```

TABLE 25-continued

Address of Parity Bit Accumulators (Rate 9/10 - Coded Block Size 64800)

882 2521 3870
476 2255 2523
3997 4593 5914
1455 2130 2958
84 4217 4371
1407 3850 4794
160 2118 6164
2949 4691 5226
1111 5043 5621
2186 5370 5596
3093 5233 6382
340 3265 5540
278 1666 1883
154 1203 3583
1946 3000 6258
2010 3644 5852
1546 2436 5506
765 3582 4362
1566 2642 5023
1120 4415 6217
1274 4777 5663
2607 4905 5329
429 741 2271
419 2861 3227
595 4276 4577
855 4269 5322
2182 3654 5979
3710 4137 5946
875 4259 5751
305 2387 6465
1039 2552 4422
473 1567 2876
86 433 6038
771 2242 4226
2298 4312 5160
151 1104 5223
584 4865 6443
1351 2789 5736
1104 4867 5210
1551 3806 4771
5682 6074 6155
1678 4509 5883
2934 3723 4530
2155 3451 3623
2012 2913 3395
2081 3019 3550
269 604 1918
2397 2735 3571
247 1410 4047
788 1906 4585
2993 3783 5318
2392 3527 4509
1829 4402 5626
796 3206 5660
406 812 3768
3663 4160 5625
3042 4219 4996
1176 2485 4699
271 360 4695
1415 3372 5921
5159 6118 6466
1699 2861 6151
1581 5066 6060
1482 2649 6313
2270 3658 6419
550 2114 3514
415 5165 5735
2775 3277 5182
1622 2345 3570
2865 3643 4519
2632 3685 4527
2226 3972 5927
1311 5722 6001
1602 4026 6106
3009 5053 5448
813 1800 2910
1551 2026 3139
517 1223 4953

TABLE 25-continued

Address of Parity Bit Accumulators (Rate 9/10 - Coded Block Size 64800)

0 4828 6461
1132 4040 6223
274 745 4778
319 807 4625
1745 1977 5221
296 1451 6474
607 4594 6054
2034 2210 3466
1701 3223 5633
3605 4513 4818
3209 4817 5696
1063 1404 4558
1015 2736 4760
3199 3921 5773
162 871 2135
71 5698 6079
4010 5377 6332
367 3524 5046
2345 2666 3410
2505 2523 3646
1425 4183 6203
459 1102 4163
229 1479 5965
197 671 2247
2221 5136 5542
1092 3353 6170
3140 3789 5437
382 1455 3090
815 4661 6000
2845 4675 6184
2412 2802 5612
1452 4546 6320
2628 2888 5147
362 3915 5810
3442 3666 4755
2054 4036 5025
305 3562 4123
4106 4836 5096
796 1152 2096
958 1329 2122
4439 5432 5802
1689 2298 3816
45 3141 3295
3912 5161 5712
1440 2996 6050
2533 3702 4119
4193 5468 5890
129 1298 4574
3187 3438 4264
1085 1892 4442
457 2552 3594
1340 2466 2781
160 659 2182
641 1612 1826
1063 5226 6345
2011 4735 5207
853 4933 6426
966 4754 6250

TABLE 26

Address of Parity Bit Accumulators (Rate 8/9 - Coded Block Size 64800)

2049 2756 3671 5395
2062 4593 6161 6519
3594 3660 5409 6024
4566 5595 5783 7088
2197 4281 6587 7010
2107 2430 3117 5274
2090 3237 3762 3961
1606 2603 6401 6537
309 1180 1760 3760
126 1009 5264 5809
300 558 2285 2525
3021 5282 5418 6419

TABLE 26-continued

Address of Parity Bit Accumulators (Rate ⅚ - Coded Block Size 64800)

2923 3450 6423 6635
0 1408 2588 4524
582 2368 4008 5411
957 1214 1503 6914
1321 3344 4555 4994
998 1792 4319 4966
519 4925 5921 7124
534 873 3499 4697
578 945 4712 6370
1890 2785 5021 6703
68 3981 5697 6062
354 1841 2857 3267
350 2675 4109 6496
396 4311 4365 5334
5100 5520 6718 6953
1670 2251 2968 4645
1438 2267 3362 3781
840 4252 4440 4835
2117 2756 3263 6959
2397 4592 4930 6336
180 1834 2941 5811
1075 1265 3295 5046
371 949 1704 3804
712 2402 6678 7163
2996 5227 5939 6174
1314 3045 6029 6180
1357 1588 3946 5524
1619 3630 5642 7165
523 1284 5809 6374
1037 2350 3499 5006
450 754 3228 5304
61 1511 3994 5371
5008 5057 5920 7067
872 5505 6243 7060
1950 4250 5059 6284
1530 2449 3873 5981
3594 3941 3993 4476
1071 2100 2959 4081
1408 1503 3668 5595
62 4403 4904 6819
248 650 4973 6699
1177 3464 4504 5642
6 1346 3086 5537
2525 4542 6832 6995
2044 2426 2980 6815
1641 2695 3699 6351
2480 2723 6032 6942
562 2056 2600 3465
311 2303 4701
112 5234 5635
530 1388 4324
2156 4941 6375
1339 2518 6760
2549 3803 6776
975 2190 3459
1270 2712 6091
2633 4075 4591
717 6263 6666
3794 4948 5802
852 1759 5613
1440 5404 7008
2904 3916 4213
3488 5772 6874
212 2011 6308
923 1557 2032
3060 4041 5161
3026 4568 7013
370 3262 5202
1896 6264 7194
3276 4049 5925
79 550 1582
4867 5376 6999
2703 3553 6995
827 2135 2502
325 4289 5840
1194 3917 4961
3327 4281 5699
1756 2340 2602

TABLE 26-continued

Address of Parity Bit Accumulators (Rate ⅚ - Coded Block Size 64800)

1487 2239 4541
202 719 5449
2560 2886 4884
459 5990 6597
742 2046 3944
976 4567 5244
2933 4619 5259
3805 5495 6748
1398 6213 6480
1343 3228 6435
4830 6779 7088
1327 1676 5259
340 488 1702
2811 3854 5534
30 1837 5582
579 785 3869
2899 3333 3628
785 2657 4541
971 2749 6480
597 4445 5355
299 1437 2441
2085 4247 6375
1145 4488 6912
1833 3292 4959
3963 6561 7162
2443 3112 4950
1670 3499 4106
5338 6060 6278
3220 5837 6120
2292 5674 6110
352 2557 7127
655 1431 3892
950 3789 5468
2165 5720 6598
367 2196 7138
4333 5153 6322
1579 2361 4996
1325 2123 5720
317 1513 4311
1286 1693 4722
3066 5803 6995
2888 5376 6535
1875 2817 6013
2553 4671 6228
961 1839 4361
4104 5800 6762
233 3178 4110
800 3507 4766
3539 3669 5388
585 3512 6134
1666 4308 5458
112 4239 6625
110 3973 5250
3298 4395 6336
2354 3379 3711
210 459 1563
2426 3198 6308
1786 3216 6566
586 2233 6149
3278 3784 4918
1167 1843 6728
1411 3084 4696
1165 2050 4655
2147 5642 5955
2827 4333 5671
1021 5092 5872
620 768 6058
2583 5111 6915
3860 4766 7032
876 2834 7114

TABLE 27

Address of Parity Bit Accumulators (Rate 5/6 - Coded Block Size 64800)

214 1287 3599 6203 6732 8430 9194 9395 9980
1994 2299 4496 4929 5365 5467 5843 6676 8669
2304 2633 3344 4927 5414 6989 7952 9334 9950
1189 1789 2261 2650 3036 4827 6167 7373 9965
992 1133 2522 3853 4977 5278 7483 8206 9230
53 3258 3647 6282 7168 7432 7961 10198 10799
549 1014 1300 4660 4859 7493 7834 8428 10330
435 1379 2897 3293 6178 7642 8384 8661 9720
1844 2609 3924 4101 4912 5290 8307 9089 9411
32 3899 4047 4952 5210 7160 7800 7944 10479
501 1282 1612 5682 6026 8191 9819 10430 10516
556 4506 5254 5500 7675 8450 9389 10255 10701
1723 4051 5530 6927 7833 8298 9041 10424 10643
188 1424 2420 3365 5047 6245 6615 7521 8232
265 1072 1787 2257 4495 5961 6198 9058 9402
236 1138 1815 2696 3214 5306 6634 8592 10173
529 1184 3160 5116 5730 6119 6497 8182 8536
43 922 1479 3406 3836 4130 8455 10196 10528
692 5108 5734 6146 8897 9105 9662 9961 10742
632 3323 4475 5450 7253 8169 9288 9731 10628
4 936 1597 3475 4654 4998 5410 6786 8141
18 424 2199 3817 5917 6701 6847 9168 9436
1669 1947 4208 5007 5857 7067 7850 8740 10008
1951 2758 3548 3619 6060 7068 7628 8800 10408
1606 1858 3799 4297 4433 6323 9927 10420 10647
741 2877 3077 3893 5825 6438 7156 7234 9368
2737 3159 4054 5831 6498 7157 7276 7571 8910
376 908 1908 2462 3031 3988 4464 7283 8778
987 1902 2379 2543 2951 4319 7857 8643 9520
966 1719 2014 2473 3225 4552 6774 8760 9544
5031 6470 10479
5483 7147 8908
2987 4043 9531
2490 3786 8463
2641 3703 8786
342 4576 8364
2894 5906 7978
2212 2892 3662
30 1264 6077
5087 6982 8946
699 5800 10701
627 4350 7062
747 2198 4497
1539 8017 9640
2146 6630 10573
60 4159 6739
428 5711 9203
6650 9315 10101
5298 7993 10192
2031 2726 8602
1553 6178 9771
1964 5248 5667
745 6339 9929
1088 3316 9783
880 7367 9536
4840 7763 9250
3429 7754 10209
2690 4781 7598
1422 4058 7546
1441 3387 7262
3064 3941 4027
1166 2919 4966
214 1688 6563
4848 7445 8724
1085 8334 9687
7210 8968 10531
1380 1992 3748
7145 8003 10575
4408 8357 9875
278 3029 3784
277 2495 8171
5166 6104 8529
4799 5228 9084
5391 5830 9757
3315 5989 6217
3276 5475 9632
7014 9320 10243
823 8272 10248
783 7690 9959
2816 3970 8732
2794 4387 6479
3324 6192 7225
1701 4453 5609
810 9036 10384
637 6817 7056
2303 2754 10582
1793 2269 7771
2105 4256 5584
702 2057 7844
692 6581 9446
2820 6317 8314
958 1639 6298
2814 3558 7028
4275 5027 5715
6036 7021 9687
4642 5440 6751
3192 3867 4810
992 5736 8424
1756 6605 9514
1819 4087 4950
2113 7082 9867
1763 3762 4068
4360 8056 9032
656 5807 8379
3064 4655 8930
2877 3320 9505
1255 9232 9761
3708 5287 9219
2182 6351 8801
968 6048 8826
1867 7725 9908
2935 7539 8128
323 607 10701
83 3287 5241
352 6761 10091
1140 5277 10408
655 7334 10660
1278 7271 8113
2515 7564 10307
2183 7827 10788
739 6672 7442
2430 8693 9658
211 788 10694
1188 6340 10064
3273 6890 9455
5164 8796 9938
619 1487 9872
577 6316 9134
2929 4828 5650
3536 7557 8995
1445 6562 7647
3770 5525 7910
3883 4543 9429
248 4857 10091
768 1997 2820
2180 2996 8401
2239 3521 6476
3987 4687 10188
90 6658 8634
1100 3621 3977
3969 7344 10605
1473 7069 10558
2917 5784 8427
1816 5508 8015
2823 7668 9330
428 2534 6106
1431 1909 4632
4542 5877 10409
5075 8151 9244
5127 7046 8018

TABLE 28

Address of Parity Bit Accumulators (Rate 4/5 - Coded Block Size 64800)

1817 3054 3488 3751 6890 9140 10502 11378 11868 12275 12936
89 1422 2236 4571 7578 7924 8512 9841 11152 11710 12163
1594 1810 5237 5879 8395 8758 9026 9510 10850 11269 12504
95 2174 3644 6691 7843 8008 8793 9672 9822 10706 11883
476 913 1307 4253 4779 7094 7769 8067 11781 12260 12888
468 1587 2359 2574 3003 4914 5729 6998 8109 10577 12728
63 955 3518 4330 4813 6145 6717 8288 11362 12139 12398
3574 5338 5719 6564 7926 9411 9738 10573 11384 12585 12653
80 1484 3563 3641 5022 8702 9886 10212 11794 12028 12872
437 982 4635 5280 5971 6780 9604 10377 10863 11315 12260
2194 3066 3302 3898 4234 5128 5486 7405 10533 12046 12837
46 1156 2937 4281 4490 5381 5479 6007 6387 9396 11775
188 2285 3734 4624 6268 6829 7001 8405 10446 12400 12783
346 668 925 4282 5327 7520 7817 9313 10570 11825 11996
1467 2279 3713 4516 5065 6797 7107 8644 9652 10181 12218
1578 3175 3572 3728 6761 7874 8342 10059 10108 11367 11823
980 2624 4486 4915 5812 6862 7858 9215 10201 10922 11261
1268 1932 2258 3530 4265 6280 6919 7770 8412 10225 10875
1616 2859 9569
640 1570 6438
1087 2148 7242
1103 3185 10259
375 1316 8620
998 9881 10833
807 2869 9225
4067 6069 9030
2052 2650 10005
3972 5589 7258
5823 8891 9002
4846 6300 8921
5721 8655 10955
2046 3235 8170
698 2007 8170
2859 5824 7244
2550 5723 7215
4847 6343 7305
2105 6124 11240
1124 1938 3181
6289 6924 10699
1686 8088 12123
3064 10067 11948
6393 7637 9716
3215 9559 10253
3615 8261 12704
3857 5906 12451
6657 8720 10939
331 2123 7912
623 6582 12185
4308 5148 7350
474 4404 7275
8141 8758 12871
1452 5399 11009
2705 10291 10869
856 2785 12538
1254 3656 6705
1332 7476 11775
2496 5237 12796
830 8732 9436
4501 9115 11855
747 2833 10559
4825 9111 10709
3322 4838 7631
3334 5714 8624
1625 2248 10401
2220 9932 11602
153 4580 12491
6877 9144 9766
3275 4178 11366
4784 6097 7097
4223 5572 8471
329 5500 8464
409 6085 11403
976 4542 12885
1314 7136 9557
876 3109 10866
5194 5950 12311
1729 1990 4996
5868 9658 11497
2492 3252 4058
3266 5373 11134
1518 9489 11357
1319 2447 7169
2443 9842 12756
6948 8482 10132
5548 10188 11787
5055 7735 8385
399 7891 10182
2872 5928 11928
8103 8467 11981
333 11709 12110
1778 5003 10559
4284 6383 12297
1384 7374 11087
3119 3240 8171
1057 11199 12906
5564 8692 12291
8086 8824 11655
4431 5009 7525
2024 2709 7894
7349 8668 10028
143 9918 10502
136 3778 4492
715 4125 6553
3704 6505 10477
3836 5737 6592
2652 6152 9059
1985 3081 9000
611 6229 9123
5299 5444 9951
2537 9840 10862
2410 10471 11971
10221 11129 11718
9313 11077 12924
4733 6403 8554
3461 7033 10336
4815 6292 11823
5173 6984 7388
1728 3079 7734
242 2085 3327
2018 3217 9375
7067 10017 12906
3270 8294 11412
7757 12061 12664
3172 8248 12497
523 3999 4708
5994 8202 8401
498 4083 11935
4557 5092 6119
871 1887 12341
4612 7572 8164
2333 8759 11268
4449 9350 10409
6610 8814 10553
2219 6761 9503
1041 1336 1635
2607 4127 12437
640 1047 6570
1246 1558 2530
5689 6006 11652
1141 6211 9170
91 7545 8808
3618 7244 10595
292 3726 11289
3855 5480 9570

TABLE 29

Address of Parity Bit Accumulators (Rate 3/4 - Coded Block Size 64800)

1760 5736 6289 7119 10593 11012 11496 12025 13422 14631 15154
15673 164 1100 2695 3317 3653 4302 7667 11415 11619 13880 15436
16050 1798 4091 6449 7366 7671 10967 12595 13629 13966 14443
15223 15611 257 3408 3732 4255 6895 7345 7743 8849 9020 9850

TABLE 29-continued

Address of Parity Bit Accumulators (Rate ¾ - Coded Block Size 64800)

10986 13188 70 1455 2981 3365 4050 5044 6202 10072 10204 11606
12669 14768 3442 3685 3992 4326 4898 6793 8840 10582 14008 15061
15727 16033 2719 2917 3500 7784 7966 9057 9474 10303 13882 14234
14619 15245 358 1409 4373 6036 6255 7719 8372 9901 11377 12136
14297 15856 1310 2865 3153 3872 5675 8007 8333 10705 12144 12744
13726 14361 856 3445 3922 5407 6218 7163 7747 8997 10762 10825
12929 13859 891 1579 1912 2609 5373 5670 7097 9162 9678 9912
10356 15425 625 1387 3199 5183 6621 8984 9526 10345 11699 12574
14743 15124 1742 1987 2391 4667 6117 7258 8405 9868 12463 12994
13483 14267 358 594 1887 2555 8155 9537 9885 10328 12711 13234
14450 15773 860 2486 2800 4768 5233 6000 6722 7266 9136 9652
10100 14784
498 5911 8999
5609 11076 12022
2133 9167 15546
8543 12322 15688
3797 10622 12643
5701 9273 13284
2080 6582 13468
2213 7188 14413
661 1020 15912
811 10657 13443
4141 8200 14159
4339 12968 14909
8170 12226 13434
1073 2241 13160
1128 1835 6989
2931 12449 14377
153 2987 11746
687 11918 15905
5921 9434 11859
2516 5393 11701
1329 12412 14801
5762 7932 8496
702 2276 6428
4360 8416 8830
4849 11516 15858
1666 4913 15031
5088 7537 10862
4535 4923 7243
4802 6622 11323
6523 11319 12635
6176 11036 14971
3326 3995 12286
1763 2765 5759
4840 7736 13622
13588 14213 15892
3018 4027 12553
3025 5092 11688
4289 6084 10428
2367 7460 11358
6209 7415 8678
1617 4863 10623
8931 10797 13847
7259 8904 14244
1409 11923 12890
6304 12408 13132
41 7821 13459
6022 10056 13846
8363 11395 16119
7065 15388 15794
5891 8064 11461
5695 9159 15426
2329 4675 16050
2041 12119 15695
5499 9713 15791
655 10137 11619
1896 4703 14660
5204 6886 10810
5133 10666 13767
2828 3812 11725
10934 14068 14604
2360 9460 14878
8060 9050 12993
303 14652 14887
6859 8555 15203
3667 7971 9209
3906 6498 11984

TABLE 29-continued

Address of Parity Bit Accumulators (Rate ¾ - Coded Block Size 64800)

2997 9700 12935
115 7751 8359
2058 3573 10188
648 1315 13058
602 9890 12654
988 1778 9843
2564 3529 6744
972 4602 6484
807 1302 4343
4196 6634 13931
5962 12749 15238
9661 11863 15553
5675 11586 15637
1167 12382 13040
7 5049 9141
8139 9994 11767
3401 7610 13054
541 8910 13153
5173 8362 14231
3018 6572 10557
5245 8559 16096
663 1594 12876
3325 4490 12417
2573 14222 16104
2466 3120 13939
2240 4656 15279
717 3102 12604
734 4505 14156
1152 1815 5691
1126 12352 15553
3594 10949 11900
2275 6381 10326
99 10188 13327
2655 14519 15909
991 1850 12173
7052 10172 13789
6056 6395 15366
3907 6202 12054
4804 11472 13436
7146 7900 14798
3674 8102 9375
4077 7423 11380
306 11199 14687
2879 7603 14956
1569 3781 9492
1663 6808 14985
4897 5766 10659
4086 7472 7992
4868 9749 13476
7079 8892 14719
2029 8392 8642
949 9330 10964
9296 10742 11015
5686 7483 9968

TABLE 30

Address of Parity Bit Accumulators (Rate ⅔ - Coded Block Size 64800)

186 2705 11911 14746 14866 19054 20583
589 2493 5010 12476 14348 15395 19934
3080 4591 7819 10713 18428 18772 20882
2768 4190 4529 5656 7331 18496 20932
2339 3987 5445 6511 15705 16316 16766
1295 2179 11422 12912 13250 18457 20138
4303 6701 8649 11078 11809 14451 17240
3942 7841 8254 8668 9925 18788 19387
1418 9303 10257 14548 15808 17149 20716
777 6711 10002 10711 12550 17952 18446
1581 2148 5630 6397 8165 15108 16517
1173 1911 4755 8232 11675 12224 14445
2573 5706 7295 13171 13467 15691 20519
544 3371 3803 9894 10663 13295 17349
2903 9162 11813 12604 13528 15554 16639
1885 10990 12657 13183 13956 15403 17674

TABLE 30-continued

Address of Parity Bit Accumulators (Rate 2/3 - Coded Block Size 64800)

4435 5234 7142 8315 16582 17274 17470
945 2640 5938 6344 7639 10356 19633
3557 4866 9995 18249 19954 20391 21054
603 2541 4772 5153 7110 7471 8080
1765 4778 10022 11673 12545 17802 19483
980 1173 4386 9288 15145 17227 20934
200 3139 5585 6068 11242 13092 19481
6282 7238 7979 10200 14602 17038 20545
8869 10185 10856 11403 13791 15670 19237
3489 6615 11829 14125 16528 17782 20100
632 1062 4084 7445 9718 18831 21283
3541 3991 10093 16067 19007 19373 20621
3384 6000 6869 8715 10800 11910 16145
2052 8353 9453 11515 16036 18212 21519
6028 7063 7740
2917 5857 16345
5223 8453 11937
6444 9067 18083
9142 13670 20123
2370 5200 16404
823 1854 18333
6791 12202 18118
2373 10455 19524
1234 11042 11405
493 12359 19781
1448 14380 16865
5050 6343 21344
10604 14808 17544
8482 15289 18443
8993 16807 20689
1520 13400 14306
12731 14799 15930
12550 13324 14361
7113 14024 19136
3193 7614 12672
14982 17679 20412
4557 17527 20284
314 15256 20920
1516 9522 13718
3911 9656 13870
180 8572 15928
3848 9380 19334
186 20241 21301
3762 17533 21593
2500 8094 20116
4822 15317 17920
4883 7241 19226
1513 17294 18444
13197 14416 21397
6420 13981 14678
118 3981 8018
3655 8742 16735
1978 6412 15584
9679 12837 20027
15535 17421 21258
1206 16712 21219
2491 4233 6564
7971 10528 11712
10592 12847 16156
5295 13708 16655
6070 15542 17706
5712 5981 8432
1408 1968 2251
2617 3499 15856
15339 18614 18850
2724 4249 10874
3092 9614 11876
1048 10613 14312
5129 18541 19036
8603 11165 20068
938 1263 17272
7272 14649 15341
3111 14296 18913
8459 11613 17541
10334 10899 12365
396 4594 7000
7656 9120 10070
12079 13628 15008

TABLE 30-continued

Address of Parity Bit Accumulators (Rate 2/3 - Coded Block Size 64800)

16480 18347 19548
2082 20174 20525
3912 4927 12697
13030 13930 20406
5566 19268 20942
6576 11255 13410
152 17852 20802
1562 15044 17236
216 7491 13354
3128 6493 7054
1448 9525 17085
14307 15029 21560
5360 13103 21047
9305 9901 10103
3306 5451 7165
709 12054 16399
3800 4646 12177
2824 3523 15961
900 16239 19378
6314 11295 19778
10055 10113 12317
4530 19691 20332
10923 12532 18027
644 7838 9011
5932 8840 20595
7870 8667 18005

TABLE 31

Address of Parity Bit Accumulators (Rate 3/5 - Coded Block Size 64800)

11321 12093 14740 17157 17595 20195 23259 24646
11 2432 8805 10373 12516 15842 19698 24066
135 2803 4080 10491 16241 16758 17748 19867
2099 2993 10236 13026 13786 14200 17299 19957
75 2778 6647 8553 10132 13861 23999 24170
1658 3252 4357 6701 7187 13646 19015 25712
2001 4424 10467 11353 12918 16937 21896 22829
6358 7559 10402 14888 15995 17271 20484 22169
2000 4467 7863 9989 14311 16241 23410 24873
1361 3974 5222 10532 10984 17694 20378 25468
1544 7077 10921 12059 19923 22020 24017 24988
3513 14006 14377 16519 21006 21755 23229 25366
15 1247 7113 8215 13179 21142 23839 25245
5640 6141 7024 7418 10598 11979 12587 14298
1945 6827 9994 11500 11888 17446 21492 25439
7773 9202 9531 11080 15728 16419 18092 23716
407 18370 18793 20991 21559 22401 23755 24267
902 3720 4773 6030 11856 15252 19226 20853
1761 4079 12622 13351 16895 19802 23716 25765
1097 3637 6487 11788 12644 13436 17822 25663
1140 2231 3054 5975 11667 12902 13310 23022
4542 4795 15063 17421 17990 18608 21208 25716
5957 8403 11533 16178 16590 19337 21936 22010
939 5012 8468 11512 13595 18980 23151 25171
5857 8639 12470 18486 18782 19268 20531 25158
2945 5413 7244 12571 18305 18658 22658 23030
8975 9144 9984 13118 15061 19436 20308 22959
1462 7201 7652 9076 16674 18216 24160 24593
2183 2870 8206 9391 15293 22608 23163 24181
2498 4728 5065 8998 10844 15172 19603 21473
5105 8919 9457 15378 16040 17164 19450 22550
2858 3726 4027 8058 9458 13970 15544 22251
541 924 5642 6425 7937 14699 15484 21840
378 3495 7676 9280 14688 20727 21482 24745
9837 14747 14931 15632 18040 19755 20574 24585
588 857 3129 3258 3613 5087 5545 6154
8203 12127 12848
14077 15922 24447
2906 21236 22074
2092 4829 17082
4295 5675 18564
1681 15114 24211
341 12877 20467
323 17818 18380

TABLE 31-continued

Address of Parity Bit Accumulators (Rate 3/5 - Coded Block Size 64800)

9271 14655 22658
1471 13161 13320
289 8845 25307
533 15353 21423
3142 11533 20028
1933 3693 4375
7338 19500 21282
10422 11066 24968
1343 7027 18665
1356 7515 14602
6284 17691 20657
3297 10391 24693
11426 20934 23813
19342 19725 21530
10923 16535 23406
4889 24913 25283
5050 10818 12236
7074 19102 21017
5886 16748 25712
5584 6358 22353
10354 13346 15312
3375 9935 25495
4997 11522 15270
4468 18734 25869
9392 17056 22069
2236 7876 22925
4640 6011 8753
10020 21852 25599
7363 8030 24591
6288 6865 20673
4130 5835 19386
3051 10706 20518
3768 6484 23644
15847 18340 20440
2115 14190 18267
14639 16843 19917
10055 23506 24520
6818 12446 15040
1243 5642 22144
3829 13321 13867
10510 19526 22746
628 15857 16637
18343 20836 23351
849 3411 22968
9062 17694 18998
6660 8542 13719
2757 8726 11729
8089 10673 20091
1691 8446 21849
9096 14789 21754
14137 18816 22399
893 2430 24423
4109 13856 17456
8280 12805 24063
488 12106 12282
2457 9509 15757
9411 11511 16932
11352 16346 23973
5377 16529 24978
782 5090 7808
13317 15836 23080
7847 12471 15669
2543 13225 17284
2661 17549 23285

TABLE 32

Address of Parity Bit Accumulators (Rate 1/2 - Coded Block Size 64800)

3111 10821 12690 21446 21936 22833 27169 29136 31422
3864 7321 13358 14931 17859 19350 22505 22724 29342
1776 4735 5405 6757 10722 14671 22344 26656 29357
459 5147 14564 15500 22996 23742 25375 27615 30450
39 2020 2938 7612 12329 15698 15902 25163 31344
6647 8249 14871 15478 22091 23395 24971 28606 31269

TABLE 32-continued

Address of Parity Bit Accumulators (Rate 1/2 - Coded Block Size 64800)

2922 10356 13860 14238 22025 23586 26446 27232 31239
5436 6084 8594 10547 12720 14591 16454 26434 32185
2710 7917 10870 11726 12755 14599 24958 27996 28218
486 4934 5284 12406 14723 17460 23403 29725 30963
347 1169 3982 8271 8662 15028 18174 25459 31413
876 1312 2565 7422 10788 11931 16541 18283 23574
90 7129 8288 10792 12326 19925 20242 23116 30201
6470 13138 14268 17835 20001 20315 22200 25985 27855
1112 12000 12355 12793 13064 14036 28038 29518 30365
5814 8048 8312 9008 13571 16110 26199 31241 31486
3042 4178 5196 10280 14074 19558 24789 29667 31873
1454 5389 7107 7543 7862 16024 16626 17490 28242
2044 5054 10355 10824 11440 12775 15710 16297 27461
6029 9526 11735 22611 24555 26819 28137 28825 31324
1021 5580 6702 7823 18869 19850 21862 28725 29352
5706 6585 8712 11948 21714 26302 27152 27420 28364
2404 3906 4797 6227 8259 10754 14230 28897 30151
2240 9684 12342 15800 17252 19282 20858 23539 27301
4538 5033 5728 13970 16527 17614 19575 29978 32092
2354 7290 9783 13771 15981 22928 28083 30097 32322
135 2737 7742 9051 9599 16013 18075 24173 31256
1056 9731 11337 15201 21705 22111 22331 25134 27614
3390 11099 13353 18555 20915 23865 25697 29332 30761
3330 4535 16747 16939 18532 18954 20854 21064 21406
11022 12187 15275
3883 8843 22303
17714 21104 27550
3562 13705 20167
329 3338 16387
11592 18421 30914
6566 17134 26143
24607 26923 29562
4806 8465 15423
1088 30544 31855
1832 3806 27250
7337 20964 21323
18580 22620 29095
13386 21101 32396
13262 25229 30015
10150 12199 25755
3556 18602 30378
3905 8082 24259
17251 18773 24705
6133 8450 17854
1074 9896 26078
11372 23996 25612
9603 28654 29625
4304 16791 20819
3161 8835 24541
15186 16924 27847
8957 9805 26249
13286 20209 30933
10413 18729 29543
5912 28899 30687
2479 17644 20863
1901 6239 9157
1524 19166 25761
6363 15526 19685
14219 15047 20662
15079 17594 19410
25330 27868 32037
793 7156 19618
20323 21339 23201
2358 5863 9534
4079 9184 22987
4490 16838 24186
11175 11670 28552
4137 18732 25266
11812 19809 23870
1430 9775 26754
11447 18070 21285
1686 4676 23221
9096 25011 28651
619 23154 26495
1731 30544 30849
24449 26990 32018
2085 2668 19271
612 4434 19612

TABLE 32-continued

Address of Parity Bit Accumulators (Rate ½ - Coded Block Size 64800)

13258 13475 25651
2546 16649 23874
18224 23943 26533
454 24290 32166
7013 21848 31936
7119 17485 20152

TABLE 33

Address of Parity Bit Accumulators (Rate ⅔ - Coded Block Size 64800)

3297 6933 9162 10693 13628 16986 21668 24076 27719 34685 36422
37739 4652 4971 7019 11188 11972 14893 22173 25272 30894 31959
32110 32910 33 2031 3088 5881 6560 7368 12348 15738 19440 25780
29541 36439 4838 5721 20883 21606 22567 22986 24682 25476 28059
28329 32101 34721 3910 5188 6809 7103 8947 15790 17739 20635
23085 25564 29622 33785 754 7097 11883 13104 26248 29038 30443
32405 34759 35136 37093 37672 1707 16575 18649 19982 22302 22594
24413 24650 24863 27001 30158 35491 11590 14788 17345 18420 25603
26066 27769 29284 32938 34185 37362 38026 1191 5551 6047 6440
7220 19670 23562 24767 28850 29605 34642 36747 73 3562 4812 5485
10606 17058 18823 19886 23862 33399 35836 38303 148 1992 5102
10987 15393 18180 20481 20736 26419 28466 31129 33882 1557 3055
3864 9232 16927 17532 20398 21135 23488 28675 37064 37164 2299
3015 7708 8554 10042 13328 18143 18530 19261 27909 34018 37935
847 3011 10137 10590 16671 18094 22798 23767 26705 28042 30499
37945 7459 10256 13212 15953 18091 18994 19811 21830 24229
27062 30608 31698 4291 7727 9723 11579 14429 17901 19968 21353
21669 24945 26048 37260 8562 10389 14937 18581 19549 25603
26485 27174 27436 31927 35525 35984 313 8332 10393 15540 17894
19646 23002 27585 29791 31986 34296 36379 1702 2421 2618 12062
16028 16335 16941 17977 29478 30317 31110 34407 2160 5891 12839
14343 19004 19409 21422 25504 26798 29009 31299 36959 4274 6690
11683 12511 16512 19286 21483 23227 22800 30618 34963 38195
4201 8747 9890 23136 23655 25057 28985 31586 33091 35202 35524
35802 672 8275 9499 11040 12791 13807 28193 30610 33814 35232
36151 38784 474 1284 2527 4342 6449 8196 9405 11420 13704 14180
14622 15412
2624 29511 30469
6464 9577 23494
5287 12022 37078
2430 27323 29341
11446 16533 21979
1515 4931 15026
14283 28529 37489
6187 8185 38253
3590 12342 38608
4265 24259 25368
4430 9081 33466
3617 35591 35696
6589 14391 19353
442 5510 29991
4540 9738 10838
3668 24706 26339
1068 34334 38759
9514 13852 14717
8103 28428 38419
32505 37656 38114
1273 15352 21066
731 16322 36602
1316 8670 31632
1883 13552 17631
21987 24366 34050
1975 7839 12747
5878 33159 36329
8921 14451 22488
15497 25044 36004
22413 28126 32363
7540 12285 14033
13658 16177 31025
33068 33557 38569
7758 10893 21031
11470 22993 34436
10747 13227 28666
11552 20439 30092

TABLE 33-continued

Address of Parity Bit Accumulators (Rate ⅔ - Coded Block Size 64800)

2727 9297 26837
399 26517 33759
3340 20692 36108
15419 20712 27403
13303 16716 23361
26065 32482 33457
8336 19015 20421
15940 17475 32359
12953 21349 30059
5348 16562 31348
26830 31400 32657

TABLE 34

Address of Parity Bit Accumulators (Rate ⅓ - Coded Block Size 64800)

2157 7955 9237 12284 15020 21866 26422 34666 37352 37649 40586
41640 2448 14737 15550 16081 17094 17625 20941 25888 28556 30985
37172 37835 15 8525 11078 14053 16293 19293 24791 26407 27582
39222 40665 42625 1375 3933 17007 22218 26176 29045 33156 34027
35634 36351 37899 38537 3834 4701 5234 11773 12241 15776 22750
25325 31725 34901 37942 39619 131 7591 10089 17781 28087 28457
29129 34492 34839 37106 38744 40179 436 13828 15551 17812 18220
19395 21501 21626 27152 27767 38852 40888 540 11011 11679 20209
21034 22605 25164 27269 29337 30522 31373 36883 2543 3173 7364
8241 9312 9758 17052 17964 30221 31992 34465 38515 5215 5805
11147 12748 21633 22899 23290 23728 24307 33389 36827 40040 6286
10490 11914 13545 20483 26178 27262 30138 32686 33700 39563 42394
467 1041 2435 11535 12476 13551 18023 18376 23405 30912 35507
42404 2199 3140 7331 8280 10562 12024 25005 25275 29030 30212
36319 38314 2154 6304 7076 8838 9473 20932 23170 26489 28564
32024 42165 42929 1799 3518 5196 8564 9091 11222 12922 23435
24958 26673 36880 40908 7283 8671 12840 14171 17366 20117 26736
30930 33455 40993 41143 42874 296 4975 5566 8182 8757 9456 28414
29216 34949 38307 40102 43111 6916 7794 10169 14680 15377 15966
20826 21311 22927 32352 39039 42681 976 1259 1729 2864 5589
10515 13418 16261 20645 29477 31036 32960 4158 4535 6826 13129
16597 18952 19609 23900 29625 35992 36644 42109
3832 31315 35811
14289 33747 34952
3565 5878 27411
1024 26178 41783
18863 27617 35897
18834 30626 36715
10201 34187 41196
7800 19919 34976
3510 26951 32912
24819 25731 29630
2703 25366 32046
23853 25668 32622
4294 16030 37743
9417 12037 18132
6190 16478 29644
11516 23198 36470
1792 13080 20405
5570 22207 23944
7082 19308 32227
14027 15050 32862
9767 15020 34431
3168 24560 37568
4416 19904 21514
4088 22431 28406
16894 28072 38951
4452 30580 41428
4884 16851 33758
6736 32730 39284
6101 39673 41788
13079 39346 41111
11346 15217 33923
20796 22368 36184
14741 30445 40480
13894 17431 27939
35318 39772 41661
18691 19729 24200
15454 31656 42660

TABLE 34-continued

Address of Parity Bit Accumulators (Rate 1/3 - Coded Block Size 64800)

1386 6793 24331
9893 22002 31360
2069 18590 19794

TABLE 35

Address of Parity Bit Accumulators (Rate 1/4 - Coded Block Size 64800)

407 1429 6319 18004 18662 20568 23535 24031 28882 36124 38892
41880 4223 5536 10333 16475 20735 20954 25347 26862 32235 36257
42827 48304 8161 11446 13040 13661 19722 24632 27008 29029
32746 40449 42030 45883 9899 12505 13916 18635 22605 25914 32903
39146 39661 40372 44350 45823 8074 11266 13787 15452 21319 25518
25892 26799 40269 41320 41665 48438 1489 8464 9203 15278 16613
18235 26387 29744 31948 32293 35378 46447 122 1365 4344 7853 8453
24475 25034 28298 28718 35347 36473 40014 2485 4555 12437 18736
20994 23449 30387 33800 35867 36980 43101 46693 1654 3284 5191
11122 13092 16366 22522 22933 28511 29977 37120 38428 2362 6555
10708 12679 14474 20301 22230 29510 38500 39610 43175 48173 3678
5189 17724 19148 26279 27265 30034 33819 37195 42327 46261 47137
572 4115 7440 9690 11879 14861 15577 22163 32927 43761 46260
46925 3504 9628 10218 10694 11795 20016 23062 24390 31075 31419
33120 43388 1065 1994 2867 3148 5022 6019 7191 8667 12009 14190
16097 17095 17594 21917 27700 27977 30813 33953 34373 34911 35152
37725 38153 38708
7292 31185 42413
2710 25038 27784
35910 36713 48159
24092 36740 38594
6108 10842 34900
14373 16000 24603
1065 17856 27441
3072 33982 43211
210 14879 19713
6222 16708 31602
15679 22926 29610
18859 32651 37802
2010 5677 21606
19985 35082 47221
6656 37684 44496
12919 14510 42727
13439 21553 47800
9340 40814 43721
6892 8839 31686
11896 34323 47500
26624 33369 44968
20262 26137 43948
3892 9900 29429
4740 39439 45622
39274 41553 47703
30819 41225 44970
7879 28439 45392
17023 17635 44279
30598 40951 45118
19335 23107 45091.

7. A method according to claim 3, further comprising:
encoding an input signal according to Bose Chaudhuri Hocquenghem (BCH) codes, wherein the output LDPC coded signal corresponding to the input signal represents a code having an outer BCH code and an inner LDPC code.

8. A method according to claim 7, wherein the number of redundant BCH bits is $n_{BCH}-k_{BCH}=192$ and error correction capability of the BCH code is 12 bits.

9. A method according to claim 3, further comprising:
interleaving the output LDPC coded signal using an interleaver; and
modulating the interleaved LDPC coded signal based on 8-PSK (Phase Shift Keying) or 16-APSK (Amplitude Phase Shift Keying) modulation scheme,
wherein the interleaving comprises writing the LDPC coded signal into the interleaver column-wise and reading an interleaved output LDPC coded signal row-wise, from left to right, and
wherein if an 8-PSK modulation scheme is used for a code rate 3/5, the interleaved output LDPC coded signal is read from right to left.

10. An apparatus comprising:
memory configured to store information representing a predetermined structured parity check matrix of a Low Density Parity Check (LDPC) code for encoding information bits, the information representing the structured parity check matrix being organized in tabular form, wherein each row represents occurrences of one values within a respective column of the parity check matrix, wherein the columns of the parity check matrix are derived according to a predetermined operation based on the respective rows of the tabular information;
an encoder configured to encode the information bits, and to output an LDPC coded signal comprising the encoded information bits, wherein the LDPC code is of a structure that facilitates use of a plurality of parallel engines for decoding the coded signal;
wherein the encoding comprises:
initializing parity bit accumulators to zero;
accumulating a first information bit in a $j^{th}$ group of M information bits in an $i^{th}$ parity bit accumulator if the $i^{th}$ entry in the $(jM)^{th}$ column of the parity check matrix is 1, where j=0, 1, 2, 3, ... $k_{ldpc}/M-1$;
accumulating the remaining (M-1) information bits m=jM+1, jM+2, jM+3, ... (j+1)M-1 of the $j^{th}$ group in the parity bit accumulators according to {x+m mod M*q} mod($n_{ldpc}-k_{ldpc}$), wherein x denotes an address of the parity bit accumulator corresponding to the first bit, jM, in the group, and q=($n_{ldpc}-k_{ldpc}$)/M is a code rate dependent constant; and
after all of the information bits are accumulated, performing operations, starting with i=1 according to $p_i=p_i \oplus p_i-1$, i=1, 2, ... ($n_{ldpc}-k_{ldpc}-1$), wherein final content of $p_i$, i=0, 1, ... ($n_{ldpc}-k_{ldpc}-1$) is equal to the parity bit $p_i$;
wherein the tabular information representing the structured parity check matrix comprises a one of Tables 1 through 24 (below), wherein the row indices of 1's in the column index j*M (j=0, 1, 2, 3, ... $k_{lpdc}/M-1$) of the parity check matrix are given at the $j^{th}$ row according to the one Table, and wherein $k_{ldpc}$ is associated with a length of the bit streams;

TABLE 1

Address of Parity Bit Accumulators (Rate 2/3 - Coded Block Size 720)

83 117 156 169 231 126 112 106
120 169 106 27 188 213 22 159
160 121 106 203 196 141 174 135
64 137 226 91 180 85 166 7
82 7 198 148
134 24 9 83
149 160 1 151
74 203 116 13
206 12 101
200 45 98
16 235 165
167 25 171
2 83 33
8 174 207
36 170 207
73 172 86

TABLE 2

Address of Parity Bit Accumulators (Rate ⅔ - Coded Block Size 960)

52 293 211 106 128 87 286 89
224 273 74 99 28 301 142 311
160 201 210 123 252 165 198 183
296 105 10 283 244 317 302 263
289 168 207 267
167 170 141 156
270 266 240 171
89 28 237 158
113 67 118
66 160 22
144 269 180
53 59 121
36 183 238
171 140 314
271 168 42
153 173 31

TABLE 3

Address of Parity Bit Accumulators (Rate ⅔ - Coded Block Size 1440)

140 296 319 355 373 182 329 266
144 169 426 155 348 381 78 87
120 169 242 371 292 13 286 95
280 449 10 371 396 405 78 15
317 42 380 336
254 233 301 60
251 175 218 120
465 147 390 407
387 273 287
120 279 97
404 22 283
323 256 453
182 77 449
90 20 48
466 415 301
474 228 350

TABLE 4

Address of Parity Bit Accumulators (Rate ⅔ - Coded Block Size 2160)

458 368 73 243 357 298 305 695
375 511 575 629 186 130 624 561
297 284 204 637 10 623 195 436
300 433 110 712 401 618 379 608
710 700 390 535 73 478 524 641
456 554 363 400 174 463 249 575
228 542 556 493
30 684 581 225
195 134 61 82
461 45 387 244
91 128 71 246
439 212 274 359
476 394 234
171 501 391
327 528 41
186 62 253
513 295 157
661 152 196
16 490 710
239 257 96
687 710 408
525 160 18
671 331 370
101 68 695

TABLE 5

Address of Parity Bit Accumulators (Rate ⅔ - Coded Block Size 2880)

689 581 139 306 45 371 886 576
864 596 6 651 693 810 770 281
270 557 325 275 561 672 196 22
620 324 77 312 851 642 917 480
375 88 57 746 364 910 527 644
753 823 360 921 218 411 908 190
327 111 217 269 888 307 914 934
785 439 682 171 60 686 959 308
79 103 568 563
337 312 523 352
906 492 471 800
250 867 303 860
287 619 702 706
262 430 9 941
293 225 244 626
629 918 697 381
145 371 102
597 575 280
464 618 388
509 844 631
525 123 362
611 638 271
26 433 548
485 745 726
561 742 125
754 318 457
864 219 632
354 688 116
523 425 552
935 147 735
956 807 610
421 60 142

TABLE 6

Address of Parity Bit Accumulators (Rate ⅔ - Coded Block Size 3600)

157 563 346 756 65 524 238 859
133 475 1007 791 420 858 76 301
284 200 701 389 119 1155 823 1078
812 853 194 459 500 415 346 448
381 418 343 1048 452 724 87 169
402 105 410 511 534 417 676 883
762 170 553 957 559 618 276 41
2 505 486 607 308 389 110 251
1052 834 570 871 69 1124 923 1102
760 445 906 167 68 792 573 254
684 999 752 981
442 651 372 1113
366 204 230 25
1160 426 171 768
909 61 798 10
369 60 174 167
59 915 728 356
655 456 997 967
37 755 113 1045
142 443 934 297
930 1156 502
597 452 760
439 725 889
1093 1100 48
377 511 752
330 817 1155
239 1006 823
522 725 95
871 813 30
92 539 1164
504 545 707
141 714 38
923 874 369
623 904 541
340 756 382
273 661 1195
194 29 931
1008 1178 687

TABLE 6-continued

Address of Parity Bit Accumulators (Rate ⅔ - Coded Block Size 3600)

326 18 927
246 488 976

TABLE 7

Address of Parity Bit Accumulators (Rate ⅔ - Coded Block Size 4320)

1029 1059 593 574 702 1161 695 1357
1081 1333 648 1179 898 1266 88 924
914 633 5 924 1123 291 191 48
113 1434 11 1094 102 337 695 504
348 286 209 712 85 207 748 1340
653 203 1365 377 983 1436 1308 962
1228 319 680 1114 1070 39 307 45
1375 416 1095 982 917 1281 912 434
355 165 527 513 36 655 86 530
313 556 630 1112 1306 851 904 666
44 487 166 565 335 521 699 272
1177 1228 1301 630 10 59 326 639
601 1326 1065 1142
107 1124 1074 1374
469 1262 508 867
525 588 827 209
1105 123 1383 1037
960 992 129 1397
1075 810 1015 1167
244 427 1272 786
44 560 88 787
362 565 688 1365
1066 622 1192 674
727 802 1100 1342
296 801 120
1147 453 1019
800 1332 1139
776 478 1249
1002 1252 862
91 178 1375
375 385 682
1095 51 285
744 187 1343
178 371 415
1119 1325 1332
688 873 494
295 1150 1182
122 733 137
572 981 589
672 1242 914
534 417 277
1288 1070 68
268 1202 884
461 1295 642
335 1384 926
1433 821 27
97 1156 732
1299 1278 593

TABLE 8

Address of Parity Bit Accumulators (Rate ⅔ - Coded Block Size 5760)

956 226 1821 1871 298 767 474 759
199 742 1600 1277 660 1377 145 482
426 300 1141 614 179 1853 1325 1737
602 658 545 1692 708 1146 131 283
1380 557 1578 525 1552 500 1167 594
1907 1319 757 86 1774 238 76 1841
1428 1568 1071 800 875 102 928 791
1021 1503 1654 1747 1688 1329 910 1393
1473 1754 1215 709 1463 295 118 1262
1216 1614 1717 869 769 661 703 1025
1221 932 1345 1510 943 1367 590 333
259 246 1694 1861 592 551 501 778
1774 98 459 1122 405 83 1466 1186

TABLE 8-continued

Address of Parity Bit Accumulators (Rate ⅔ - Coded Block Size 5760)

1542 1072 1405 176 731 704 1609 1115
1320 1803 454 276 247 1748 1899 1630
612 1755 879 1836
695 1118 967 297
1436 30 1222 200
454 926 349 1747
1825 1853 262 1060
1306 50 705 38
1017 1079 516 705
556 1170 624 1143
1370 1533 54 801
51 1483 647 25
1659 1673 764 477
1754 222 858 310
1703 514 692 1381
1578 1769 211 103
1112 378 54 1139
1050 710 670
711 221 1575
1908 101 1705
1006 1085 14
1593 499 1201
1603 1372 74
1214 514 1415
1788 55 393
1102 835 557
513 165 1911
1695 193 990
320 822 1469
518 1260 1266
662 679 65
737 883 1030
642 138 202
97 1539 293
1254 1316 87
238 971 1427
1073 384 1348
447 1502 247
398 997 1467
580 354 1388
236 418 1011
110 656 1583
1291 126 769
849 1756 89
1206 1771 1654
942 99 92
634 226 1559

TABLE 9

Address of Parity Bit Accumulators (Rate ⅘ - Coded Block Size 720)

75 126 40 130 137 104
108 132 7 70 35 95
81 57 97 40 20 125
63 142 128
117 73 110
21 85 125
63 100 83
120 142 134
0 94 113
141 24 70 94 20 143
96 30 43 1 47 104
39 123 13 31 89 65

TABLE 10

Address of Parity Bit Accumulators (Rate ⅘ - Coded Block Size 960)

90 169 14 33 76 59
108 127 8 177 154 119
126 85 116 63 142 11
108 1 86 117 184 191

TABLE 10-continued

Address of Parity Bit Accumulators (Rate 4/5 - Coded Block Size 960)

174 37 44 159 124 23
36 73 20 147 28 41
76 54 47
147 142 121
176 163 41
170 52 1
156 135 122
18 105 113
159 26 155
95 62 163
24 83 7
166 135 187
66 22 62
186 39 58
90 67 110 39 178 107
6 163 104 159 16 71
48 145 98 63 76 173
102 25 104 177 160 155
150 7 110 189 124 113
144 25 80 117 22 71

TABLE 11

Address of Parity Bit Accumulators (Rate 4/5 - Coded Block Size 1440)

264 211 242 129 16 119
48 205 80 63 244 263
216 157 266 117 34 23
138 157 62 69 184 191
54 271 242 255 88 275
84 145 128 219 268 89
127 262 59
148 60 122
80 24 61
27 250 11
75 18 103
278 147 5
63 224 95
201 7 56
213 217 286
42 8 190
42 23 154
42 73 143
84 109 86 63 262 233
126 19 110 207 262 149
210 121 248 279 4 227
264 217 176 99 268 113
108 103 284 225 262 17
42 205 14 129 262 5

TABLE 12

Address of Parity Bit Accumulators (Rate 4/5 - Coded Block Size 2160)

281 315 114 116 176 342
362 150 317 33 131 280
431 137 422 154 68 176
53 391 168 258 17 139
188 69 199 0 57 38
219 108 429 335 414 385
234 323 180 309 39 56
162 3 340 189 214 359
408 9 30
221 305 174
341 208 410
202 272 267
378 165 395
4 383 377
228 15 35
356 86 223
79 225 194
91 314 254
366 393 251

TABLE 12-continued

Address of Parity Bit Accumulators (Rate 4/5 - Coded Block Size 2160)

338 181 425
79 29 152
84 72 125
372 63 256
43 204 422
390 59 200 429 351 265
408 118 106 173 68 305
16 233 390 415 219 244
106 251 428 70 311 216
82 413 59 342 337 76
114 357 215 352 174 425
138 83 12 373 287 24
1 50 203 252 85 239

TABLE 13

Address of Parity Bit Accumulators (Rate 4/5 - Coded Block Size 2880)

111 270 437 502 215 181
115 18 330 442 508 57
201 182 392 492 206 124
189 451 399 501 403 32
200 229 331 351 294 55
263 94 539 298 378 475
362 562 320 395 357 540
452 399 202 419 449 393
541 128 462 256 527 206
165 533 465
29 163 494
388 102 474
361 183 11
355 539 347
69 565 162
160 473 76
432 508 35
117 527 385
556 514 422
556 289 534
385 572 3
66 303 14
29 364 514
95 58 411
90 209 222
279 188 292
459 182 359
47 64 413 399 402 275
63 35 345 454 32 353
317 307 34 440 315 112
45 191 352 60 120 151
290 192 503 509 474 52
490 313 123 299 206 345
198 370 265 221 363 7
558 496 166 185 132 8
351 424 436 527 96 430

TABLE 14

Address of Parity Bit Accumulators (Rate 4/5 - Coded Block Size 3600)

76 283 600 479 262 505
293 236 203 12 711 181
666 76 24 687 283 527
339 302 389 571 618 659
38 469 340 151 555 34
248 637 466 352 497 571
429 706 259 96 459 378
297 40 656 282 119 682
506 573 228 649 329 702
38 272 81 305 138 154
62 632 93 267 563 172
336 133 650 557 692 309
358 271 456
263 435 533

TABLE 14-continued

Address of Parity Bit Accumulators (Rate ⅘ - Coded Block Size 3600)

655 660 29
356 115 160
692 100 396
313 435 57
267 16 575
370 383 398
554 524 221
210 517 585
438 157 10
170 522 333
611 426 28
423 185 78
141 196 602
17 558 250
420 485 668
351 166 129
576 309 235
146 339 348
379 604 23
313 319 694
601 188 611
697 446 464
70 460 23 530 342 627
661 268 10 434 300 3
612 376 351 150 29 287
503 15 326 25 257 680
359 29 342 391 214 108
223 25 131 162 458 29
693 594 574 48 524 343
645 375 106 479 678 408
92 213 691 88 204 221
109 92 165 226 52 698
697 415 704 309 496 158
361 315 689 427 572 513

TABLE 15

Address of Parity Bit Accumulators (Rate ⅘ - Coded Block Size 4320)

67 837 44 354 141 632
292 816 309 137 515 334
709 598 186 77 169 430
398 551 661 99 329 15
752 230 687 837 554 57
308 303 181 138 190 512
646 202 184 382 535 143
440 281 158 673 434 518
329 561 164 854 712 411
45 470 274 759 90 331
50 273 858 732 447 455
835 257 816 72 415 251
444 609 690 263 388 3
299 44 189 403 484 567
592 331 252 621 721 626
688 324 456 251 44 765
529 783 541
290 560 542
447 792 530
365 753 436
356 161 445
402 805 278
852 799 149
376 599 101
55 240 524
3 331 862
35 140 184
752 811 202
425 444 679
606 731 326
105 234 35
598 585 810
118 175 145
255 506 806
62 825 464
585 594 451
27 581 567

TABLE 15-continued

Address of Parity Bit Accumulators (Rate ⅘ - Coded Block Size 4320)

430 722 179
391 195 228
206 165 381
760 480 423
774 748 185
26 337 720
746 189 689
636 120 676
306 831 40
267 124 301
148 485 219
428 157 595 505 575 282
598 201 151 484 627 96
551 148 169 184 845 611
513 688 585 371 855 414
734 139 696 404 252 341
496 577 149 164 339 285
238 827 336 339 631 38
533 738 641 633 463 36
519 767 641 624 748 585
421 848 385 356 747 376
732 222 490 200 406 658
45 410 498 286 135 655
502 152 78 273 13 75
546 122 357 550 120 571
514 362 572 479 155 358
642 389 90 220 749 591

TABLE 16

Address of Parity Bit Accumulators (Rate ⅘ - Coded Block Size 5760)

389 1050 43 678 88 303
988 1112 642 633 59 92
196 260 661 696 74 1098
375 444 435 540 1 542
9 673 1149 388 66 797
1013 404 516 1096 82 811
780 161 190 661 883 745
620 594 79 742 441 435
838 59 501 129 403 117
1139 557 973 110 67 654
44 1132 15 859 885 513
1147 900 748 563 757 927
690 835 1117 477 1010 651
742 587 230 170 748 132
688 1127 1040 413 6 16
886 29 14 593 20 998
540 904 605 932 1115 591
882 1120 533 697 1112 611
976 629 194
799 762 578
577 96 66
203 751 141
365 269 201
549 25 880
217 336 788
146 664 849
893 498 1119
862 490 978
727 203 717
162 946 1131
1093 824 614
332 982 325
661 604 868
764 1097 603
36 1001 549
774 746 623
384 1028 856
774 381 889
627 261 731
47 97 1045
621 1062 325
1025 208 240
693 734 291
160 932 427

TABLE 16-continued

Address of Parity Bit Accumulators (Rate ⅘ - Coded Block Size 5760)

994 619 848
1127 74 44
923 431 318
935 887 1059
970 984 730
696 21 418
266 684 96
358 797 717
602 877 325
184 782 625
1033 304 1094 562 1031 361
566 715 198 975 365 519
268 1109 294 662 287 478
13 419 213 575 842 748
918 363 549 1004 578 408
644 188 128 508 828 844
1009 1101 243 44 426 580
200 858 241 89 119 294
305 64 560 284 675 847
925 916 740 18 1151 1113
90 669 470 1037 733 863
509 937 514 852 792 51
1023 73 245 1138 404 571
780 1034 473 641 676 739
802 963 1102 372 553 173
619 44 844 977 384 249
687 727 81 300 448 636
867 1048 277 891 1056 139

TABLE 17

Address of Parity Bit Accumulators (Rate ½ - Coded Block Size 720)

207 174 209 139 68 88
270 136 45 188 329 145
13 335 136 6 213 20
161 74 339 307
30 262 39 212
282 19 124 275

TABLE 18

Address of Parity Bit Accumulators (Rate ½ - Coded Block Size 960)

424 467 351 278 130 273
138 208 267 420 457 470
387 230 264 237 68 346
450 148 62 67 5 225
213 471 123 289
159 412 221 434
136 479 246 148
448 65 213 239

TABLE 19

Address of Parity Bit Accumulators (Rate ½ - Coded Block Size 1440)

414 469 23 658 559 440
13 322 153 338 220 539
567 661 680 386 259 347
207 511 215 469 536 420
83 295 133 280 363 378
713 453 579 307 234 676
148 471 150 633
509 417 524 696
681 360 306 281
674 130 544 629
252 326 10 461
72 122 488 562

TABLE 20

Address of Parity Bit Accumulators (Rate ½ - Coded Block Size 2160)

297 811 822 736 708 943
786 553 17 33 889 496
1010 1062 726 681 597 911
911 71 753 446 49 854
717 1046 935 440 228 1
116 572 295 736 517 419
164 80 651 1055 264 493
937 221 845 537 1014 925
472 934 172 1016 122 900
787 1045 113 1071
270 784 605 590
766 5 50 426
316 146 664 581
929 722 251 201
324 184 193 60
436 81 412 342
867 688 819 114
1 453 688 63

TABLE 21

Address of Parity Bit Accumulators (Rate ½ - Coded Block Size 2880)

101 1400 91 580 236 1044
486 1368 512 230 845 573
1160 993 303 140 278 717
646 922 1087 148 542 23
1249 393 1151 1375 903 86
1062 1298 1341 622 392 300
1055 107 950 526 196 1387
48 1325 1143 124 1197 598
875 552 728 175 826 111
708 469 262 1129 723 850
501 570 1081 1058 455 712
1145 1172 228 1302 729 637
836 781 323 1360
720 712 36 138
1220 1375 1185 457
689 115 1298 1372
537 995 1167 906
1039 678 1301 1058
71 1001 481 1178
1042 987 203 832
1086 1090 1059 785
365 1000 133 624
819 954 523 781
795 401 210 1171

TABLE 22

Address of Parity Bit Accumulators (Rate ½ - Coded Block Size 3600)

1615 11 1423 653 1242 3
1164 1604 22 270 1067 941
1065 266 40 831 1452 502
1090 1742 345 1123 1309 1293
667 278 947 473 193 1038
1416 1546 358 1344 1081 288
1457 1238 680 1725 1426 1378
130 323 181 1307 1019 616
1401 355 1794 1360 906 1368
175 133 250 1119 1767 963
69 1115 156 1216 34 682
330 113 1399 608 1324 860
897 270 1384 42 887 858
1684 1358 553 1015 1614 819
681 864 1366 1205 540 638
1085 1323 1189 1110
1287 912 1128 779
1473 645 944 1669
1315 554 1031 1229
434 154 515 1321
374 1745 203 97

TABLE 22-continued

Address of Parity Bit Accumulators (Rate ½ - Coded Block Size 3600)

620 1537 339 589
321 839 962 1507
921 165 1331 478
1571 1466 92 309
1010 1266 1152 897
2 929 1291 380
176 832 1228 1442
1166 1648 787 366
1501 952 1676 417

TABLE 23

Address of Parity Bit Accumulators (Rate ½ - Coded Block Size 4320)

175 41 262 1037 621 1340
2050 2108 353 875 522 896
1948 281 1659 346 198 451
1837 321 608 367 1763 1750
1128 1444 1043 601 674 1352
1410 931 2146 191 383 2007
140 562 1734 2136 2075 1162
879 708 609 37 2135 544
1785 1320 854 1714 1370 1222
169 312 386 1840 743 194
1393 319 1007 1724 1001 1082
1791 600 1761 569 1306 638
1028 1403 2133 1507 868 106
1610 1752 1194 915 1006 121
1891 1497 1025 1556 113 2019
116 1407 1021 455 1665 103
745 1911 1398 1056 1492 1713
396 64 1710 10 2149 1290
2089 767 308 1383
1637 110 1437 18
2090 1374 66 135
28 588 1760 157
1205 1607 186 835
1047 1512 1697 699
489 590 1458 2082
980 1269 265 1281
2 449 1917 631
2152 1888 360 1316
1000 396 927 910
1639 1972 1002 2053
773 1871 991 901
728 1379 1204 799
2030 1411 1438 869
1509 1204 927 1417
1130 1087 912 293
900 1922 2067 736

TABLE 24

Address of Parity Bit Accumulators (Rate ½ - Coded Block Size 5760)

991 2656 114 1713 234 760
883 1301 934 346 2155 1420
2443 2775 1617 1593 159 199
477 646 1667 1713 199 2737
2741 2673 1810 14 120 2234
1578 2252 185 1589 691 951
954 1090 1065 1344 4 1350
26 1700 2872 987 177 2031
567 2277 2248 1348 1618 1892
678 1088 555 291 2685 2702
1874 107 1258 696 2667 1780
976 1578 1289 597 1115 2225
1509 1488 212 1836 1082 1066
2092 157 1240 296 980 313
956 1798 952 806 707 8
2845 1391 2453 295 179 1602
1694 95 2617 1135 840 2655
117 2827 41 2147 2218 1321

TABLE 24-continued

Address of Parity Bit Accumulators (Rate ½ - Coded Block Size 5760)

198 2869 1414 227 2148 2161
2257 282 818 1179 2178 1817
1023 96 749 2841 725 709
2323 1646 2017 701 2838 2277
454 1851 304 1697 1800 1863
2567 990 46 44 1603 961
175 2194 2443 2183
2198 2302 308 445
126 2026 2569 62
2234 80 6 1463
911 1687 1890 16
2275 1495 2345 2761
1887 832 1464 194
1231 2864 1161 347
2120 1243 2461 450
1526 2479 146 2618
1010 2389 1718 2592
1103 517 1420 2112
47 829 814 2835
2494 777 2861 510
1265 924 893 8
1230 125 299 1703
2753 1547 1228 2307
1389 2451 756 1991
1965 2149 8 1596
2061 1136 2380 2211
2724 2110 161 1740
2868 284 656 628
2508 1614 2052 332.

11. An apparatus comprising:
memory configured to store information representing a predetermined structured parity check matrix of a Low Density Parity Check (LDPC) code for encoding information bits, the information representing the structured parity check matrix being organized in tabular form, wherein each row represents occurrences of one values within a respective column of the parity check matrix, wherein the columns of the parity check matrix are derived according to a predetermined operation based on the respective rows of the tabular information; and
an encoder configured to encode the information bits, and to output an LDPC coded signal comprising the encoded information bits,
wherein the encoding comprises:
initializing parity bit accumulators to zero,
accumulating a first information bit in a $j^{th}$ group of M information bits in an $i^{th}$ parity bit accumulator if the $i^{th}$ entry in the $(jM)^{th}$ column of the parity check matrix is 1, where j=0, 1, 2, 3, ... $k_{ldpc}$/M−1,
accumulating the remaining (M−1) information bits m=jM+1, jM+2, jM +3, ... (j+1)M−1 of the $j^{th}$ group in the parity bit accumulators according to {x+m mod M*q} mod($n_{ldpc}$−$k_{ldpc}$), wherein x denotes the address of the parity bit accumulator corresponding to the first bit, jM, in the group, and
after all of the information bits are exhausted, performing operations, starting with i=1 are performed according to, $$p_M = p_M \oplus p_0$$

$$p_{2M} = p_{2M} \oplus p_M$$

$$p_{3M} = p_{3M} \oplus p_{2M}$$

$$\vdots \quad \vdots \quad \vdots$$

-continued $$p_{n_{ldpc}-k_{ldpc}-M} = p_{n_{ldpc}-k_{ldpc}-M} \oplus p_{n_{ldpc}-k_{ldpc}-2M}$$

$$p_1 = p_1 \oplus p_{n_{ldpc}-k_{ldpc}-M}$$

$$p_{M+1} = p_{M+1} \oplus p_1$$

$$p_{2M+1} = p_{2M+1} \oplus p_{M+1}$$

$$\vdots \quad \vdots \quad \vdots$$

$$p_{n_{ldpc}-k_{ldpc}-M+1} = p_{n_{ldpc}-k_{ldpc}-M+1} \oplus p_{n_{ldpc}-k_{ldpc}-2M+1}$$

$$p_2 = p_2 \oplus p_{n_{ldpc}-k_{ldpc}-M+1}$$

$$p_{M+2} = p_{M+2} \oplus p_2$$

$$p_{2M+2} = p_{2M+2} \oplus p_{M+2}$$

$$\vdots \quad \vdots \quad \vdots$$

$$p_{n_{ldpc}-k_{ldpc}-M+2} = p_{n_{ldpc}-k_{ldpc}-M+2} \oplus p_{n_{ldpc}-k_{ldpc}-2M+2}$$

$$p_3 = p_3 \oplus p_{n_{ldpc}-k_{ldpc}-M+2}$$

$$p_{M+3} = p_{M+3} \oplus p_3$$

$$p_{2M+3} = p_{2M+3} \oplus p_{M+3}$$

$$\vdots \quad \vdots \quad \vdots$$

$$p_{n_{ldpc}-k_{ldpc}-M+3} = p_{n_{ldpc}-k_{ldpc}-M+3} \oplus p_{n_{ldpc}-k_{ldpc}-2M+3}$$

$$\vdots \quad \vdots \quad \vdots \quad \vdots$$

$$p_{M-1} = p_{M-1} \oplus p_{n_{ldpc}-k_{ldpc}-2}$$

$$p_{2M-1} = p_{2M-1} \oplus p_{M-1}$$

$$p_{3M-1} = p_{3M-1} \oplus p_{2M-1}$$

$$\vdots \quad \vdots \quad \vdots$$

$$p_{n_{ldpc}-k_{ldpc}-1} = p_{n_{ldpc}-k_{ldpc}-1} \oplus p_{n_{ldpc}-k_{ldpc}-M-1}$$

wherein final content of $p_i$, $i=0, 1, \ldots (n_{lpdc}-k_{ldpc}-1)$ is equal to the parity bit $p_i$.

12. An apparatus according to claim 11, wherein M=360 and coded block size $n_{ldpc}$ is 64800 code rates are 1/4, 1/3, 2/5, 1/2, 3/5, 2/3, 3/4, 4/5, 5/6, 8/9, and 9/10, respectively.

13. An apparatus according to claim 11, further comprising:
a Bose Chaudhuri Hocquenghem (BCH) transmitter configured to encode an input signal using BCH codes, wherein the output LDPC coded signal corresponding to the input signal represents a code having an outer BCH code and an inner LDPC code.

14. An apparatus according to claim 11, further comprising:
an interleaver configured to interleave the output LDPC coded; and
a modulator configured to modulate the interleaved LDPC coded signal based on 8-PSK (Phase Shift Keying) or 16-APSK (Amplitude Phase Shift Keying) modulation scheme,
wherein the interleaver is configured to write the LDPC coded signal column-wise and to read an interleaved output LDPC coded signal row-wise, from left to right, and wherein if an 8-PSK modulation scheme is used for a code rate 3/5, the interleaved output LDPC coded signal is read from right to left.

15. An apparatus according to claim 11, wherein the tabular information representing the structured parity check matrix comprises a one of Tables 25 through 35 (below), wherein the row indices of 1's in the column index j*M, (j=0, 1, 2, 3, . . . $k_{ldpc}/360-1$) of the parity check matrix are given at the $j^{th}$ row according to the one Table, and wherein $k_{ldpc}$ is associated with a length of the bit streams;

TABLE 25

Address of Parity Bit Accumulators (Rate 9/10 - Coded Block Size 64800)

| |
|---|
| 853 2958 3632 4515 |
| 1434 4116 4989 5634 |
| 956 4019 4864 5826 |
| 2532 4509 5262 6167 |
| 739 1530 4498 5247 |
| 3702 4931 5465 6270 |
| 1120 2178 3845 5151 |
| 860 1124 3462 5411 |
| 369 3339 4144 4846 |
| 122 2027 3691 5416 |
| 262 1354 2338 4093 |
| 1573 1950 2733 3244 |
| 540 4585 6053 6153 |
| 1500 2589 3263 5842 |
| 126 535 2167 2851 |
| 450 1639 2380 3010 |
| 2123 3229 5049 5772 |
| 234 1833 3121 6332 |
| 3837 5603 6118 |
| 1508 3146 3403 |
| 233 447 2661 |
| 407 1040 6302 |
| 1453 4073 6091 |
| 2498 3347 6253 |
| 2019 3356 4664 |
| 753 1184 4888 |
| 882 2521 3870 |
| 476 2255 2523 |
| 3997 4593 5914 |
| 1455 2130 2958 |
| 84 4217 4371 |
| 1407 3850 4794 |
| 160 2118 6164 |
| 2949 4691 5226 |
| 1111 5043 5621 |
| 2186 5370 5596 |
| 3093 5233 6382 |
| 340 3265 5540 |
| 278 1666 1883 |
| 154 1203 3583 |
| 1946 3000 6258 |
| 2010 3644 5852 |
| 1546 2436 5506 |
| 765 3582 4362 |
| 1566 2642 5023 |
| 1120 4415 6217 |
| 1274 4777 5663 |
| 2607 4905 5329 |
| 429 741 2271 |
| 419 2861 3227 |
| 595 4276 4577 |
| 855 4269 5322 |
| 2182 3654 5979 |
| 3710 4137 5946 |
| 875 4259 5751 |
| 305 2387 6465 |
| 1039 2552 4422 |
| 473 1567 2876 |
| 86 433 6038 |
| 771 2242 4226 |
| 2298 4312 5160 |
| 151 1104 5223 |
| 584 4865 6443 |
| 1351 2789 5736 |
| 1104 4867 5210 |
| 1551 3806 4771 |
| 5682 6074 6155 |
| 1678 4509 5883 |
| 2934 3723 4530 |
| 2155 3451 3623 |
| 2012 2913 3395 |
| 2081 3019 3550 |
| 269 604 1918 |
| 2397 2735 3571 |

TABLE 25-continued

Address of Parity Bit Accumulators (Rate 9/10 - Coded Block Size 64800)

247 1410 4047
788 1906 4585
2993 3783 5318
2392 3527 4509
1829 4402 5626
796 3206 5660
406 812 3768
3663 4160 5625
3042 4219 4996
1176 2485 4699
271 360 4695
1415 3372 5921
5159 6118 6466
1699 2861 6151
1581 5066 6060
1482 2649 6313
2270 3658 6419
550 2114 3514
415 5165 5735
2775 3277 5182
1622 2345 3570
2865 3643 4519
2632 3685 4527
2226 3972 5927
1311 5722 6001
1602 4026 6106
3009 5053 5448
813 1800 2910
1551 2026 3139
517 1223 4953
0 4828 6461
1132 4040 6223
274 745 4778
319 807 4625
1745 1977 5221
296 1451 6474
607 4594 6054
2034 2210 3466
1701 3223 5633
3605 4513 4818
3209 4817 5696
1063 1404 4558
1015 2736 4760
3199 3921 5773
162 871 2135
71 5698 6079
4010 5377 6332
367 3524 5046
2345 2666 3410
2505 2523 3646
1425 4183 6203
459 1102 4163
229 1479 5965
197 671 2247
2221 5136 5542
1092 3353 6170
3140 3789 5437
382 1455 3090
815 4661 6000
2845 4675 6184
2412 2802 5612
1452 4546 6320
2628 2888 5147
362 3915 5810
3442 3666 4755
2054 4036 5025
305 3562 4123
4106 4836 5096
796 1152 2096
958 1329 2122
4439 5432 5802
1689 2298 3816
45 3141 3295
3912 5161 5712
1440 2996 6050
2533 3702 4119
4193 5468 5890
129 1298 4574

TABLE 25-continued

Address of Parity Bit Accumulators (Rate 9/10 - Coded Block Size 64800)

3187 3438 4264
1085 1892 4442
457 2552 3594
1340 2466 2781
160 659 2182
641 1612 1826
1063 5226 6345
2011 4735 5207
853 4933 6426
966 4754 6250

TABLE 26

Address of Parity Bit Accumulators (Rate 8/9 - Coded Block Size 64800)

2049 2756 3671 5395
2062 4593 6161 6519
3594 3660 5409 6024
4566 5595 5783 7088
2197 4281 6587 7010
2107 2430 3117 5274
2090 3237 3762 3961
1606 2603 6401 6537
309 1180 1760 3760
126 1009 5264 5809
300 558 2285 2525
3021 5282 5418 6419
2923 3450 6423 6635
0 1408 2588 4524
582 2368 4008 5411
957 1214 1503 6914
1321 3344 4555 4994
998 1792 4319 4966
519 4925 5921 7124
534 873 3499 4697
578 945 4712 6370
1890 2785 5021 6703
68 3981 5697 6062
354 1841 2857 3267
350 2675 4109 6496
396 4311 4365 5334
5100 5520 6718 6953
1670 2251 2968 4645
1438 2267 3362 3781
840 4252 4440 4835
2117 2756 3263 6959
2397 4592 4930 6336
180 1834 2941 5811
1075 1265 3295 5046
371 949 1704 3804
712 2402 6678 7163
2996 5227 5939 6174
1314 3045 6029 6180
1357 1588 3946 5524
1619 3630 5642 7165
523 1284 5809 6374
1037 2350 3499 5006
450 754 3228 5304
61 1511 3994 5371
5008 5057 5920 7067
872 5505 6243 7060
1950 4250 5059 6284
1530 2449 3873 5981
3594 3941 3993 4476
1071 2100 2959 4081
1408 1503 3668 5595
62 4403 4904 6819
248 650 4973 6699
1177 3464 4504 5642
6 1346 3086 5537
2525 4542 6832 6995
2044 2426 2980 6815
1641 2695 3699 6351
2480 2723 6032 6942
562 2056 2600 3465

TABLE 26-continued

Address of Parity Bit Accumulators (Rate 8/9 - Coded Block Size 64800)

311 2303 4701
112 5234 5635
530 1388 4324
2156 4941 6375
1339 2518 6760
2549 3803 6776
975 2190 3459
1270 2712 6091
2633 4075 4591
717 6263 6666
3794 4948 5802
852 1759 5613
1440 5404 7008
2904 3916 4213
3488 5772 6874
212 2011 6308
923 1557 2032
3060 4041 5161
3026 4568 7013
370 3262 5202
1896 6264 7194
3276 4049 5925
79 550 1582
4867 5376 6999
2703 3553 6995
827 2135 2502
325 4289 5840
1194 3917 4961
3327 4281 5699
1756 2340 2602
1487 2239 4541
202 719 5449
2560 2886 4884
459 5990 6597
742 2046 3944
976 4567 5244
2933 4619 5259
3805 5495 6748
1398 6213 6480
1343 3228 6435
4830 6779 7088
1327 1676 5259
340 488 1702
2811 3854 5534
30 1837 5582
579 785 3869
2899 3333 3628
785 2657 4541
971 2749 6480
597 4445 5355
299 1437 2441
2085 4247 6375
1145 4488 6912
1833 3292 4959
3963 6561 7162
2443 3112 4950
1670 3499 4106
5338 6060 6278
3220 5837 6120
2292 5674 6110
352 2557 7127
655 1431 3892
950 3789 5468
2165 5720 6598
367 2196 7138
4333 5153 6322
1579 2361 4996
1325 2123 5720
317 1513 4311
1286 1693 4722
3066 5803 6995
2888 5376 6535
1875 2817 6013
2553 4671 6228
961 1839 4361
4104 5800 6762
233 3178 4110
800 3507 4766

TABLE 26-continued

Address of Parity Bit Accumulators (Rate 8/9 - Coded Block Size 64800)

3539 3669 5388
585 3512 6134
1666 4308 5458
112 4239 6625
110 3973 5250
3298 4395 6336
2354 3379 3711
210 459 1563
2426 3198 6308
1786 3216 6566
586 2233 6149
3278 3784 4918
1167 1843 6728
1411 3084 4696
1165 2050 4655
2147 5642 5955
2827 4333 5671
1021 5092 5872
620 768 6058
2583 5111 6915
3860 4766 7032
876 2834 7114

TABLE 27

Address of Parity Bit Accumulators (Rate 5/6 - Coded Block Size 64800)

214 1287 3599 6203 6732 8430 9194 9395 9980
1994 2299 4496 4929 5365 5467 5843 6676 8669
2304 2633 3344 4927 5414 6989 7952 9334 9950
1189 1789 2261 2650 3036 4827 6167 7373 9965
992 1133 2522 3853 4977 5278 7483 8206 9230
53 3258 3647 6282 7168 7432 7961 10198 10799
549 1014 1300 4660 4859 7493 7834 8428 10330
435 1379 2897 3293 6178 7642 8384 8661 9720
1844 2609 3924 4101 4912 5290 8307 9089 9411
32 3899 4047 4952 5210 7160 7800 7944 10479
501 1282 1612 5682 6026 8191 9819 10430 10516
556 4506 5254 5500 7675 8450 9389 10255 10701
1723 4051 5530 6927 7833 8298 9041 10424 10643
188 1424 2420 3365 5047 6245 6615 7521 8232
265 1072 1787 2257 4495 5961 6198 9058 9402
236 1138 1815 2696 3214 5306 6634 8592 10173
529 1184 3160 5116 5730 6119 6497 8182 8536
43 922 1479 3406 3836 4130 8455 10196 10528
692 5108 5734 6146 8897 9105 9662 9961 10742
632 3323 4475 5450 7253 8169 9288 9731 10628
4 936 1597 3475 4654 4998 5410 6786 8141
18 424 2199 3817 5917 6701 6847 9168 9436
1669 1947 4208 5007 5857 7067 7850 8740 10008
1951 2758 3548 3619 6060 7068 7628 8800 10408
1606 1858 3799 4297 4433 6323 9927 10420 10647
741 2877 3077 3893 5825 6438 7156 7234 9368
2737 3159 4054 5831 6498 7157 7276 7571 8910
376 908 1908 2462 3031 3988 4464 7283 8778
987 1902 2379 2543 2951 4319 7857 8643 9520
966 1719 2014 2473 3225 4552 6774 8760 9544
5031 6470 10479
5483 7147 8908
2987 4043 9531
2490 3786 8463
2641 3703 8786
342 4576 8364
2894 5906 7978
2212 2892 3662
30 1264 6077
5087 6982 8946
699 5800 10701
627 4350 7062
747 2198 4497
1539 8017 9640
2146 6630 10573
60 4159 6739
428 5711 9203
6650 9315 10101

TABLE 27-continued

Address of Parity Bit Accumulators (Rate 5/6 - Coded Block Size 64800)

5298 7993 10192
2031 2726 8602
1553 6178 9771
1964 5248 5667
745 6339 9929
1088 3316 9783
880 7367 9536
4840 7763 9250
3429 7754 10209
2690 4781 7598
1422 4058 7546
1441 3387 7262
3064 3941 4027
1166 2919 4966
214 1688 6563
4848 7445 8724
1085 8334 9687
7210 8968 10531
1380 1992 3748
7145 8003 10575
4408 8357 9875
278 3029 3784
277 2495 8171
5166 6104 8529
4799 5228 9084
5391 5830 9757
3315 5989 6217
3276 5475 9632
7014 9320 10243
823 8272 10248
783 7690 9959
2816 3970 8732
2794 4387 6479
3324 6192 7225
1701 4453 5609
810 9036 10384
637 6817 7056
2303 2754 10582
1793 2269 7771
2105 4256 5584
702 2057 7844
692 6581 9446
2820 6317 8314
958 1639 6298
2814 3558 7028
4275 5027 5715
6036 7021 9687
4642 5440 6751
3192 3867 4810
992 5736 8424
1756 6605 9514
1819 4087 4950
2113 7082 9867
1763 3762 4068
4360 8056 9032
656 5807 8379
3064 4655 8930
2877 3320 9505
1255 9232 9761
3708 5287 9219
2182 6351 8801
968 6048 8826
1867 7725 9908
2935 7539 8128
323 607 10701
83 3287 5241
352 6761 10091
1140 5277 10408
655 7334 10660
1278 7271 8113
2515 7564 10307
2183 7827 10788
739 6672 7442
2430 8693 9658
211 788 10694
1188 6340 10064
3273 6890 9455
5164 8796 9938

TABLE 27-continued

Address of Parity Bit Accumulators (Rate 5/6 - Coded Block Size 64800)

619 1487 9872
577 6316 9134
2929 4828 5650
3536 7557 8995
1445 6562 7647
3770 5525 7910
3883 4543 9429
248 4857 10091
768 1997 2820
2180 2996 8401
2239 3521 6476
3987 4687 10188
90 6658 8634
1100 3621 3977
3969 7344 10605
1473 7069 10558
2917 5784 8427
1816 5508 8015
2823 7668 9330
428 2534 6106
1431 1909 4632
4542 5877 10409
5075 8151 9244
5127 7046 8018

TABLE 28

Address of Parity Bit Accumulators (Rate 4/5 - Coded Block Size 64800)

1817 3054 3488 3751 6890 9140 10502 11378 11868 12275 12936
89 1422 2236 4571 7578 7924 8512 9841 11152 11710 12163
1594 1810 5237 5879 8395 8758 9026 9510 10850 11269 12504
95 2174 3644 6691 7843 8008 8793 9672 9822 10706 11883
476 913 1307 4253 4779 7094 7769 8067 11781 12260 12888
468 1587 2359 2574 3003 4914 5729 6998 8109 10577 12728
63 955 3518 4330 4813 6145 6717 8288 11362 12139 12398
3574 5338 5719 6564 7926 9411 9738 10573 11384 12585 12653
80 1484 3563 3641 5022 8702 9886 10212 11794 12028 12872
437 982 4635 5280 5971 6780 9604 10377 10863 11315 12260
2194 3066 3302 3898 4234 5128 5486 7405 10533 12046 12837
46 1156 2937 4281 4490 5381 5479 6007 6387 9396 11775
188 2285 3734 4624 6268 6829 7001 8405 10446 12400 12783
346 668 925 4282 5327 7520 7817 9313 10570 11825 11996
1467 2279 3713 4516 5065 6797 7107 8644 9652 10181 12218
1578 3175 3572 3728 6761 7874 8342 10059 10108 11367 11823
980 2624 4486 4915 5812 6862 7858 9215 10201 10922 11261
1268 1932 2258 3530 4265 6280 6919 7770 8412 10225 10875
1616 2859 9569
640 1570 6438
1087 2148 7242
1103 3185 10259
375 1316 8620
998 9881 10833
807 2869 9225
4067 6069 9030
2052 2650 10005
3972 5589 7258
5823 8891 9002
4846 6300 8921
5721 8655 10955
2046 3235 8170
698 2007 8170
2859 5824 7244
2550 5723 7215
4847 6343 7305
2105 6124 11240
1124 1938 3181
6289 6924 10699
1686 8088 12123
3064 10067 11948
6393 7637 9716
3215 9559 10253
3615 8261 12704
3857 5906 12451
6657 8720 10939

TABLE 28-continued

Address of Parity Bit Accumulators (Rate 4/5 - Coded Block Size 64800)

331 2123 7912
623 6582 12185
4308 5148 7350
474 4404 7275
8141 8758 12871
1452 5399 11009
2705 10291 10869
856 2785 12538
1254 3656 6705
1332 7476 11775
2496 5237 12796
830 8732 9436
4501 9115 11855
747 2833 10559
4825 9111 10709
3322 4838 7631
3334 5714 8624
1625 2248 10401
2220 9932 11602
153 4580 12491
6877 9144 9766
3275 4178 11366
4784 6097 7097
4223 5572 8471
329 5500 8464
409 6085 11403
976 4542 12885
1314 7136 9557
876 3109 10866
5194 5950 12311
1729 1990 4996
5868 9658 11497
2492 3252 4058
3266 5373 11134
1518 9489 11357
1319 2447 7169
2443 9842 12756
6948 8482 10132
5548 10188 11787
5055 7735 8385
399 7891 10182
2872 5928 11928
8103 8467 11981
333 11709 12110
1778 5003 10559
4284 6383 12297
1384 7374 11087
3119 3240 8171
1057 11199 12906
5564 8692 12291
8086 8824 11655
4431 5009 7525
2024 2709 7894
7349 8668 10028
143 9918 10502
136 3778 4492
715 4125 6553
3704 6505 10477
3836 5737 6592
2652 6152 9059
1985 3081 9000
611 6229 9123
5299 5444 9951
2537 9840 10862
2410 10471 11971
10221 11129 11718
9313 11077 12924
4733 6403 8554
3461 7033 10336
4815 6292 11823
5173 6984 7388
1728 3079 7734
242 2085 3327
2018 3217 9375
7067 10017 12906
3270 8294 11412
7757 12061 12664
3172 8248 12497

TABLE 28-continued

Address of Parity Bit Accumulators (Rate 4/5 - Coded Block Size 64800)

523 3999 4708
5994 8202 8401
498 4083 11935
4557 5092 6119
871 1887 12341
4612 7572 8164
2333 8759 11268
4449 9350 10409
6610 8814 10553
2219 6761 9503
1041 1336 1635
2607 4127 12437
640 1047 6570
1246 1558 2530
5689 6006 11652
1141 6211 9170
91 7545 8808
3618 7244 10595
292 3726 11289
3855 5480 9570

TABLE 29

Address of Parity Bit Accumulators
(Rate 3/4 - Coded Block Size 64800)

1760 5736 6289 7119 10593 11012 11496 12025 13422 14631 15154 15673
164 1100 2695 3317 3653 4302 7667 11415 11619 13880 15436 16050
1798 4091 6449 7366 7671 10967 12595 13629 13966 14443 15223 15611
257 3408 3732 4255 6895 7345 7743 8849 9020 9850 10986 13188
70 1455 2981 3365 4050 5044 6202 10072 10204 11606 12669 14768
3442 3685 3992 4326 4898 6793 8840 10582 14008 15061 15727 16033
2719 2917 3500 7784 7966 9057 9474 10303 13882 14234 14619 15245
358 1409 4373 6036 6255 7719 8372 9901 11377 12136 14297 15856
1310 2865 3153 3872 5675 8007 8333 10705 12144 12744 13726 14361
856 3445 3922 5407 6218 7163 7747 8997 10762 10825 12929 13859
891 1579 1912 2609 5373 5670 7097 9162 9678 9912 10356 15425
625 1387 3199 5183 6621 8984 9526 10345 11699 12574 14743 15124
1742 1987 2391 4667 6117 7258 8405 9868 12463 12994 13483 14267
358 594 1887 2555 8155 9537 9885 10328 12711 13234 14450 15773
860 2486 2800 4768 5233 6000 6722 7266 9136 9652 10100 14784
498 5911 8999
5609 11076 12022
2133 9167 15546
8543 12322 15688
3797 10622 12643
5701 9273 13284
2080 6582 13468
2213 7188 14413
661 1020 15912
811 10657 13443
4141 8200 14159
4339 12968 14909
8170 12226 13434
1073 2241 13160
1128 1835 6989
2931 12449 14377
153 2987 11746
687 11918 15905
5921 9434 11859
2516 5393 11701
1329 12412 14801
5762 7932 8496
702 2276 6428
4360 8416 8830
4849 11516 15858
1666 4913 15031
5088 7537 10862
4535 4923 7243
4802 6622 11323
6523 11319 12635
6176 11036 14971
3326 3995 12286
1763 2765 5759
4840 7736 13622

TABLE 29-continued

Address of Parity Bit Accumulators
(Rate 3/4 - Coded Block Size 64800)

13588 14213 15892
3018 4027 12553
3025 5092 11688
4289 6084 10428
2367 7460 11358
6209 7415 8678
1617 4863 10623
8931 10797 13847
7259 8904 14244
1409 11923 12890
6304 12408 13132
41 7821 13459
6022 10056 13846
8363 11395 16119
7065 15388 15794
5891 8064 11461
5695 9159 15426
2329 4675 16050
2041 12119 15695
5499 9713 15791
655 10137 11619
1896 4703 14660
5204 6886 10810
5133 10666 13767
2828 3812 11725
10934 14068 14604
2360 9460 14878
8060 9050 12993
303 14652 14887
6859 8555 15203
3667 7971 9209
3906 6498 11984
2997 9700 12935
115 7751 8359
2058 3573 10188
648 1315 13058
602 9890 12654
988 1778 9843
2564 3529 6744
972 4602 6484
807 1302 4343
4196 6634 13931
5962 12749 15238
9661 11863 15553
5675 11586 15637
1167 12382 13040
7 5049 9141
8139 9994 11767
3401 7610 13054
541 8910 13153
5173 8362 14231
3018 6572 10557
5245 8559 16096
663 1594 12876
3325 4490 12417
2573 14222 16104
2466 3120 13939
2240 4656 15279
717 3102 12604
734 4505 14156
1152 1815 5691
1126 12352 15553
3594 10949 11900
2275 6381 10326
99 10188 13327
2655 14519 15909
991 1850 12173
7052 10172 13789
6056 6395 15366
3907 6202 12054
4804 11472 13436
7146 7900 14798
3674 8102 9375
4077 7423 11380
306 11199 14687
2879 7603 14956
1569 3781 9492

TABLE 29-continued

Address of Parity Bit Accumulators
(Rate 3/4 - Coded Block Size 64800)

1663 6808 14985
4897 5766 10659
4086 7472 7992
4868 9749 13476
7079 8892 14719
2029 8392 8642
949 9330 10964
9296 10742 11015
5686 7483 9968

TABLE 30

Address of Parity Bit Accumulators
(Rate 2/3 - Coded Block Size 64800)

186 2705 11911 14746 14866 19054 20583
589 2493 5010 12476 14348 15395 19934
3080 4591 7819 10713 18428 18772 20882
2768 4190 4529 5656 7331 18496 20932
2339 3987 5445 6511 15705 16316 16766
1295 2179 11422 12912 13250 18457 20138
4303 6701 8649 11078 11809 14451 17240
3942 7841 8254 8668 9925 18788 19387
1418 9303 10257 14548 15808 17149 20716
777 6711 10002 10711 12550 17952 18446
1581 2148 5630 6397 8165 15108 16517
1173 1911 4755 8232 11675 12224 14445
2573 5706 7295 13171 13467 15691 20519
544 3371 3803 9894 10663 13295 17349
2903 9162 11813 12604 13528 15554 16639
1885 10990 12657 13183 13956 15403 17674
4435 5234 7142 8315 16582 17274 17470
945 2640 5938 6344 7639 10356 19633
3557 4866 9995 18249 19954 20391 21054
603 2541 4772 5153 7110 7471 8080
1765 4778 10022 11673 12545 17802 19483
980 1173 4386 9288 15145 17227 20934
200 3139 5585 6068 11242 13092 19481
6282 7238 7979 10200 14602 17038 20545
8869 10185 10856 11403 13791 15670 19237
3489 6615 11829 14125 16528 17782 20100
632 1062 4084 7445 9718 18831 21283
3541 3991 10093 16067 19007 19373 20621
3384 6000 6869 8715 10800 11910 16145
2052 8353 9453 11515 16036 18212 21519
6028 7063 7740
2917 5857 16345
5223 8453 11937
6444 9067 18083
9142 13670 20123
2370 5200 16404
823 1854 18333
6791 12202 18118
2373 10455 19524
1234 11042 11405
493 12359 19781
1448 14380 16865
5050 6343 21344
10604 14808 17544
8482 15289 18443
8993 16807 20689
1520 13400 14306
12731 14799 15930
12550 13324 14361
7113 14024 19136
3193 7614 12672
14982 17679 20412
4557 17527 20284
314 15256 20920
1516 9522 13718
3911 9656 13870
180 8572 15928
3848 9380 19334
186 20241 21301

TABLE 30-continued

Address of Parity Bit Accumulators
(Rate 2/3 - Coded Block Size 64800)

3762 17533 21593
2500 8094 20116
4822 15317 17920
4883 7241 19226
1513 17294 18444
13197 14416 21397
6420 13981 14678
118 3981 8018
3655 8742 16735
1978 6412 15584
9679 12837 20027
15535 17421 21258
1206 16712 21219
2491 4233 6564
7971 10528 11712
10592 12847 16156
5295 13708 16655
6070 15542 17706
5712 5981 8432
1408 1968 2251
2617 3499 15856
15339 18614 18850
2724 4249 10874
3092 9614 11876
1048 10613 14312
5129 18541 19036
8603 11165 20068
938 1263 17272
7272 14649 15341
3111 14296 18913
8459 11613 17541
10334 10899 12365
396 4594 7000
7656 9120 10070
12079 13628 15008
16480 18347 19548
2082 20174 20525
3912 4927 12697
13030 13930 20406
5566 19268 20942
6576 11255 13410
152 17852 20802
1562 15044 17236
216 7491 13354
3128 6493 7054
1448 9525 17085
14307 15029 21560
5360 13103 21047
9305 9901 10103
3306 5451 7165
709 12054 16399
3800 4646 12177
2824 3523 15961
900 16239 19378
6314 11295 19778
10055 10113 12317
4530 19691 20332
10923 12532 18027
644 7838 9011
5932 8840 20595
7870 8667 18005

TABLE 31

Address of Parity Bit Accumulators
(Rate 3/5 - Coded Block Size 64800)

11321 12093 14740 17157 17595 20195 23259 24646
11 2432 8805 10373 12516 15842 19698 24066
135 2803 4080 10491 16241 16758 17748 19867
2099 2993 10236 13026 13786 14200 17299 19957
75 2778 6647 8553 10132 13861 23999 24170
1658 3252 4357 6701 7187 13646 19015 25712
2001 4424 10467 11353 12918 16937 21896 22829

TABLE 31-continued

Address of Parity Bit Accumulators
(Rate 3/5 - Coded Block Size 64800)

6358 7559 10402 14888 15995 17271 20484 22169
2000 4467 7863 9989 14311 16241 23410 24873
1361 3974 5222 10532 10984 17694 20378 25468
1544 7077 10921 12059 19923 22020 24017 24988
3513 14006 14377 16519 21006 21755 23229 25366
15 1247 7113 8215 13179 21142 23839 25245
5640 6141 7024 7418 10598 11979 12587 14298
1945 6827 9994 11500 11888 17446 21492 25439
7773 9202 9531 11080 15728 16419 18092 23716
407 18370 18793 20991 21559 22401 23755 24267
902 3720 4773 6030 11856 15252 19226 20853
1761 4079 12622 13351 16895 19802 23716 25765
1097 3637 6487 11788 12644 13436 17822 25663
1140 2231 3054 5975 11667 12902 13310 23022
4542 4795 15063 17421 17990 18608 21208 25716
5957 8403 11533 16178 16590 19337 21936 22010
939 5012 8468 11512 13595 18980 23151 25171
5857 8639 12470 18486 18782 19268 20531 25158
2945 5413 7244 12571 18305 18658 22658 23030
8975 9144 9984 13118 15061 19436 20308 22959
1462 7201 7652 9076 16674 18216 24160 24593
2183 2870 8206 9391 15293 22608 23163 24181
2498 4728 5065 8998 10844 15172 19603 21473
5105 8919 9457 15378 16040 17164 19450 22550
2858 3726 4027 8058 9458 13970 15544 22251
541 924 5642 6425 7937 14699 15484 21840
378 3495 7676 9280 14688 20727 21482 24745
9837 14747 14931 15632 18040 19755 20574 24585
588 857 3129 3258 3613 5087 5545 6154
8203 12127 12848
14077 15922 24447
2906 21236 22074
2092 4829 17082
4295 5675 18564
1681 15114 24211
341 12877 20467
323 17818 18380
9271 14655 22658
1471 13161 13320
289 8845 25307
533 15353 21423
3142 11533 20028
1933 3693 4375
7338 19500 21282
10422 11066 24968
1343 7027 18665
1356 7515 14602
6284 17691 20657
3297 10391 24693
11426 20934 23813
19342 19725 21530
10923 16535 23406
4889 24913 25283
5050 10818 12236
7074 19102 21017
5886 16748 25712
5584 6358 22353
10354 13346 15312
3375 9935 25495
4997 11522 15270
4468 18734 25869
9392 17056 22069
2236 7876 22925
4640 6011 8753
10020 21852 25599
7363 8030 24591
6288 6865 20673
4130 5835 19386
3051 10706 20518
3768 6484 23644
15847 18340 20440
2115 14190 18267
14639 16843 19917
10055 23506 24520
6818 12446 15040
1243 5642 22144
3829 13321 13867

TABLE 31-continued

Address of Parity Bit Accumulators
(Rate 3/5 - Coded Block Size 64800)

10510 19526 22746
628 15857 16637
18343 20836 23351
849 3411 22968
9062 17694 18998
6660 8542 13719
2757 8726 11729
8089 10673 20091
1691 8446 21849
9096 14789 21754
14137 18816 22399
893 2430 24423
4109 13856 17456
8280 12805 24063
488 12106 12282
2457 9509 15757
9411 11511 16932
11352 16346 23973
5377 16529 24978
782 5090 7808
13317 15836 23080
7847 12471 15669
2543 13225 17284
2661 17549 23285

TABLE 32

Address of Parity Bit Accumulators
(Rate 1/2 - Coded Block Size 64800)

3111 10821 12690 21446 21936 22833 27169 29136 31422
3864 7321 13358 14931 17859 19350 22505 22724 29342
1776 4735 5405 6757 10722 14671 22344 26656 29357
459 5147 14564 15500 22996 23742 25375 27615 30450
39 2020 2938 7612 12329 15698 15902 25163 31344
6647 8249 14871 15478 22091 23395 24971 28606 31269
2922 10356 13860 14238 22025 23586 26446 27232 31239
5436 6084 8594 10547 12720 14591 16454 26434 32185
2710 7917 10870 11726 12755 14599 24958 27996 28218
486 4934 5284 12406 14723 17460 23403 29725 30963
347 1169 3982 8271 8662 15028 18174 25459 31413
876 1312 2565 7422 10788 11931 16541 18283 23574
90 7129 8288 10792 12326 19925 20242 23116 30201
6470 13138 14268 17835 20001 20315 22200 25985 27855
1112 12000 12355 12793 13064 14036 28038 29518 30365
5814 8048 8312 9008 13571 16110 26199 31241 31486
3042 4178 5196 10280 14074 19558 24789 29667 31873
1454 5389 7107 7543 7862 16024 16626 17490 28242
2044 5054 10355 10824 11440 12775 15710 16297 27461
6029 9526 11735 22611 24555 26819 28137 28825 31324
1021 5580 6702 7823 18869 19850 21862 28725 29352
5706 6585 8712 11948 21714 26302 27152 27420 28364
2404 3906 4797 6227 8259 10754 14230 28897 30151
2240 9684 12342 15800 17252 19282 20858 23539 27301
4538 5033 5728 13970 16527 17614 19575 29978 32092
2354 7290 9783 13771 15981 22928 28083 30097 32322
135 2737 7742 9051 9599 16013 18075 24173 31256
1056 9731 11337 15201 21705 22111 22331 25134 27614
3390 11099 13353 18555 20915 23865 25697 29332 30761
3330 4535 16747 16939 18532 18954 20854 21064 21406

TABLE 32-continued

Address of Parity Bit Accumulators
(Rate 1/2 - Coded Block Size 64800)

11022 12187 15275
3883 8843 22303
17714 21104 27550
3562 13705 20167
329 3338 16387
11592 18421 30914
6566 17134 26143
24607 26923 29562
4806 8465 15423
1088 30544 31855
1832 3806 27250
7337 20964 21323
18580 22620 29095
13386 21101 32396
13262 25229 30015
10150 12199 25755
3556 18602 30378
3905 8082 24259
17251 18773 24705
6133 8450 17854
1074 9896 26078
11372 23996 25612
9603 28654 29625
4304 16791 20819
3161 8835 24541
15186 16924 27847
8957 9805 26249
13286 20209 30933
10413 18729 29543
5912 28899 30687
2479 17644 20863
1901 6239 9157
1524 19166 25761
6363 15526 19685
14219 15047 20662
15079 17594 19410
25330 27868 32037
793 7156 19618
20323 21339 23201
2358 5863 9534
4079 9184 22987
4490 16838 24186
11175 11670 28552
4137 18732 25266
11812 19809 23870
1430 9775 26754
11447 18070 21285
1686 4676 23221
9096 25011 28651
619 23154 26495
1731 30544 30849
24449 26990 32018
2085 2668 19271
612 4434 19612
13258 13475 25651
2546 16649 23874
18224 23943 26533
454 24290 32166
7013 21848 31936
7119 17485 20152

TABLE 33

Address of Parity Bit Accumulators
(Rate 2/5 - Coded Block Size 64800)

3297 6933 9162 10693 13628 16986 21668 24076 27719 3468536422 37739
4652 4971 7019 11188 11972 14893 22173 25272 30894 3195932110 32910
33 2031 3088 5881 6560 7368 12348 15738 19440 25780 2954136439
4838 5721 20883 21606 22567 22986 24682 25476 28059 2832932101 34721
3910 5188 6809 7103 8947 15790 17739 20635 23085 25564 29622 33785
754 7097 11883 13104 26248 29038 30443 32405 34759 35136 37093 37672
1707 16575 18649 19982 22302 22594 24413 24650 24863 27001 30158 35491

TABLE 33-continued

Address of Parity Bit Accumulators
(Rate 2/5 - Coded Block Size 64800)

11590 14788 17345 18420 25603 26066 27769 29284 32938 34185 37362 38026
1191 5551 6047 6440 7220 19670 23562 24767 28850 29605 34642 36747
73 3562 4812 5485 10606 17058 18823 19886 23862 33399 35836 38303
148 1992 5102 10987 15393 18180 20481 20736 26419 28466 31129 33882
1557 3055 3864 9232 16927 17532 20398 21135 23488 28675 37064 37164
2299 3015 7708 8554 10042 13328 18143 18530 19261 27909 34018 37935
847 3011 10137 10590 16671 18094 22798 23767 26705 28042 30499 37945
7459 10256 13212 15953 18091 18994 19811 21830 24229 27062 30608 31698
4291 7727 9723 11579 14429 17901 19968 21353 21669 24945 26048 37260
8562 10389 14937 18581 19549 25603 26485 27174 27436 31927 35525 35984
313 8332 10393 15540 17894 19646 23002 27585 29791 31986 34296 36379
1702 2421 2618 12062 16028 16335 16941 17977 29478 30317 31110 34407
2160 5891 12839 14343 19004 19409 21422 25504 26798 29009 31299 36959
4274 6690 11683 12511 16512 19286 21483 23227 23800 30618 34963 38195
4201 8747 9890 23136 23655 25057 28985 31586 33091 35202 35524 35802
672 8275 9499 11040 12791 13807 28193 30610 33814 35232 36151 38784
474 1284 2527 4342 6449 8196 9405 11420 13704 14180 14622 15412
2624 29511 30469
6464 9577 23494
5287 12022 37078
2430 27323 29341
11446 16533 21979
1515 4931 15026
14283 28529 37489
6187 8185 38253
3590 12342 38608
4265 24259 25368
4430 9081 33466
3617 35591 35696
6589 14391 19353
442 5510 29991
4540 9738 10838
3668 24706 26339
1068 34334 38759
9514 13852 14717
8103 28428 38419
32505 37656 38114
1273 15352 21066
731 16322 36602
1316 8670 31632
1883 13552 17631
21987 24366 34050
1975 7839 12747
5878 33159 36329
8921 14451 22488
15497 25044 36004
22413 28126 32363
7540 12285 14033
13658 16177 31025
33068 33557 38569
7758 10893 21031
11470 22993 34436
10747 13227 28666
11552 20439 30092
2727 9297 26837
399 26517 33759
3340 20692 36108
15419 20712 27403
13303 16716 23361
26065 32482 33457
8336 19015 20421
15940 17475 32359
12953 21349 30059
5348 16562 31348
26830 31400 32657

TABLE 34

Address of Parity Bit Accumulators
(Rate 1/3 - Coded Block Size 64800)

2157 7955 9237 12284 15020 21866 26422 34666 37352 37649 40586 41640
2448 14737 15550 16081 17094 17625 20941 25888 28556 30985 37172 37835
15 8525 11078 14053 16293 19293 24791 26407 27582 39222 40665 42625
1375 3933 17007 22218 26176 29045 33156 34027 35634 36351 37899 38537

TABLE 34-continued

Address of Parity Bit Accumulators
(Rate 1/3 - Coded Block Size 64800)

3834 4701 5234 11773 12241 15776 22750 25325 31725 34901 37942 39619
131 7591 10089 17781 28087 28457 29129 34492 34839 37106 38744 40179
436 13828 15551 17812 18220 19395 21501 21626 27152 27767 38852 40888
540 11011 11679 20209 21034 22605 25164 27269 29337 30522 31373 36883
2543 3173 7364 8241 9312 9758 17052 17964 30221 31992 34465 38515
5215 5805 11147 12748 21633 22899 23290 23728 24307 33389 36827 40040
6286 10490 11914 13545 20483 26178 27262 30138 32686 33700 39563 42394
467 1041 2435 11535 12476 13551 18023 18376 23405 30912 35507 42404
2199 3140 7331 8280 10562 12024 25005 25275 29030 30212 36319 38314
2154 6304 7076 8838 9473 20932 23170 26489 28564 32024 42165 42929
1799 3518 5196 8564 9091 11222 12922 23435 24958 26673 36880 40908
7283 8671 12840 14171 17366 20117 26736 30930 33455 40993 41143 42874
296 4975 5566 8182 8757 9456 28414 29216 34949 38307 40102 43111
6916 7794 10169 14680 15377 15966 20826 21311 22927 32352 39039 42681
976 1259 1729 2864 5589 10515 13418 16261 20645 29477 31036 32960
4158 4535 6826 13129 16597 18952 19609 23900 29625 35992 36644 42109
3832 31315 35811
14289 33747 34952
3565 5878 27411
1024 26178 41783
18863 27617 35897
18834 30626 36715
10201 34187 41196
7800 19919 34976
3510 26951 32912
24819 25731 29630
2703 25366 32046
23853 25668 32622
4294 16030 37743
9417 12037 18132
6190 16478 29644
11516 23198 36470
1792 13080 20405
5570 22207 23944
7082 19308 32227
14027 15050 32862
9767 15020 34431
3168 24560 37568
4416 19904 21514
4088 22431 28406
16894 28072 38951
4452 30580 41428
4884 16851 33758
6736 32730 39284
6101 39673 41788
13079 39346 41111
11346 15217 33923
20796 22368 36184
14741 30445 40480
13894 17431 27939
35318 39772 41661
18691 19729 24200
15454 31656 42660
1386 6793 24331
9893 22002 31360
2069 18590 19794

TABLE 35

Address of Parity Bit Accumulators
(Rate 1/4 - Coded Block Size 64800)

407 1429 6319 18004 18662 20568 23535 24031 28882 36124 38892 41880
4223 5536 10333 16475 20735 20954 25347 26862 32235 36257 42827 48304
8161 11446 13040 13661 19722 24632 27008 29029 32746 40449 42030 45883
9899 12505 13916 18635 22605 25914 32903 39146 39661 40372 44350 45823
8074 11266 13787 15452 21319 25518 25892 26799 40269 41320 41665 48438
1489 8464 9203 15278 16613 18235 26387 29744 31948 32293 35378 46447
122 1365 4344 7853 8453 24475 25034 28298 28718 35347 36473 40014
2485 4555 12437 18736 20994 23449 30387 33800 35867 36980 43101 46693
1654 3284 5191 11122 13092 16366 22522 22933 28511 29977 37120 38428
2362 6555 10708 12679 14474 20301 22230 29510 38500 39610 43175 48173
3678 5189 17724 19148 26279 27265 30034 33819 37195 42327 46261 47137
572 4115 7440 9690 11879 14861 15577 22163 32927 43761 46260 46925
3504 9628 10218 10694 11795 20016 23062 24390 31075 31419 33120 43388
1065 1994 2867 3148 5022 6019 7191 8667 12009 14190 16097 17095
17594 21917 27700 27977 30813 33953 34373 34911 35152 37725 38153 38708
7292 31185 42413
2710 25038 27784
35910 36713 48159
24092 36740 38594
6108 10842 34900
14373 16000 24603
1065 17856 27441
3072 33982 43211
210 14879 19713
6222 16708 31602
15679 22926 29610
18859 32651 37802
2010 5677 21606
19985 35082 47221
6656 37684 44496
12919 14510 42727
13439 21553 47800
9340 40814 43721
6892 8839 31686
11896 34323 47500
26624 33369 44968
20262 26137 43948

TABLE 35-continued

Address of Parity Bit Accumulators
(Rate 1/4 - Coded Block Size 64800)

3892 9900 29429
4740 39439 45622
39274 41553 47703
30819 41225 44970
7879 28439 45392
17023 17635 44279
30598 40951 45118
19335 23107 45091.

16. An apparatus according to claim 15, wherein M=360 and coded block size $n_{ldpc}$ is 64800 code rates are 1/4, 1/3, 2/5, 1/2, 3/5, 2/3, 3/4, 4/5, 5/6, 8/9, and 9/10, respectively.

17. An apparatus according to claim 15, further comprising:
   a Bose Chaudhuri Hocquenghem (BCH) transmitter configured to encode an input signal using BCH codes, wherein the output LDPC coded signal corresponding to the input signal represents a code having an outer BCH code and an inner LDPC code.

18. An apparatus according to claim 15, further comprising:
   an interleaver configured to interleave the output LDPC coded; and
   a modulator configured to modulate the interleaved LDPC coded signal based on 8-PSK (Phase Shift Keying) or 16-APSK (Amplitude Phase Shift Keying) modulation scheme,
   wherein the interleaver is configured to write the LDPC coded signal column-wise and to read an interleaved output LDPC coded signal row-wise, from left to right, and wherein if an 8-PSK modulation scheme is used for a code rate 3/5, the interleaved output LDPC coded signal is read from right to left.

19. A method according to claim 6, further comprising:
   encoding an input signal according to Bose Chaudhuri Hocquenghem (BCH) codes, wherein the output LDPC coded signal corresponding to the input signal represents a code having an outer BCH code and an inner LDPC code.

20. A method according to claim 19, wherein the number of redundant BCH bits is $n_{BCH}-k_{BCH}=192$ and error correction capability of the BCH code is 12 bits.

21. A method according to claim 6, further comprising:
   interleaving the output LDPC coded signal using an interleaver; and
   modulating the interleaved LDPC coded signal based on 8-PSK (Phase Shift Keying) or 16-APSK (Amplitude Phase Shift Keying) modulation scheme,
   wherein the interleaving comprises writing the LDPC coded signal into the interleaver column-wise and reading an interleaved output LDPC coded signal row-wise, from left to right, and
   wherein if an 8-PSK modulation scheme is used for a code rate 3/5, the interleaved output LDPC coded signal is read from right to left.

* * * * *